US008652948B2

(12) United States Patent
Horie et al.

(10) Patent No.: US 8,652,948 B2
(45) Date of Patent: Feb. 18, 2014

(54) NITRIDE SEMICONDUCTOR, NITRIDE SEMICONDUCTOR CRYSTAL GROWTH METHOD, AND NITRIDE SEMICONDUCTOR LIGHT EMITTING ELEMENT

(75) Inventors: Hideyoshi Horie, Ibaraki (JP); Kaori Kurihara, Ibaraki (JP)

(73) Assignee: Mitsubishi Chemical Corporation, Tokyo (JP)

( * ) Notice: Subject to any disclaimer, the term of this patent is extended or adjusted under 35 U.S.C. 154(b) by 398 days.

(21) Appl. No.: 12/744,163

(22) PCT Filed: Nov. 20, 2008

(86) PCT No.: PCT/JP2008/003425
§ 371 (c)(1),
(2), (4) Date: May 21, 2010

(87) PCT Pub. No.: WO2009/066466
PCT Pub. Date: May 28, 2009

(65) Prior Publication Data
US 2010/0244087 A1 Sep. 30, 2010

(30) Foreign Application Priority Data

Nov. 21, 2007 (JP) .................................. 2007-301565
Mar. 7, 2008 (JP) .................................. 2008-057694

(51) Int. Cl.
*H01L 21/20* (2006.01)
(52) U.S. Cl.
USPC .................. 438/483; 438/478; 257/E21.097; 257/E21.117
(58) Field of Classification Search
USPC .................. 438/478, 483, 486; 257/E21.097, 257/E21.117
See application file for complete search history.

(56) References Cited

U.S. PATENT DOCUMENTS

| 7,208,393 B2 | 4/2007 | Haskell et al. | |
|---|---|---|---|
| 2003/0001168 A1* | 1/2003 | Tsuda et al. | 257/103 |

(Continued)

FOREIGN PATENT DOCUMENTS

| JP | 2005 311072 | 11/2005 |
|---|---|---|
| JP | 2005 347494 | 12/2005 |

(Continued)

OTHER PUBLICATIONS

Machine Translation of JP 2006-229253.*

(Continued)

*Primary Examiner* — Julia Slutsker
(74) *Attorney, Agent, or Firm* — Oblon, Spivak, McClelland, Maier & Neustadt, L.L.P.

(57) ABSTRACT

During the growth of a nitride semiconductor crystal on a nonpolar face nitride substrate, such as an m-face, the gas that constitutes the main flow in the process of heating up to a relatively high temperature range, before growth of the nitride semiconductor layer, (the atmosphere to which the main nitride face of the substrate is exposed) and the gas that constitutes the main flow until growth of first and second nitride semiconductor layers is completed (the atmosphere to which the main nitride face of the substrate is exposed) are primarily those that will not have an etching effect on the nitride, while no Si source is supplied at the beginning of growth of the nitride semiconductor layer. Therefore, nitrogen atoms are not desorbed from near the nitride surface of the epitaxial substrate, thus suppressing the introduction of defects into the epitaxial film. This also makes epitaxial growth possible with a surface morphology of excellent flatness.

22 Claims, 31 Drawing Sheets

(56) References Cited

U.S. PATENT DOCUMENTS

| | | | |
|---|---|---|---|
| 2006/0189012 A1* | 8/2006 | Ueta et al. | 438/21 |
| 2006/0270087 A1* | 11/2006 | Imer et al. | 438/46 |
| 2007/0037308 A1 | 2/2007 | Okuyama et al. | |
| 2007/0254459 A1 | 11/2007 | Lee et al. | |
| 2009/0072353 A1* | 3/2009 | Hirai et al. | 257/615 |

FOREIGN PATENT DOCUMENTS

| | | |
|---|---|---|
| JP | 2006 60069 | 3/2006 |
| JP | 2006 229253 | 8/2006 |
| JP | 2007 48869 | 2/2007 |
| JP | 2007 67454 | 3/2007 |
| JP | 2007 290960 | 11/2007 |
| JP | 2010 058820 | 5/2010 |
| WO | 2006 130622 | 12/2006 |

OTHER PUBLICATIONS

Machine Translation of JP-2005-311072.*
U.S. Appl. No. 13/112,564, filed May 20, 2011, Horie, et al.
International Search Report issued Mar. 17, 2009 in PCT/JP08/03425 filed Nov. 20, 2008.
U.S. Appl. No. 12/744,076, filed May 21, 2010, Horie, et al.
K. Nishizuka et al., Mechanism of Efficient Photoluminescence from InGaN Single Quantum Well Grown on Non-Polar M-Plane GaN Template, Abstract book of the 66$^{th}$ Academic Lecture Meeting of the Japan Society of Applied Physics, Autumn 2005, 11p-N-4, p. 289 (with English Translation).
C. D. Lee et al., "Morphology and Surface Reconstructions of GaN($1\bar{1}00$) Surfaces", Applied Physics Letters, vol. 82, No. 11, Mar. 17, 2003, pp. 1793-1795.
Colin J. Humphreys et al., "Applications, Environmental Impact and Microstructure of Light-Emitting Diodes", Microscopy and Analysis, vol. 21(6), Nov. 2007, pp. 5-8.
Koh Saitoh, "High-Resolution Z-Contrast Imaging by the HAADF-STEM Method", Journal of the Crystallographic Society of Japan, vol. 47, No. 1, 2005, pp. 9-14 (with English Abstract).
Kazuto Watanabe, "Imaging in High Resolution HAADF-STEM", Journal of the Crystallographic Society of Japan, vol. 47, No. 1, 2005, pp. 15-19 (with English Abstract).
Hajime Matsumoto et al., "Growth Behaviour of Athermal ω-Phase Crystals in a Ti-15mass%Mo Alloy Studied by In-situ Dark Field and High Resolution Electron Microscopy", Materials Transactions, JIM, vol. 40, No. 12, 1999, pp. 1436-1443.

* cited by examiner

Crystal growth process

Crystal growth process

NITRIDE SEMICONDUCTOR, NITRIDE SEMICONDUCTOR CRYSTAL GROWTH METHOD, AND NITRIDE SEMICONDUCTOR LIGHT EMITTING ELEMENT

TECHNICAL FIELD

The present invention relates to a nitride semiconductor crystal growth technique, and more particularly, to a crystal growth technique for obtaining a high-quality nitride semiconductor with excellent surface conditions and optical characteristics.

BACKGROUND ART

A blue-color light-emitting element or ultraviolet light-emitting element can be used as a white light source if combined with an appropriate wavelength conversion material. Active studies have been conducted on applications of such white light sources to backlights for liquid crystal displays and the like, light-emitting diode illumination, automotive lighting, general lighting to replace fluorescent lighting, and so on. Some of the studies have already been put to practical use. Today, such blue-color light-emitting elements and ultraviolet light-emitting elements are produced mainly by growing a thin film of gallium nitride-based semiconductor crystal using a technique such as a metal-organic chemical vapor deposition process (MOCVD process) or molecular beam epitaxy process (MBE process) and are collectively referred to as gallium nitride-based light-emitting diodes or GaN-based LEDs.

Conventionally, most of the substrates used for GaN-based LEDs are sapphire substrates. Since sapphire and GaN differ greatly in lattice constant, a considerable dislocation on the order of $10^9/cm^2$ is unavoidable for a GaN crystal epitaxially grown on a sapphire substrate. However, sapphire substrates have the advantage of being more inexpensive than SiC substrates and GaN substrates. Moreover, light-emitting efficiencies of InGaN in blue-color light-emitting regions normally used as quantum well layers of GaN-based LEDs are insufficiently sensitive to dislocation density. For these reasons, sapphire substrates are still used widely as primary substrates under the present circumstances.

However, when gallium nitride-based semiconductor crystals are viewed as a material for devices used under conditions of high carrier density, high dislocation density such as described above considerably deteriorates device characteristics. For example, high dislocation density remarkably reduces the life of devices such as high-power LEDs or lasers. Also, when an active layer contains no In (e.g., when an AlGaN is used for an active layer) or when an active layer structure includes an InGaN layer or InAlGaN layer with a relatively small In content (e.g., about 0.2 or below) to realize light emission with a wavelength shorter than somewhere around the near-ultraviolet region, the dependence of internal quantum efficiency on the dislocation density increases, and consequently luminous intensity itself decreases if the dislocation density is high.

That is, when an active layer contains no In or when an active layer structure includes an InGaN layer or InAlGaN layer with a relatively small In content, a lower dislocation density is required more strongly than when the active layer structure includes an InGaN layer which has a emission wavelength longer than that of blue color.

When a lower dislocation density is required in this way, it is useful to adopt a GaN substrate as a substrate for epitaxial growth. It is expected that this will reduce the dislocation density found in epitaxial layers to $10^8/cm^2$ or below, or even $10^7/cm^2$ or below. Furthermore, if dislocations and the like on the substrate and the like are reduced, the dislocation density is expected to be reduced to even $10^6/cm^2$ or below. That is, the dislocation density is expected to be reduced by two to three orders of magnitude or more compared to when a sapphire substrate is used. In view of these circumstances, freestanding GaN substrates and freestanding AlN substrates are suitable as substrates for epitaxial growth of gallium nitride-based semiconductor crystals.

In most of conventional attempts to epitaxially grow gallium nitride-based semiconductor crystals on GaN substrates which are nitride substrates, c-plane ((0001)-plane) substrates are used to provide epitaxial growth surfaces, i.e., epitaxial growth takes place on a "polar plane." Examples of reports on such attempts include Patent Document 1 (Japanese Patent Laid-Open No. 2005-347494), Patent Document 2 (Japanese Patent Laid-Open No. 2005-311072, and Patent Document 3 (Japanese Patent Laid-Open No. 2007-67454).

Patent Document 1 discloses a technique which involves using a nitride substrate ((0001)-plane GaN substrate) which uses a polar plane to epitaxially grow a GaN layer, cleaning the GaN substrate with a reactor pressure set to 30 kilopascals, growing a 1-μm-thick first n-type GaN buffer layer with the substrate temperature maintained at 1050° C. and the reactor pressure maintained at 30 kilopascals, subsequently stopping raw material supply once, and further forming a 1-μm-thick second n-type GaN buffer layer by heating the substrate to a substrate temperature of 1100° C. with the reactor pressure maintained at 30 kilopascals. This crystal growth method allegedly provides a semiconductor apparatus having buffer layers with excellent surface flatness and good crystal quality.

Patent Document 2 discloses an invention of a light-emitting element produced by removing organic and other contaminations and moisture adhered to the surface of a GaN substrate while improving surface crystallinity of the substrate by flows of hydrogen gas, nitrogen gas, and ammonia gas, forming a multilayer structure intermediate layer made up of GaN and InGaN layers on the GaN substrate using flows of nitrogen gas and hydrogen gas, and then forming a reflective layer, active layer, and gallium nitride-based semiconductor layer on the intermediate layer.

Example 26 in Patent Document 3 discloses an invention of a laser element produced by forming a 3-μm-thick n-type GaN buffer layer doped with Si on a GaN substrate and building a stacked structure on the n-type GaN buffer layer. Incidentally, the Patent Document states that a 300-Angstrom or thinner buffer layer formed at a low temperature of around 500° C. may be provided between the GaN buffer layer and GaN substrate.

However, surface flatness and optical characteristics of a nitride semiconductor crystal obtained through epitaxial growth on a substrate whose principal plane is the polar plane cannot be said to be quite sufficient, and growth conditions require further examination. Besides, a problem resulting inevitably from the use of the polar plane as a growth substrate has also been recognized. For example, there is a known problem with a quantum well active layer structure (e.g., InGaN/GaN quantum well active layer structure) formed on a $c^+$-plane of a hexagonal system such as a c-plane GaN substrate. Namely, so-called quantum-confined Stark effect (QCSE) will decrease a recombination rate between electrons and positive holes, making luminous efficiency lower than ideal.

With these circumstances as a backdrop, attempts have been made to create a quantum well active layer structure on a substrate whose principal plane is a nonpolar plane. However, epitaxial growth on nonpolar planes of hexagonal III-V nitride crystals, i.e., on the a-plane, r-plane, and m-plane, is considered to be difficult, and in particular, high-quality, stacked, hexagonal III-V nitride semiconductor structures cannot be obtained on the m-plane at present.

For example, Non-Patent Document 1 (Abstract Book of the 66th Academic Lecture Meeting of the Japan Society of Applied Physics (Autumn 2005), 11p-N-4) reports a special crystal growth method which involves cutting stripes in a GaN substrate whose principal plane is the c-plane such that the m-plane will be exposed as a flank and epitaxially growing a nitride semiconductor crystal on the striped side wall surface (m-plane) while recognizing the difficulty of crystal growth on the m-plane by stating, "it is difficult to grow a crystal on the m-plane which is nonpolar".

Also, Non-Patent Document 2 (Appl. Phys. Lett., Vol. 82, No. 11 (17 Mar. 2003), p. 1793-1795) reports that a GaN layer was grown on a ZnO substrate whose principal plane is the m-plane by a plasma-assisted MBE (Molecular Beam Epitaxy) process. However, it is stated that the resulting GaN layer was "slate-like." There were severe surface irregularities and a single-crystal GaN layer was not available.

Furthermore, with the preliminary that an epitaxial growth interface is prone to defects when a crystal of a nitride semiconductor is grown on an m-plane substrate, Patent Document 4 (U.S. Pat. No. 7,208,393) describes a technique for reducing the defects, as follows. Specifically, a GaN buffer is grown on an m-plane substrate by an H-VPE (Hydride Vapor Phase Epitaxy) process. Then, the substrate is taken out of the reactor once to form a dielectric mask and create stripes on the mask. Subsequently, using the substrate with the mask formed as a new substrate, an epitaxial film is formed by the MOCVD process and flattened through openings of the stripe mask by lateral overgrowth (known as LEO or ELO).

Patent Document 1: Japanese Patent Laid-Open No. 2005-347494

Patent Document 2: Japanese Patent Laid-Open No. 2005-311072

Patent Document 3: Japanese Patent Laid-Open No. 2007-67454

Patent Document 4: U.S. Pat. No. 7,208,393

Non-Patent Document 1: Abstract Book of the 66th Academic Lecture Meeting of the Japan Society of Applied Physics (Autumn 2005), 11p-N-4.

Non-Patent Document 2: Appl. Phys. Lett., Vol. 82, No. 11 (17 Mar. 2003), p. 1793-1795.

Non-Patent Document 3: C. J. Humphreys at al., "Applications Environmental Impact and Microstructure of Light-Emitting Diodes" MICROSCOPY AND ANALYSIS, NOVEMBER 2007, pp. 5-8.

Non-Patent Document 4: K. SAITOH, "High-resolution Z-contrast Imaging by the HAADF-STEM Method", J. Cryst. Soc. Jpn., 47(1), 9-14 (2005).

Non-Patent Document 5: K. WATANABE; "Imaging in High Resolution HAADF-STEM", J. Cryst. Soc. Jpn., 47(1), 15-19 (2005).

Non-Patent Document 6: H. Matsumoto, et. al., Material Transactions, JIM 40, 1999, pp. 1436-1443.

DISCLOSURE OF THE INVENTION

Problems to be Solved by the Invention

Studies conducted by the present inventors have confirmed that when the crystal growth methods described in the above documents, predicated on growth on a polar plane, and used for crystal growth on a c-plane GaN substrate is applied to crystal growth on a nonpolar plane, it is difficult to obtain nitride semiconductors with excellent surface flatness and low dislocation density and that the optical characteristics of the resulting films are far from sufficient.

Regarding conventional methods of crystal growth on nonpolar planes, with the technique described in Patent Document 1, a nitride semiconductor crystal can usually be formed only on a few-micron-wide flank of a stripe mesa on a nonpolar plane, and crystal growth on a large area is extremely difficult. This puts great constraints on the fabrication of devices. On the other hand, with the technique described in Patent Document 2, although crystal growth on a large area is possible, the resulting nitride semiconductor film exhibits a morphology characterized by severe surface irregularities and a single-crystal layer is not available. Furthermore, the technique described in Patent Document 4 has a problem in that process steps are complicated and that in relation to locations of underlying stripes, there is a mixture of locations containing a large number of defects and locations containing a small number of defects.

The present invention has been made in view of the above problems and has an object to provide a crystal growth method which can readily obtain a high-quality nitride semiconductor using a nonpolar plane as a growth substrate, the nitride semiconductor being characterized by low dislocation density and good surface morphology and optical characteristics as well as high luminous efficiency when used as a light-emitting element.

Means for Solving the Problems

To solve the above problems, according to a first aspect of the present invention, there is provided a nitride semiconductor crystal growth method for growing a crystal of a nitride semiconductor on a principal nitride plane of a base at least one principal plane of which is a nonpolar nitride, the nitride semiconductor crystal growth method comprising: a heating step including a period $t_A$ during which the base is heated to a predetermined temperature with the principal nitride plane of the base exposed to an atmosphere containing an inactive gas; a first growth step of epitaxially growing a first nitride semiconductor layer on the principal nitride plane of the base with the principal nitride plane of the base exposed to an atmosphere containing an inactive gas and without intentional supply of a silicon (Si) source material; and a second growth step of epitaxially growing a second nitride semiconductor layer on the first nitride semiconductor layer while supplying an n-type dopant source material with the surface of the first nitride semiconductor layer exposed to an atmosphere containing an inactive gas.

According to a second aspect of the present invention, there is provided a nitride semiconductor crystal growth method for growing a crystal of a nitride semiconductor on a principal nitride plane of a base at least one principal plane of which is a nonpolar nitride, the nitride semiconductor crystal growth method comprising: a heating step including a period $t_A$ during which the base is heated to a predetermined temperature in an atmosphere having a main flow containing an inactive gas; a first growth step of epitaxially growing a first nitride semiconductor layer on the principal nitride plane of the base in an atmosphere having a main flow containing an inactive gas and without intentional supply of a silicon (Si) source material; and a second growth step of epitaxially growing a second nitride semiconductor layer on the first nitride semiconductor layer while supplying an n-type dopant source material in an atmosphere containing an inactive gas and constituting a main flow.

In the nitride semiconductor crystal growth method according to the first and second aspect, preferably at least one of the heating step, first growth step, and second growth step has a period during which the atmosphere contains an active gas other than hydrogen gas.

In the nitride semiconductor crystal growth method according to the first and second aspect, preferably the atmosphere does not contain hydrogen gas during either of the heating step and the first growth step.

According to a third aspect of the present invention, there is provided a nitride semiconductor crystal growth method for growing a crystal of a nitride semiconductor on a principal nitride plane of a base at least one principal plane of which is a nonpolar nitride, the nitride semiconductor crystal growth method comprising: a heating step including a period $t_A$ during which the base is heated to a predetermined temperature with the principal nitride plane of the base exposed to an atmosphere containing an inactive gas; and an epitaxial growth step of growing a nitride semiconductor layer on the principal nitride plane of the base with the principal nitride plane of the base exposed to an atmosphere containing an inactive gas and without intentional supply of a silicon (Si) source material.

In the nitride semiconductor crystal growth method according to the third aspect, preferably at least one of the heating step and epitaxial growth step has a period during which the atmosphere contains an active gas other than hydrogen gas.

In the nitride semiconductor crystal growth method according to the third aspect, preferably the atmosphere does not contain hydrogen gas during either of the heating step and the epitaxial growth step.

According to the first aspect of the present invention, there is provided a nitride semiconductor epitaxially grown on a principal nitride plane of a base at least one principal plane of which is a nonpolar nitride, characterized in that a nitride semiconductor layer epitaxially grown without intentional supply of a Si source material is provided on the principal nitride plane of the base without interposing any other layer.

According to the second aspect of the present invention, there is provided a nitride semiconductor epitaxially grown on a principal nitride plane of a base at least one principal plane of which is a nonpolar nitride, characterized in that an outermost surface of the nitride semiconductor orthogonal to a direction of the epitaxial growth has an area of 30 mm$^2$ to 500 cm$^2$ both inclusive.

According to the third aspect of the present invention, there is provided a nitride semiconductor epitaxially grown on a principal nitride plane of a base at least one principal plane of which is a nonpolar nitride, characterized in that the epitaxial layer has a dislocation density of $3 \times 10^7$ cm$^{-2}$ or below.

According to a fourth aspect of the present invention, there is provided a nitride semiconductor epitaxially grown on a principal nitride plane of a base at least one principal plane of which is a nonpolar nitride, comprising a stack of a first nitride semiconductor layer and a second nitride semiconductor layer, characterized in that an outermost surface of the stack has an average surface roughness Ra of 20.0 nm or below.

According to a fifth aspect of the present invention, there is provided a nitride semiconductor epitaxially grown on a principal nitride plane of a base at least one principal plane of which is a nonpolar nitride, comprising a stack of a first nitride semiconductor layer and a second nitride semiconductor layer, characterized in that an outermost surface of the stack is a crystal plane within ±5 degrees inclusive from a (1-100) m-plane.

According to a sixth aspect of the present invention, there is provided a nitride semiconductor epitaxially grown on a principal nitride plane of a base at least one principal plane of which is a nonpolar nitride, comprising a stack of a first nitride semiconductor layer and a second nitride semiconductor layer, characterized in that: a peak value of silicon (Si) concentration in the first nitride semiconductor layer is $1 \times 10^{21}$ cm$^{-3}$ or below; and that the second nitride semiconductor layer is of an n conductivity type.

In the present invention, the nitride on the principal plane of the base is, for example, GaN, AlN, InN, or BN, or a mixed crystal thereof.

In the present invention, the nitride on the principal plane of the base is, for example, a GaN film, an AlN film, an InN film, or a BN film, or a mixed-crystal film thereof formed by crystal growth on a sapphire substrate, a SiC substrate, a ZnO substrate, a Si substrate, a GaN substrate, an AlN substrate, an InN substrate, or a BN substrate, or a freestanding substrate of a mixed crystal thereof.

In the present invention, the base is, for example, a freestanding substrate of GaN, AlN, InN, or BN, or a mixed crystal thereof.

Preferably, the principal nitride plane of the base is a crystal plane within ±5 degrees inclusive from a (1-100) m-plane.

Preferably, thickness $L_1$ of the first nitride semiconductor layer is 0.1 nm to 300 nm both inclusive.

Preferably, the first nitride semiconductor layer is a III-V group nitride semiconductor of GaN, AlN, InN, or BN, or a mixed crystal thereof.

Preferably, thickness $L_2$ of the second nitride semiconductor layer is 400 nm to 20 μm both inclusive.

Preferably, silicon concentration in the second nitride semiconductor layer is $1 \times 10^{17}$ cm$^{-3}$ to $6 \times 10^{19}$ cm$^{-3}$ both inclusive.

According to the present invention, an inactive gas which does not have etching effect on nitrides is selected as a gas which constitutes the main flow during the period from the heating step in a relatively high temperature region before the nitride semiconductor layers are grown to the completion of growth of the nitride semiconductor layers, thereby controlling the atmosphere to which the principal nitride plane of the base is exposed. Besides, no Si source is provided when the growth of the nitride semiconductor layers is initiated. Consequently, nitrogen atoms are less liable to leave from near the surface of the nitride on the epitaxial base. This prevents defects from being introduced into the epitaxial films and enables epitaxial growth characterized by surface morphology of excellent flatness.

Also, according to the present invention, the thickness of the (first) nitride semiconductor layer (not intentionally doped with Si) is optimized, where the (first) nitride semiconductor layer is the initial layer of crystal growth of the nitride semiconductor. This makes it possible to improve crystallinity of the nitride semiconductor epitaxially grown on the (first) nitride semiconductor layer.

Thus, as a result of these effects, the present invention readily provides a high-quality nitride semiconductor using a nonpolar plane as a growth substrate, the nitride semiconductor being characterized by sufficiently low dislocation density and good surface morphology and optical characteristics as well as high luminous efficiency when used as a light-emitting element.

BEST MODE FOR CARRYING OUT THE INVENTION

There are various epitaxial growth methods, among which the nitride semiconductor crystal growth method of the present invention can mainly be applied to vapor-phase epitaxy processes, suitably be applied to the H-VPE process and MOCVD process in particular, and most suitably be applied to the MOCVD process. For example, equipment forms of various configurations can be applied to the MOCVD process, and gases are introduced as required, depending on the equipment form, including gases which make up a main atmosphere during heating or cooling; gases which make up a main atmosphere during growth; source gases; gases used as carriers to realize the supply of organic metals or part of dopants; gases used to dilute raw materials; auxiliary gases used to improve the efficiency of introducing source gases, bringing constituent gases of an atmosphere into contact with a base, and supplying the constituent gases to the base; gases used for flow adjustment such as changing an entire gas flow into a laminar flow; gases used to stabilize components such as a heater and various ports and extend the life of the components; and gases introduced to purge the reactor.

Among flows of the gases described above, the flow of the auxiliary gases used to improve the efficiency of introducing source gases to a base, bringing constituent gases of an atmosphere into contact with the base, and supplying the constituent gases to the base as well as the flow of gases used for flow adjustment such as changing an entire gas flow into a laminar flow will be referred to hereinafter as "subflows" for the sake of convenience. Also, flows of gases which do not directly contribute to epitaxial growth, including gases used to stabilize components such as a heater and various ports and extend the life of the components and gases introduced to purge the reactor will be referred to as "non-growth-related flows" for the sake of convenience.

On the other hand, all the gas flows except the subflows supplied to the crystal growth equipment and non-growth-related flows will be referred to hereinafter as a "main flow" for the sake of convenience. Thus, the main flow is a general term principally for flows of gases which make up a main atmosphere during heating or cooling, gases which make up a main atmosphere during growth, source gases, gases used as carriers to realize the supply of organic metals or part of dopants, and gases used to dilute raw materials. Practically, the main flow is the atmosphere itself to which the surface of the base used for epitaxial growth of a nitride semiconductor and the epitaxially growing crystal surface of the nitride semiconductor are exposed. Thus, the main flow is indispensable for vapor-phase growth while the subflows and non-growth-related flows are optional.

Figure 1A:
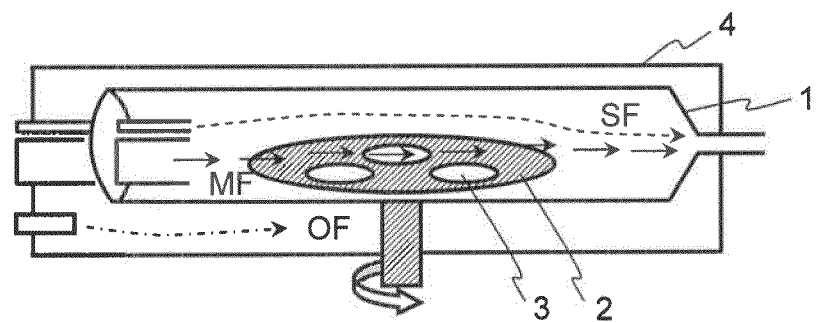
FIG. 1(A) is a diagram conceptually showing movement of a main flow in a horizontal MOCVD reactor by way of example.
Figure 1B:
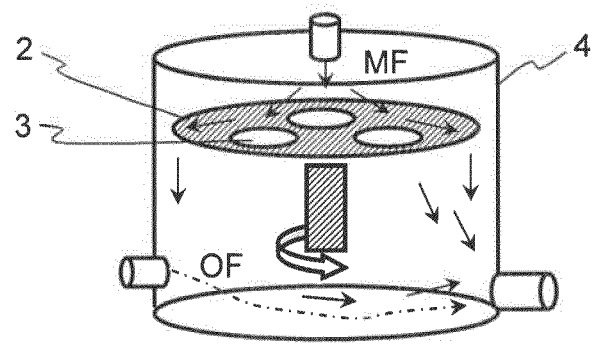
FIG. 1(B) is a diagram conceptually showing movement of a main flow in a vertical MOCVD reactor by way of example.

FIGS. 1(A) and 1(B) illustrate examples of a horizontal MOCVD reactor and vertical MOCVD reactor, respectively, and conceptually show movement of a main flow therein. For example, the horizontal reactor (FIG. 1(A)) is configured such that a surface of a base 3 placed on a susceptor 2 housed in a quartz reaction vessel 1 will be exposed to a main flow MF, which constitutes a practical "atmosphere" for the base 3. The main flow MF is pressed against the surface of the base 3 by a subflow SF. This improves the efficiency of introducing source gases to the base 3, bringing constituent gases of the atmosphere into contact with the base 3, and supplying the constituent gases to the base 3 and changes the entire gas flow into a laminar flow.

In the configuration in FIG. 1(B) which shows an example of the vertical reactor, no subflow gas is supplied, and the gases which flow in the quartz reaction vessel 1 are only the constituent gases of the main flow MF. Incidentally, in both the horizontal reactor (FIG. 1(A)) and vertical reactor (FIG. 1(B)), a gas flow, i.e., a non-growth-related flow OF, is produced by gas supply for heater purge and viewport purge.

Furthermore, a flow mainly containing a gas which provides a nitrogen source material or a flow which forms an atmosphere used to prevent nitrogen from escaping from the surface of the base and epitaxial layers during the epitaxial growth period of the nitride semiconductor including a heating period and cooling period may be referred to hereinafter as a "first main flow" for the sake of convenience. In that case, the gas flow mainly used to supply other raw materials or form other atmospheres may be referred to as a "second main flow" for the sake of convenience. Furthermore, since some of the constituent gases of the main flow can be used as a carrier gas to supply metal-organic materials, part of the constituent gases may be referred to as a carrier gas.

"Active gases" as referred to herein are gases which, being introduced as major constituent gases of the main flow, can produce reactive hydrogen species such as atomic or molecular hydrogen radicals, atomic or molecular hydrogen ions, or atomic hydrogen by decomposing or reacting under temperature and pressure conditions in a series of epitaxial crystal growth steps including a heating, cooling, waiting, and growth steps. Regarding quantity, the active gases exceed 1% of the constituent gases of the main flow in terms of flow ratio during a period of at least any of the epitaxial growth steps.

Thus, examples of major active gases include hydrogen ($H_2$) gas and ammonia ($NH_3$) gas (and a mixture thereof). These gases have etching effect on nitride crystals. In particular, $H_2$ gas has a very high etching effect. Therefore, if surfaces of nitride crystals are exposed to these gases (especially $H_2$ gas) under inappropriate conditions, nitrogen tends to be easily removed from the surfaces of the nitride and atomic-level defects tend to be introduced easily. Furthermore, this can cause macroscopic surface roughness.

On the other hand, "inactive gases" are gases which, being introduced as major constituent gases of the main flow, do not produce reactive hydrogen species in the series of epitaxial crystal growth steps including the heating, cooling, waiting, and growth steps. Regarding quantity, the inactive gases exceed 1% of the constituent gases of the main flow in terms of flow ratio during a period of at least any of the epitaxial growth steps.

Major examples of such inactive gases include nitrogen ($N_2$), helium (He), argon (Ar), xenon (Xe), and krypton (Kr). Also, inactive gases include acetonitrile; azoisobutane; hydrazine compounds such as 1,1-dimethyl hydrazine; amine compounds such as dimethylamine, diethylamine, trimethylamine, triethylamine, triallylamine, and tri-isobutylamine; and azide compounds such as methyl azide, ethyl azide, phenyl azide, diethylaluminum azide, and diethylgallium azide as well as mixtures thereof because these compounds satisfy the conditions of inactive gases.

According to the present invention, although details will be described later, in all of the heating step (especially period $t_A$), first growth step, and second growth step, the main flow is made up mainly of inactive gases and the atmosphere is controlled so that the surface of the base and the outermost surface layer which is being grown will not be exposed to excessively active gases (especially hydrogen gas which has a very high etching effect on nitrides). In the heating step (especially period $t_A$) and first growth step in particular, preferably the gases which make up the main flow are controlled so as not to include hydrogen gas.

Figure 2A:
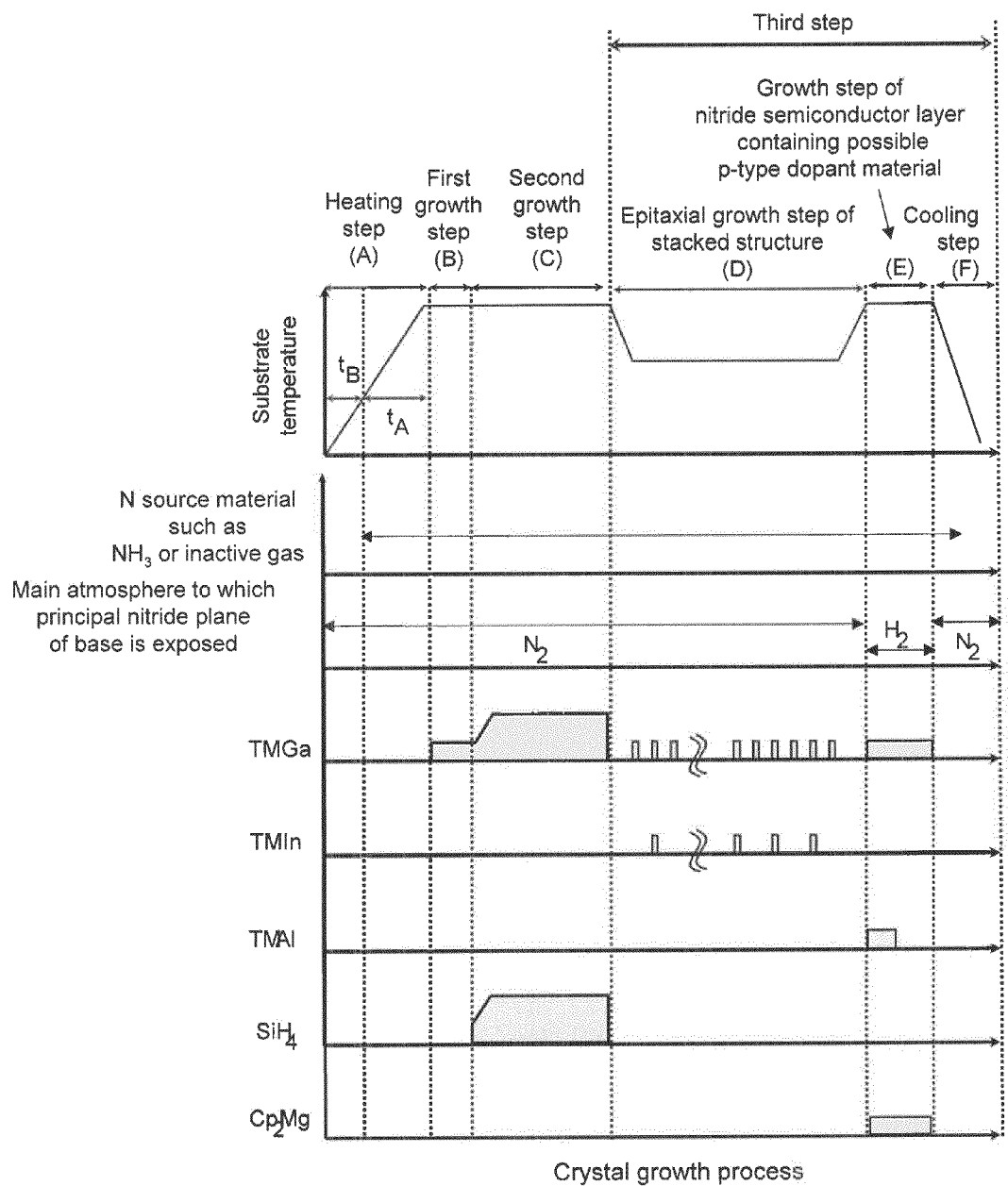
FIG. 2(A) is a diagram for illustrating an exemplary sequence of a nitride semiconductor crystal growth method according to the present invention.

FIG. 2(A) is a diagram for illustrating an exemplary sequence of a nitride semiconductor crystal growth method according to the present invention, and shows an example in which a GaN film is epitaxially grown on a freestanding GaN substrate whose principal plane is the (1-100) m-plane out of nonpolar planes. The reactor used for epitaxial growth is, for example, a metal-organic vapor-phase epitaxy apparatus, examples of which include three-flow quartz reactor with horizontal laminar flow which normally operates under conditions of normal pressure, planetary reactor which normally operates under conditions of reduced pressure, and a vertical stainless steel reactor which normally operates under conditions of reduced pressure.

First, a base at least one principal plane of which is a nitride is prepared for use in epitaxial growth. The base is placed on a susceptor in the reactor for epitaxial growth and heated to a predetermined temperature (step A). The nitride on the principal plane of the base is GaN, AlN, InN, or RN, or a freestanding substrate of a mixed crystal thereof. Alternatively, the nitride on the principal plane of the base is a GaN film, an AlN film, an InN film, or a RN film, or a mixed-crystal film thereof formed by crystal growth on a sapphire substrate, a SiC substrate, a ZnO substrate, a Si substrate, a GaN substrate, an AlN substrate, an InN substrate, or a BN substrate, or a freestanding substrate of a mixed crystal thereof.

With the epitaxial growth method according to the present invention, mask formation, projection/depression formation, and the like on the surface of the base are optional rather than essential unlike methods of epitaxial growth on a nonpolar side wall using so-called ELO (Epitaxial Lateral Overgrowth) or the like. Thus, according to the present invention, preferably the principal plane of the base approximately coincides in direction with the epitaxial growth. The present invention for which lateral overgrowth is not essential is free from such problems as difficulty to increase the area of epitaxial layers grown on a nonpolar side wall and emergence of portions with extremely high dislocation density corresponding to a mask structure. This makes it possible to increase the area and decrease the dislocation density of epitaxial layers using a nonpolar plane (e.g., m-plane) as a growth plane.

Thus, since the method according to the present invention can form flat epitaxial layers with excellent optical characteristics on a nonpolar-plane substrate, especially on an m-plane substrate, preferably the outermost surface of the nitride semiconductor orthogonal to the direction of epitaxial growth has an area of 30 $mm^2$ to 500 $cm^2$ both inclusive, more preferably an area of 50 $mm^2$ to 225 $cm^2$ both inclusive, and still more preferably an area of 4 $cm^2$ to 120 $cm^2$ both inclusive.

The lower limit on the area of the outermost surface of the nitride semiconductor is prescribed such that the crystal growth process (and subsequent device fabrication process) can be readily implemented. On the other hand, the upper limit is set, in particular, to ensure in-plane uniformity of the resulting epitaxial layers.

Regarding the upper limit, first, a range (area) in which source gas can be supplied uniformly in an MOCVD apparatus or the like to ensure formation of a uniform epitaxial layer in the MOCVD apparatus is considered to be approximately 500 $cm^2$. This is the reason why is it preferable to set the area of the outermost surface of the nitride semiconductor to 500 $cm^2$ or below.

Second, in the case of a base whose principal plane is a nonpolar plane such as the m-plane, a crystal axis in the principal plane is more anisotropic than in the case of a base which uses a polar plane such as the c-plane. For example, a c-plane substrate has a-axes at 120-degree intervals in the plane, but an m-plane substrate has an a-axis and c-axis in the plane and varies greatly in character between the two axis directions. Consequently, the base tend to get "distorted" or "warped" unevenly at high temperatures. Thus, to form a relatively uniform epitaxial layer on the base even in such cases, preferably the area is 225 $cm^2$ or below, and more preferably 120 $cm^2$ or below.

Studies conducted by the present inventors have shown that in view of atomic arrangement on the surface of the base, the crystal growth method according to the present invention can be suitably applied to so-called "nonpolar planes" such as the (11-20) a-plane, (1-102) r-plane, and (1-100) m-plane, and is especially suitable to epitaxial growth on a base whose principal plane corresponds or substantially corresponds in crystal plane orientation to the (1-100) m-plane among the nonpolar planes. Preferably the base used is, for example, a freestanding GaN substrate whose principal plane is the (1-100)-plane. A high-quality epitaxially grown film is obtained when a crystal of a GaN-based nitride semiconductor is grown on such a base using the crystal growth method according to the present invention.

A so-called "off-angle" from the given plane is within ±5.0 degrees inclusive, desirably within ±3.0 degrees inclusive, more desirably within ±1.0 degrees inclusive, and most desirably within ±0.5 degrees inclusive. When such an off-angle is used, the technique according to the present invention can epitaxially grow a crystal of a high-quality nitride semiconductor on the base. Even when an m-plane base is used, desirably tilt angles of the base's principal plane from the precise m-plane both in a-axis and c-axis directions are within ±5.0 degrees inclusive, desirably within ±3.0 degrees inclusive, more desirably within ±1.0 degrees inclusive, and most desirably within ±0.5 degrees inclusive.

The heating in step A is intended to heat the base to a temperature of 600° C. to 1,350° C., which is a growth temperature of a first nitride semiconductor layer (described later) and is done, for example, by supplying the constituent gases of the main flow so as to set the pressure in the reactor to 35 kilopascals to 120 kilopascals. In forming a stacked structure such as described later on the nitride semiconductor layer, to improve optical characteristics of the stacked structure which govern optical device characteristics, preferably an attainable heating temperature $T_A$ in step A is in the range of 600° C. to 1,350° C., more preferably in the range of 650° C. to 1,200° C., still more preferably in the range of 800° C. to 1,100° C., and most preferably in the range of 900° C. to 970° C. Preferably the attainable heating temperature range in step A coincides with a subsequent film formation temperature range of the nitride semiconductor layers. For example, when the film formation of the nitride semiconductor layers is carried out in the temperature range of 800° C. to 1,100° C., the attainable heating temperature in step A also ranges from 800° C. to 1,100° C.

The heating step shown in FIG. 2(A) by way of example includes two stages: a heating stage (high-temperature stage) which lasts for a period $t_A$, and a heating stage (low-temperature stage) which takes place before the period $t_A$ and lasts for a period $t_B$. In the heating stage (high-temperature stage), the base is heated to a predetermined temperature in an atmosphere with a main flow containing an inactive gas which is essential for the present invention and an active gas which is optional. In the heating stage (low-temperature stage), the base is heated in a relatively low temperature region in an atmosphere with a main flow containing constituent gases different from those contained in the main flow used during the heating period $t_A$. Hereinafter, the heating stage (low-temperature stage) in the period $t_B$ may be referred to as a "first heating step" for the sake of convenience and the heating stage (high-temperature stage) in the period $t_A$ may be referred to as a "second heating step" for the sake of convenience.

Of the gases shown in FIG. 2(A) by way of example, $NH_3$ gas, which is an active gas other than hydrogen gas, is optional, but can be a high-quality source gas for the nitrogen of the nitride semiconductor layer if supplied in appropriate quantities described later. Incidentally, according to the present invention, any of the inactive gases listed below may be used as a nitrogen source material for the nitride semiconductor layer instead of $NH_3$ gas: 1,1-dimethyl hydrazine (1,1-DMHy), acetonitrile, azoisobutane, dimethylamine, diethylamine, trimethylamine, triethylamine, triallylamine, triisobutylamine, methyl azide, ethyl azide, phenyl azide, diethylaluminum azide, diethylgallium azide, and tris-dimethylamino antimony.

Thus, the main flow in first and second growth steps (described later) includes at least a first main flow and a second main flow, where the first main flow mainly contains a nitrogen source gas (e.g., $NH_3$ gas among the gases shown in FIG. 2(A) by way of example) while the second main flow mainly contains a gas (any of the gases shown in FIG. 2(A) by way of example, excluding $NH_3$ gas and inactive, nitrogen source gases) which serves as a source of elements other than the nitrogen of the nitride semiconductor layer.

In the heating stage, which takes place in a relatively low temperature region during the period $t_B$, there is no need to actively reduce nitrogen removal from the nitride on the principal plane of the base. In the heating stage which takes place in a relatively high temperature region during the period $t_A$, t is necessary to actively reduce nitrogen removal from the nitride on the principal plane of the base.

Although this depends on the pressure in the reactor where the base is placed, it is considered, in view of the atomic arrangement, that nitrogen removal from nonpolar planes starts to occur at lower temperatures than from other planes, i.e., polar planes, and it is considered to be necessary to actively reduce nitrogen removal from nitride surfaces in temperature regions above about 450° C. Thus, in regions below this temperature, the main flow may contain active and inactive gases in any proportion as constituent gases. For example, the main flow may be made up entirely of inactive, $N_2$ gas, or made up only of active, $NH_3$ gas.

On the other hand, during the period $t_A$ of the high-temperature heating stage, measures need to be taken to actively reduce nitrogen removal from nitride surfaces. Thus, when heating is done using only an inactive gas essential for the present invention, it is important that the inactive gas contains a nitrogen source gas such as dimethyl hydrazine. On the other hand, when heating is done in an atmosphere containing an inactive gas and an appropriate amount of an optional, active gas, preferably at least one of the inactive gas and active gas contains a nitrogen source gas. For example, $NH_3$ gas can be an active, nitrogen source gas.

In that case, it is preferable not to introduce $H_2$ as an active gas, but to introduce $NH_3$, which can be a high-quality nitrogen source material for the nitride semiconductor if supplied in an appropriate amount. Although detail will be described later, in the heating step, among all the constituent gas types of the main flow, preferably the flow ratio of the active gas is less than 0.5. Incidentally, the base may be heated in a fixed atmosphere throughout the entire heating step. In that case, the period $t_A$ coincides with the period of the heating step.

Preferably the pressure in the reactor during the heating step is adjusted to be 35 kilopascals to 120 kilopascals. The reason why the lower limit of the pressure in the reactor is set to 35 kilopascals is that optical characteristics will be degraded greatly if the atmosphere to which the surface of the base is exposed has its pressure reduced excessively. This will be described later.

If a stacked structure such as described later is formed on the nitride semiconductor layers, to improve the optical characteristics of the stacked structure which govern optical device characteristics, preferably film formation temperatures of the first and second nitride semiconductor layers are in the range of 600° C. to 1,350° C., more preferably in the range of 650° C. to 1,200° C., still more preferably in the range of 800° C. to 1,100° C., and most preferably in the range of 900° C. to 970° C. Preferably the film formation temperature range of the nitride semiconductor layers coincides with the attainable heating temperature range in step A. For example, when the film formation of the nitride semiconductor layers is carried out in the temperature range of 800° C. to 1,100° C., the attainable heating temperature in step A also ranges from 800° C. to 1,100° C.

In the exemplary sequence shown in FIG. 2(A), the first heating step is started in the reactor by supplying nitrogen gas in the second main flow, where the nitrogen gas is an inactive gas making up the major atmosphere to which the principal nitride plane of the base is exposed. When the temperature of the base reaches 400° C., the second heating step is started by adding active, $NH_3$ gas as a constituent gas of the first main flow. The base is further heated in the gas mixture to the target temperature of 1,000° C. The $NH_3$ gas supply in the second heating step is intended to prevent nitrogen from escaping from the surface of the base during the heating step and thereby prevent the crystallinity of the epitaxial growth surface from being reduced.

In the second heating step, preferably the component ratio of the inactive gas (nitrogen gas) to all the constituent gases of the main flow (in this case, the sum of the first main flow and second main flow) is from 0.5 to 1.0 (both inclusive) in terms of flow ratio. These gas mixture components are used because if an excessive amount of active gas is contained in the atmosphere to which the surface of the base is exposed during heating of the base in a relatively high temperature region, defects tend to be introduced easily to the nitride crystal on the surface of the base. Thus, in the second heating step, preferably hydrogen gas which has an excessive etching effect and induces nitrogen escape is not contained in the atmosphere.

The heating step (step A) is followed by a growth step (step B) of the first nitride semiconductor layer, in which the present invention can epitaxially grow high-quality nitride semiconductor layers even if a thermal cleaning step such as adopted by conventional crystal growth methods is not used to clean the principal nitride plane of the base. Especially when the principal nitride plane of the base is the m-plane, good crystal morphology is obtained without such a cleaning step.

In step B, $NH_3$ gas and nitrogen gas are continued to be supplied as the constituent gas of the first main flow and constituent gas of the second main flow, respectively. After the reactor atmosphere is stabilized, part of the nitrogen gas which is the constituent gas of the second main flow is used as a carrier gas to supply source materials for III group elements and dopants. Then, raw materials for epitaxial growth is supplied to the reactor to initiate crystal growth of the nitride semiconductor layer.

In the exemplary sequence shown in FIG. 2(A), $NH_3$ gas which can be a nitrogen source material of GaN is supplied as a constituent gas of the first main flow, part of the constituent gas of the second main flow is used as a carrier gas, and a source material for trimethylgallium (TMGa) is supplied as a gallium source. Preferably the first nitride semiconductor layer is a crystal which does not contain polycrystalline components, and more preferably is made of a single crystal itself. A second nitride semiconductor layer is formed further on the first nitride semiconductor layer. Of course, a nitride semiconductor layer may be formed further on the second nitride semiconductor layer.

In step B, the first nitride semiconductor layer is epitaxially grown in an environment in which no silicon (Si) source material is intentionally supplied to the principal nitride plane of the base. That is, the first nitride semiconductor layer is epitaxially grown on the principal nitride plane of the base with the principal nitride plane of the base exposed to an atmosphere containing an inactive gas and an appropriate amount of an optional, active gas, and without intentional supply of a Si source material. In the case of the sequence shown in FIG. 2(A), this means that in the atmosphere containing $N_2$ and $NH_3$ and making up the main flow, the first nitride semiconductor layer is epitaxially grown on the principal nitride plane of the base without intentional supply of a Si source material.

A typical film thus obtained is ideally an i-GaN layer. However, even if a GaN layer is epitaxially grown without intentional supply of a source material for a dopant such as Si, it is generally the case that Si and the like get mixed in the film from impurities contained in a source gas or from quartz components existing in or near the reactor. Furthermore, for example, if a Si-based abrasive used in a polishing step of a freestanding substrate such as a GaN substrate or AlN substrate attaches as a residue to the surface of the base, Si remaining on the surface of the base during epitaxial growth may get mixed as an impurity in the i-GaN layer. In addition, when a freestanding substrate such as a GaN substrate or AlN substrate intentionally doped with Si during its fabrication is used for epitaxial growth, Si segregation may occur on the substrate surface during epitaxial growth and the Si may be taken into the i-GaN layer. Preferably the concentration of such an unintended impurity is kept to or below $3 \times 10^{17}$ cm$^{-3}$ in the case of Si.

An unavoidably added impurity such as described above may be unevenly distributed near the GaN layer, for example, due to a pile-up phenomenon or the like and, as a result, taken into the GaN layer at a concentration in excess of $3 \times 10^{17}$ cm$^{-3}$ described above. However, in studies conducted by the present inventors, noticeable deterioration in film quality of the GaN layer was not observed unless impurities were taken into the GaN layer as a result of intentional raw material supply, as shown later in examples and comparative examples. Thus, any mention made of "Si concentration on nitride semiconductor layer" herein refers to Si taken into the layer through intentional raw material supply such as $SiH_4$ or $Si_2H_6$ supply unless specifically noted. Even when Si is unavoidably mixed in the GaN layer due to the pile-up phenomenon or the like described above, preferably a peak value of the impurity concentration (Si concentration) in the first nitride semiconductor layer is kept to or below $1 \times 10^{21}$ cm$^{-3}$. More preferably the impurity concentration (Si concentration) is kept to or below $1 \times 10^{20}$ cm$^{-3}$, still more preferably to or below $8 \times 10^{19}$ cm$^{-3}$, and most preferably to or below $6 \times 10^{19}$ cm$^{-3}$. A thick-film GaN layer with a Si concentration in excess of $6 \times 10^{19}$ cm$^{-3}$ can have a problem with its surface flatness although such a problem is not noticeable in a thin-film layer. Thus, it is most preferable to keep the Si concentration to or below $6 \times 10^{19}$ cm$^{-3}$ even in the case of a thin-film layer.

Also, preferably average Si concentration in a thickness direction of the grown film in the first nitride semiconductor layer is lower than average Si concentration in a thickness direction of the grown film in the second nitride semiconductor layer. This is because even if Si is mixed in due to any of the causes described above, since the impact of Si is considered to reach only as deep as approximately a few hundred nm from an interface, if the first nitride semiconductor layer is sufficiently thicker than this figure, the average Si concentration in the thickness direction of the grown film in the first nitride semiconductor layer epitaxially grown without intentional supply of a source material for a dopant such as Si is considered to become lower than the Si concentration in the second nitride semiconductor layer grown by intentionally adding Si as an n-type dopant.

However, when a first nitride semiconductor layer approximately a few hundred nm or below in thickness is formed on a base used for epitaxial growth, even if the first nitride semiconductor layer is epitaxially grown without intentional supply of a source material for a dopant such as Si, the average Si concentration in the thickness direction of the grown film in the first nitride semiconductor layer may become higher than the Si concentration in the second nitride semiconductor layer grown by intentionally adding Si as an n-type dopant. In this case, the Si concentration in the second nitride semiconductor layer is considered to be lower than the Si concentration in the first nitride semiconductor layer estimated on the assumption that the pile-up phenomenon does not occur. In view of this, it is preferable that the Si concentration in the second nitride semiconductor layer is $1 \times 10^{17}$ cm$^{-3}$.

In step B, preferably with the reactor pressure also set, for example, between about 35 kilopascals and 120 kilopascals, gases are supplied such that the component ratio (Fp) of inactive gas to all the constituent gases of the main flow will be between 0.5 and 1.0 (both inclusive) in terms of flow ratio (where the component ratio is that of the inactive gas to the total sum of an $NH_3$ gas component in the first main flow and nitrogen gas and TMGa components in the second main flow in the exemplary sequence shown in FIG. 2(A)). Also, preferably $H_2$ gas which has a high etching effect is not mixed in inactive gases of the main flow. In step B, if epitaxial growth is carried out with the reactor pressure reduced to below 35 kilopascals, crystallinity will be reduced due to increased point defects, causing deterioration in photoluminescence (PL) characteristics of the second nitride semiconductor layer formed on the first nitride semiconductor layer and a multi-quantum well active layer structure formed optionally. On the other hand, if the reactor pressure is 120 kilopascals or above, vapor phase reactions in the reactor will increase, causing carbon to be taken into nitride semiconductor layers during epitaxial growth and resulting in reduced crystallinity. Also, if the component ratio of the inactive gas to all the constituent gases of the main flow becomes less than 0.5 in terms of flow ratio, it becomes difficult to grow a flat crystal and consequently surfaces of the nitride semiconductor layers tend to become irregular.

In step B, the temperature of the base is set to a predetermined temperature in the temperature range of 600° C. to 1,350° C. The lower limit of 600° C. has been determined with consideration given to the heat energy needed for crystal growth of high-quality nitride semiconductors and the upper limit of 1,350° C. has been determined because of constraints such as deterioration of reactor's structural members. If a film is formed at temperatures below 600° C., polycrystalline components tend to bet mixed, resulting in deterioration of light emission characteristics.

Preferably the first nitride semiconductor layer obtained under these conditions is a relatively thin layer with its thickness $L_1$ in the range of 0.1 nm to 300 nm. The reason why the lower thickness limit of the first nitride semiconductor layer is set to 0.1 nm is that at least 0.1 nm is required in order to cover the surface of the base (surface of the nitride) with an epitaxial layer. Furthermore, according to studies conducted by the present inventors, an excessively thick first nitride semiconductor layer is likely to deteriorate the surface morphology of the entire epitaxial layer grown subsequently as well as optical characteristics of any active layer structure included in the epitaxial layer, and thus is not preferable. Specifically, $L_1$ is preferably in the range of 0.1 nm to 300 nm meaning a relatively thin layer, more preferably in the range of 1.0 nm to 150 nm, and most preferably in the range of 5.0 nm to 50 nm. According to studies conducted by the present inventors, if a second nitride semiconductor layer is homoepitaxially grown on such a first nitride semiconductor layer, it is possible to reduce defects in the second nitride semiconductor layer.

The second nitride semiconductor layer (second GaN layer) which is a relatively thick layer is epitaxially grown (step C) by supplying an n-type dopant source material onto the first nitride semiconductor layer (first GaN layer). In this step, the second nitride semiconductor layer is epitaxially grown by intentionally supplying an n-type dopant source material onto the first nitride semiconductor layer with the surface of the first nitride semiconductor layer exposed to an atmosphere containing an inactive gas.

In the case of the sequence shown in FIG. 2(A), the second nitride semiconductor layer is epitaxially grown by intentionally supplying an n-type dopant source material onto the first nitride semiconductor layer in an atmosphere containing $N_2$ and an appropriate amount of $NH_3$ and making up the main flow, where $N_2$ is an essential, inactive gas and $NH_3$ is an optional, active gas serving as a nitrogen source material. Examples of possible n-type dopants in nitride semiconductor layers include Si, O, C, Ge, Se, S, and T, of which Si, Se, and O are especially suitable and Si is the most suitable.

In step C, again the temperature of the base is set between 600° C. and 1,350° C., but the pressure in the reactor is 5 kilopascals or above and equal to or lower than the pressure used for the epitaxial growth of the first nitride semiconductor layer. In the process of laminating the second nitride semiconductor layer onto the first nitride semiconductor layer, generation of point defects is suppressed. Consequently, the pressure in the reactor can be set lower than in step A and step B. However, at a pressure lower than 5 kilopascals, nitrogen tends to escape from the surface of the second nitride semiconductor layer in the process of growth. This effect is considered to be larger on a nonpolar plane than on a usual polar plane. Thus, preferably the lower pressure limit is 5 kilopascals.

In the exemplary sequence shown in FIG. 2(A), $NH_3$ gas which can serve as a nitrogen source for GaN is supplied as the first main flow of the main flow and $N_2$ is supplied as the second main flow of the main flow. Part of $N_2$ is used as a carrier gas to supply TMGa as well as to supply silane ($SiH_4$) gas as a source of Si which is an n-type dopant. In step C, as in the case of step B, preferably gases are supplied such that the component ratio of the inactive gas to all the constituent gases of the main flow will be between 0.5 and 1.0 (both inclusive) in terms of flow ratio (where the component ratio is that of the inactive gas to the total sum of $NH_3$ gas component in the first main flow and nitrogen gas, TMGa, and $SiH_4$ gas components in the second main flow in the exemplary sequence shown in FIG. 2(A)).

This is because introduction of an excessively active gas—especially introduction of $H_2$ gas which has a high etching effect—is not preferable: introduction of such a gas will make it difficult to grow a flat crystal, creating a tendency for the surfaces of the nitride semiconductor layers to become irregular.

However, active gases introduced optionally in step C may include $H_2$ gas in addition to $NH_3$. In particular, $H_2$ gas can be introduced in an appropriate amount as a result of using $H_2$ as a carrier gas or diluent gas for $SiH_4$ as long as the component ratio of the inactive gases to the ambient gases (constituent gases of the main flow) on the surface of the base does not fall outside the range of 0.5 to 1.0 in terms of flow ratio. In such a case, even if $H_2$ is used as a diluent gas for $SiH_4$, it is usually the case that the flow ratio of the added $H_2$ gas to all the constituent gases of the main flow is on the order of 0.02. Of course, it is preferable to use $N_2$ as a carrier gas or diluent gas for $SiH_4$.

The second nitride semiconductor layer thus obtained is a relatively thick layer with its thickness $L_2$ in the range of 0.4 to 20 μm. Normally the Si concentration is $1 \times 10^{17}$ cm$^{-3}$ or above, preferably $5 \times 10^{17}$ cm$^{-3}$ or above, more preferably $1 \times 10^{18}$ cm$^{-3}$ or above, and particularly preferably $3 \times 10^{18}$ cm$^{-3}$ or above. Also, normally the Si concentration is not higher than $6 \times 10^{19}$ cm$^{-3}$, preferably not higher than $4 \times 10^{19}$ cm$^{-3}$, more preferably not higher than $1 \times 10^{19}$ cm$^{-3}$, and particularly preferably not higher than $7 \times 10^{18}$ cm$^{-3}$. If the thickness $L_2$ of the second nitride semiconductor layer is below 0.4 μm, it is difficult to obtain good p-n characteristics when a p-n junction device is fabricated. On the other hand, a film thickness in excess of 20 μm tends to cause surface roughness.

Preferably thickness $L_2$ is 0.4 μm (400 nm) or above from the standpoints of making it easier to stabilize electrical characteristics of a fabricated device and lessening adverse effects of slight lattice defects remaining at an epitaxial growth interface on the quantum well active layer structure of the device. Also, if the dopant concentration is below $1 \times 10^{17}$ cm$^{-3}$, it is difficult to obtain good p-n characteristics when a p-n junction device is fabricated. On the other hand, a dopant concentration in excess of $6 \times 10^{19}$ cm$^{-3}$ tends to cause surface roughness on the nitride semiconductor layers with high dopant concentration.

The present invention includes steps A, B, and C described above, and needless to say, additional steps may be provided. For example, a step of forming a layer structure by repeatedly laminating two or more types of layer with different doping concentrations or two or more types of nitride semiconductor layer made of different materials may be added between steps B and C (between the first nitride semiconductor layer and second nitride semiconductor layer). Furthermore, according to the present invention, the most preferable attainable heating temperature range in step A, film formation temperature range of the first nitride semiconductor layer, and film formation temperature range of the second nitride semiconductor layer are all 900° C. to 970° C. as described above.

Normally, for i-GaN or n-GaN thick-film formation on a c-plane GaN crystal, the most preferable attainable heating temperature or growth temperature is above 1,000° C., and crystal growth at lower temperatures will result in reduced crystallinity. However, experiments conducted by the present inventors have confirmed that when crystal growth is carried out on a base which has a nonpolar principal plane using the method according to the present invention, epitaxial growth carried out at temperatures 100° C. or more lower than under typical conditions greatly improves luminous intensity. Thus, since it is preferable to form nitride semiconductor layers at relatively low temperatures, it is preferable to use, for example, TEGa rather than TMGa as a Ga source material to prevent carbon impurities from getting mixed in the films from metal-organic materials. This is because TEGa decomposes at lower temperatures than TMGa, preventing carbon from being taken into the films. Consequently, for example, when the second nitride semiconductor layer is doped with Si or the like, the use of TEGa makes it possible to form a layer with low compensation due to carbon, and is preferable.

As shown in FIG. 2(A) by way of example, a third step may be provided, including a step of epitaxially growing a stacked structure including an MQW layer further on the second nitride semiconductor layer (step D), a step of epitaxially growing nitride semiconductor layer containing p-type dopant (step E), or a cooling step (F).

In the step of epitaxially growing a stacked structure including an MQW layer on the second nitride semiconductor layer (step D), preferably, the stacked structure including the MQW layer is epitaxially grown on the second nitride semiconductor layer with the surface of the second nitride semiconductor layer exposed to an atmosphere containing an inactive gas.

In the case of the sequence shown in FIG. 2(A), a multi-quantum well active layer structure made up of a stacked structure of an InGaN layer and GaN layer is formed on the nitride semiconductor layer in an atmosphere containing $N_2$ and an appropriate amount of $NH_3$ gas and making up the main flow, where $N_2$ is an inactive gas and $NH_3$ is an optional, active gas serving as a nitrogen source material.

Preferably quantum well layers in the multi-quantum well active layer structure according to the present invention contain In, Al, or the like, and most preferably In, to select an emission wavelength as required. Indium concentration in an InGaN quantum well layer is, for example, 0.04 to 0.15 in terms of composition ratio. Preferably an InGaN/GaN multi-quantum well active layer structure emits light with a center wavelength of 400±30 nm (i.e., 370 nm to 430 nm both inclusive). More preferably the center wavelength is 380 nm to 420 nm both inclusive, which corresponds to about 0.05 to 0.10 in terms of In composition ratio of the InGaN quantum well layer. Most preferably the center wavelength is 395 nm to 415 nm both inclusive, which corresponds to about 0.06 to 0.09 in terms of In composition ratio of the InGaN quantum well layer. Reasons for this are as follows.

Generally, in an InGaN/GaN multi-quantum well active layer structure formed on a c-plane sapphire substrate, a large number of dislocations due to inconsistency of lattice constants and the like propagate from an interface between the sapphire substrate and a GaN-based epitaxial layer to the entire epitaxial layer including the multi-quantum well active layer structure. It is known that such dislocation density is on the order of $1 \times 10^9$ $cm^{-2}$. It is also known that even if an epitaxial layer is formed on a sapphire substrate on which projections and depressions are formed to reduce some of the dislocations, the dislocation density can be reduced only to about $3 \times 10^8$ $cm^{-2}$.

In this case, even if there are a large number of dislocations, it is believed that In localizes light emission in the quantum well layers, reducing non-radiative recombination which occurs when electron-hole pairs injected or generated in the quantum well layers are captured by dislocations and the like.

On the other hand, the present invention uses a nitride on a nonpolar-plane substrate as a base. That is, since the present invention has successfully overcome the conventional difficulty of growth on a nonpolar-plane substrate, the dislocation density in the nitride semiconductor epitaxial layer grown by the method according to the present invention is very low. Experiments conducted by the present inventors have shown that the dislocation density in the epitaxial layer according to the present invention is preferably $3 \times 10^7$ $(cm^{-2})$ or below, and more preferably $5.0 \times 10^6$ $(cm^{-2})$ or below. Even if the localization effect of In is limited in this way, the present invention provides good light emission characteristics. Specifically, it has been confirmed that very good light emission characteristics are exhibited even when the In composition ratio of the InGaN quantum well layer is 0.04 to 0.15. Thus, the light emitted by the nitride semiconductor epitaxial layer according to the present invention has a center wavelength whose lower limit is preferably 370 nm or above, and more preferably 380 nm or above, and whose upper limit is preferably 430 or below, and more preferably 420 nm or below. The lower limit is defined by the minimum In composition of the InGaN layer required to form band offsets with the GaN layer while the upper limit is defined by the maximum In composition below which it is possible to form relatively thick-film InGaN quantum well layers suitably used in the present invention.

Preferable temperatures of the base in forming a quantum well active layer are defined for the purpose of forming an InGaN layer in a stable manner. Since indium in the InGaN layer has a high vapor pressure, preferably the quantum well active layer is formed at temperatures lower than other layers. In particular, according to studies conducted by the present inventors, in the case of growth on a nonpolar-plane, less indium is taken in than in the case of growth on a polar-plane even if other conditions are the same. Furthermore, as shown in the examples and comparative examples, it has also been found that flat quantum well active layers with better optical characteristics have a smaller number of microscopic kink sites which are in the process of growth, causing less opportunities for indium to be taken in, and thus tend to have a relatively long wavelength. Thus, when a quantum well active layer structure including an InGaN layer is formed on an epitaxial layer on a flat nonpolar-plane as in the case of the present invention, it is preferable to use a temperature range of 600° C. to 850° C.

Temperatures of the base 600° C. or below are not preferably because the efficiency of decomposing nitrogen source materials is reduced and more impurities are taken in, resulting in deteriorated crystallinity. On the other hand, temperatures above 850° C. intensify re-evaporation of indium atoms, making it difficult to control emission wavelengths and to ensure in-plane uniformity, both of which are dependent on the indium composition. Therefore, it is preferable to set the temperature of the base between 600° C. and 850° C. during formation of a quantum well active layer. When impurities need to be reduced and a higher wavelength repeatability is required, it is more preferable to set the temperature of the base between 700° C. and 760° C.

Preferably the pressure in the reactor during formation of a quantum well active layer is equal to or higher than the pressure during epitaxial growth of the first nitride semiconductor layer, but not above 120 kPa. This is based on the following reasons. In the step of laminating a quantum well active layer onto the second nitride semiconductor layer, it is necessary to reduce generation of defects in the presence of indium which is an element with high vapor pressure. Thus, it is preferable to set the pressure in the reactor higher than in step B. This makes it possible to appropriately prevent excessive re-evaporation and the like of indium which is an element with high vapor pressure. However, pressures higher than 120 kilopascals will increase vapor phase reactions in the reactor, making it easier for carbon to be taken into the nitride semiconductor layer during epitaxial growth, resulting in reduced crystallinity. Thus, it is preferable that the pressure in the reactor is equal to or higher than the pressure during epitaxial growth of the first nitride semiconductor layer, but not above 120 kPa.

In the exemplary sequence shown in FIG. 2(A), $NH_3$ gas which can serve as a nitrogen source for InGaN and GaN is supplied as the first main flow of the main flow and $N_2$ is supplied as the second main flow of the main flow. Part of $N_2$ is used as a carrier gas to supply TMGa and TMIn. In step D, preferably gases are supplied such that the component ratio of the inactive gas to all the constituent gases of the main flow will be between 0.5 and 1.0 (both inclusive) in terms of flow ratio (where the component ratio is that of the inactive gas to the total sum of $NH_3$ gas in the first main flow and nitrogen gas, TMIn, and TMGa in the second main flow in the case of quantum well layers contained in the active layer structure, and to the total sum of $NH_3$ gas in the first main flow and nitrogen gas and TMGa in the second main flow in the case of barrier layers contained in the active layer structure, in the exemplary sequence shown in FIG. 2(A)). In particular, in the case of the quantum well layers contained in the active layer structure, preferably $H_2$ is not supplied.

This is because introduction of an excessively active gas—especially introduction of $H_2$ gas which has a high etching effect—extremely impairs flatness of materials, such as InGaN, containing InN, in particular, and consequently reduces crystallinity of an active layer even in a nitride semiconductor layer having a good ground after undergoing the first growth step and second growth step according to the present invention. Thus, introduction of $H_2$ is not preferable. However, when growth takes place in the presence of excessive quantities of nitrogen source material which is an active gas, since nitrogen removal is reduced, the component ratio of the inactive gas among all gasses making up the main flow can be lowered to about 0.4, according to studies conducted by the present inventors.

According to the present invention, it is preferable to increase the thickness of the active layer structure, and in particular, the thickness of the quantum well layer of the quantum well active layer structure, which can be fabricated in the epitaxial growth step of the stacked structure in the third step. This is a feature which is realized by the capability of the growth method according to the present invention to form the second nitride semiconductor layer as a high-quality flat layer on the first nitride semiconductor layer in conjunction with the fact that the QCSE effect is suppressed on a nonpolar plane.

Specifically, it is known that quantum well layers in an InGaN/GaN multi-quantum well active layer structure formed on a c-plane sapphire substrate have the highest luminous efficiency when the thickness of the quantum well layers is about 1 nm to 2 nm each. This is partly because electron-hole pairs injected or generated in a multi-quantum well active layer structure formed on a polar plane are separated spatially and ultrathin quantum well layers are required to prevent the separation. On the other hand, the present invention can form the first nitride semiconductor layer and second nitride semiconductor layer as high-quality flat layers, as described above, on a base having a nonpolar plane free of QCSE in principle, and thus can produce an ideal quantum structure.

Thus, in fabrication of, for example, a light-emitting element, the efficiency and output power of the light-emitting element can be increased by increasing the volume of the quantum well layers in the multi-quantum well active layer structure. According to experiments conducted by the present inventors, preferably, the lower thickness limit of at least any one of the quantum well layers in the multi-quantum well active layer structure is 10 nm or above, and more preferably 15 nm or above. Furthermore, the lower thickness limit of all the quantum well layers in the multi-quantum well active layer structure is 10 nm or above, and more preferably 15 nm or above. This means that the method according to the present invention can form far thicker quantum well layers and multi-quantum well active layer structures than can conventional methods.

On the other hand, excessively thick quantum well layers of a multi-quantum well active layer structure are not preferable from the standpoint of realizing high-efficiency radiative recombination by so-called quantum size effect and from the standpoint of preventing degradation of crystal quality (described below). According to studies conducted by the present inventors, 100 nm or below is preferable, 50 nm or below is more preferable, 30 nm or below is still more preferable, and 20 nm or below is most preferable. Again, the preferable upper thickness limits are far higher than in the case of the conventional methods.

Now a supplementary explanation will be given from the standpoint of crystal quality. Since the present invention has successfully overcome the conventionally reported difficulty of growth on a nonpolar-plane substrate in the formation of the first nitride semiconductor layer and second nitride semiconductor layer as described above, dislocation density in the epitaxial layer is very low. Consequently, the present invention can realize good light emission characteristics even if the localization effect of In is reduced, i.e., even if an InGaN layer with low In composition is used as a quantum well layer as described above.

In homoepitaxial growth on a GaN substrate, if an InGaN layer with high In concentration is formed on the GaN substrate, the InGaN layer is subjected to a compressive stress along the growth plane. In particular, since an InGaN quantum well layer in an InGaN/GaN quantum well active layer structure formed on a nonpolar plane such as an m-plane GaN substrate is subjected to an anisotropic compressive stress in the growth plane, a critical film thickness which does not impair crystallinity of an InGaN layer with high In concentration is far thinner than a critical film thickness which does not impair crystallinity of an InGaN layer with low In concentration. That is, with an InGaN/GaN quantum well active layer structure formed by a method which can form only non-flat structures having poor nonpolar-plane morphology and a lot of point defects as is conventionally the case, it is necessary to increase In concentration and improve luminous intensity by the localization effect of In as in the case of sapphire substrates. Consequently, it is not possible to increase the film thickness of the InGaN layer due to the constraints of the critical film thickness. On the other hand, the film thickness can be increased particularly suitably when the In composition of the InGaN quantum well layer is relatively low, i.e., in the range of 0.04 to 0.15 which is suitably used in the present invention. Consequently, both the upper and lower limits of preferable thickness of the quantum well layer are relatively high compared to conventional figures.

Furthermore, the present invention has successfully overcome the conventionally reported difficulty of growth on a nonpolar-plane substrate in the formation of the first nitride semiconductor layer and second nitride semiconductor layer as described above, and can form the first and second nitride semiconductor layers as flat layers. Therefore, when a multi-quantum well active layer structure is included in a stacked structure optionally formed on the first and second nitride semiconductor layers, the present invention can form a larger number of quantum well layers in the multi-quantum well active layer structure than the number of quantum well layers in a multi-quantum well active layer structure formed on any of a nonpolar plane and polar plane by the conventional method.

This is because regardless of whether on a nonpolar plane or polar plane, with the conventional method, due to the difficulty of ensuring flatness of quantum well layers, fluctuations and the like in the film thicknesses of the well layers themselves increase in the growth plane and the like and become serious with increases in the number of well layers. With the present invention, as shown in the examples and the like, even when multiple well layers are stacked, the flatness of the well layers are ensured more easily than with the conventional method. This is preferable because the total number of quantum well layers can be increased easily. With the method according to the present invention, preferably the number of well layers in a multi-quantum well active layer structure is 2 to 100, more preferably 4 to 50, still more preferably 6 to 25, and most preferably 8 to 15.

Thus, according to the present invention, it is preferable to increase the thickness of the active layer structure, and in particular, the thickness of the quantum well layer of the quantum well active layer structure, which can be fabricated in the epitaxial growth step of the stacked structure in the third step. Also, it is preferable to provide a larger number of quantum well layers than usual. This is a feature which is realized by the capability of the growth method according to the present invention to form the second nitride semiconductor layer as a high-quality flat layer on the first nitride semiconductor layer in conjunction with the fact that the QCSE effect is suppressed on a nonpolar plane.

Although a layer containing a possible p-type dopant material may be selected anywhere on the second nitride semiconductor layer, it is preferable to provide a stacked structure including an MQW layer on the second nitride semiconductor layer and further provide, thereon, a layer containing a possible p-type dopant material (step E). In step E, preferably Mg is used as p-type dopant and preferably the concentration of Mg is in the range of $1\times10^{19}$ $cm^{-3}$ to $8\times10^{19}$ $cm^{-3}$. The reasons are as follows.

Mg is not easily taken into a nitride crystal, the concentration of Mg being a rate-controlling factor thereof. The way the Mg is taken in depends greatly on the flatness of the surface. Therefore, when an epitaxial layer on a nonpolar plane has poor surface flatness as is conventionally the case, it is difficult to control Mg concentration on the surface of the base. This may result in an unintentionally low concentration or conversely in accidental formation of a layer with a very high concentration. On the other hand, the structure with good surface conditions according to the present invention can control Mg concentration stably with good repeatability, making it possible to select a target value of Mg concentration just as intended from a relatively wide range, as required.

That is, there is no chance of carrying out epitaxial growth with the target value of Mg concentration intentionally lowered to avoid accidental formation of a layer with a very high concentration and ending up with an extremely low concentration as is the case with the conventional method. Therefore, dopant concentration in a layer formed on a nonpolar plane with excellent surface flatness and containing a possible p-type dopant material can be set to a range considered to be relatively suitable for AlGaN-based nitride semiconductor. Preferably the dopant concentration is in the range of $1\times10^{19}$ $cm^{-3}$ to $8\times10^{19}$ $cm^{-3}$, and more preferably in the range of $2\times10^{19}$ $cm^{-3}$ to $6\times10^{19}$ $cm^{-3}$.

Preferably a layer containing a possible p-type dopant material is a layer which contain $Al_xGa_{1-x}N$ ($0\leq x\leq 1$). In particular, when a center wavelength of light emitted from an InGaN/GaN quantum well active layer structure with low In concentration suitably used in the present invention is between 370 nm and 430 nm, to prevent the light emitted from the active layer structure from being absorbed by the layer containing a possible p-type dopant material, desirably $Al_xGa_{1-x}N$ ($0\neq x$) is satisfied.

According to the present invention, even when the first nitride semiconductor layer, second nitride semiconductor layer formed thereon, and active layer structure further formed thereon are epitaxial layers formed on a nonpolar plane, high flatness can be achieved. Consequently, a good $Al_xGa_{1-x}N$ ($x\neq 0$) layer containing a possible p-type dopant material can be formed suitably on the above-described layers even when the $Al_xGa_{1-x}N$ ($x\neq 0$) layer has an Al composition and a layer thickness both of which are higher than usual.

Generally, AlGaN layer on GaN substrate is subject to an internal tensile stress. The stress increases with increases in the Al composition and film thickness, resulting in development of cracks and the like as well as in introduction of defects. However, on the flat epitaxial layers with less defects realized by the present invention, the degree of stress is reduced. This makes it possible to grow a high-quality AlGaN layer even if the Al composition and film thickness are relatively high. According to studies conducted by the present inventors, the range of Al composition which can be used suitably is 0.02 to 0.20, and more preferably 0.03 to 0.15.

Preferably the film thickness is 0.05 μm to 0.25 μm, more preferably 0.10 μm to 0.20 μm and most preferably 0.12 μm to 0.18 μm. If a p electrode is formed on a semiconductor light-emitting element according to the present invention, it is preferable to insert a thin film of, for example, $Al_{0.025}Ga_{0.975}N$ with low Al composition as a layer to interface with the electrode to reduce contact resistance between the quantum well active layer structure and the electrode. At the same time, $Al_{0.10}Ga_{0.90}N$ can be formed on the quantum well active layer structure from the standpoint of preventing light absorption as described above. In this way, it is useful and preferable to provide two layers of possible p-type dopant material in order to improve both optical characteristics and electrical characteristics.

Preferably an inactive gas is used for a growth atmosphere in forming the layer containing a possible p-type dopant material—for example, an $Al_xGa_{1-x}N$ ($0\leq x\leq 1$) layer—for the same reasons as in steps B and C. However, an atmosphere which contains active, $H_2$ gas as a main component can be used without problem to form the layer containing a possible p-type dopant material as long as the underlying epitaxial layer has good flatness. Especially when the layer containing a possible p-type dopant material—for example, an $Al_xGa_{1-x}N$ ($0\leq x\leq 1$) layer—has a low film thickness and short growth time, an atmosphere whose principal component is active, $H_2$ gas can be used suitably for growth. Thus, the growth atmosphere used to form the layer containing a possible p-type dopant material—for example, an $Al_xGa_{1-x}N$ ($0\leq x\leq 1$) layer—can be selected as required. For example from the standpoint of preventing carbon and other impurities from getting mixed in, it is preferable to use an atmosphere whose principal component is active, $H_2$ gas for growth. On the other hand, when importance is attached to surface flatness, it is preferable to use an atmosphere whose principal component is $N_2$ for growth.

When the layer containing a possible p-type dopant material—for example, an $Al_xGa_{1-x}N$ ($0\leq x\leq 1$) layer—is formed, preferably the temperature of the base for growth is in the range of 600° C. to 1,350° C. as during the growth of other layers, more preferably in the range of 650° C. to 1,200° C., still more preferably in the range of 800° C. to 1,100° C., and most preferably in the range of 900° C. to 970° C.

The pressure at which the epitaxial layer containing a possible p-type dopant material is formed is preferably 30 kPa or above from the standpoint of reducing generation of defects resulting from introduction of Mg, and 120 kPa or below from the standpoint of inhibiting vapor phase reactions as described above.

After the layers are epitaxially grown on the nonpolar-plane base in the manner described above without intentional supply of a Si source material in a initial stage of growth, the nitride semiconductor need to be taken out of the growth reactor. For that, a cooling step may be carried out following any desired procedures, but preferably the following cooling conditions are observed. Specifically, an activation process can be performed during cooling to turn that part of the epitaxial layer which contains a possible p-type dopant material into a p-type layer (in-process activation step during cooling).

In that case, according to studies conducted by the present inventors, if a flat epitaxial layer including the layer containing a possible p-type dopant material has been formed on a nonpolar-plane base, the possible p-type dopant material can be activated as follows in the cooling step schematically shown in FIG. 2(A).

Specifically, immediately after the supply of the III group source material and dopant source material is stopped, the temperature of the base is started to be lowered, where available methods for lowering the substrate temperature include natural cooling, slow cooling under temperature control, and gas cooling by means of supplied gas. In the cooling step, $N_2$ supply is continued, or an inactive gas is supplied, or $N_2$ supply is continued with additional supply of another inactive gas. $H_2$ supply is sufficiently decreased or stopped if $N_2$ is supplied in the growth steps, the $NH_3$ flow rate is decreased in the coding step compared to the growth steps, and then $NH_3$ is supplied until an appropriate temperature is reached. Subsequently, the substrate temperature is further lowered using only $N_2$ gas, or only inactive gas, or gas mixture of $N_2$ gas and inactive gas. The present inventors have found that a layer formed on a nonpolar plane, having a flat surface, and containing a possible p-type dopant material can be turned into a p-type layer using the procedures described above. The reason why the $NH_3$ flow rate is decreased in the cooling step compared to the growth steps and then $NH_3$ is supplied until an appropriate temperature is reached before stopping the $NH_3$ supply is to prevent nitrogen, which is a constituent element of the epitaxial layer, from escaping from the surface. This is analogous to the technical idea of the present invention concerning the heating step.

Furthermore, according to studies conducted by the present inventors, an optimum p-type dopant activation sequence depends on the material of the outermost surface. For example, if the outermost surface is a GaN layer, after the end of the crystal growth sequence (i.e., after the supply of Ga source material such as TMGa and TEGa as well as Mg source material such as $Cp_2Mg$ is stopped and the cooling step is started, in this case), preferably the flow rate of $NH_3$ is from 100 sccm to 1 slm both inclusive. On the other hand, if the outermost surface is a AlGaN layer, whose surface is less prone to nitrogen escape, after the supply of III group source material such as TMGa, TEGa, and TMAl as well as Mg source material such as $Cp_2Mg$ is stopped and the cooling step is started, preferably the flow rate of $NH_3$ is from 30 sccm to 100 sccm both inclusive. In either case, in the cooling step, preferably introduction of $NH_3$ is continued at least until a temperature of 965° C. is reached, and stopped not later than when a temperature of 450° C. is reached at the longest. In the cooling step, if the $NH_3$ supply is stopped at an excessively high temperature, surface roughness will result. On the other hand, if the $NH_3$ supply is continued until an excessively low temperature is reached, the H atoms of $NH_3$ will be fixed in the crystal, reducing the activation rate of Mg. Thus, it is most preferable to stop the $NH_3$ supply at a temperature between 950° C. and 750° C.

The pressure range for the cooling step can be set as desired, but according to studies conducted by the present inventors, preferably the pressure is set between about 13 kPa and 203 kPa although the cooling step can be carried out under any of reduced pressure, normal pressure, and increased pressure. In particular, conditions of reduced pressure is preferable in that removal of H atoms is facilitated while conditions of increased pressure is preferable in that it becomes easier to turn the layer formed on a nonpolar plane and containing a possible p-type dopant material into a p-type layer and that surface flatness is ensured. Incidentally, if the pressure is close to the pressure used for epitaxial growth of a stacked structure, it is preferable to take productivity and the like into consideration.

After the cooling step, post-processing thermal annealing after cooling may be performed by increasing the temperature of the epitaxy apparatus again or on another apparatus. Alternatively, after the cooling step, a step of turning that part of the epitaxial layer which contains a possible p-type dopant material into a p-type layer (post-processing activation step after cooling) may be carried out separately by performing electron irradiation or the like. Incidentally, it is optional whether or not an epitaxial layer formed on a nonpolar plane and subjected to the in-process activation step during cooling according to the present invention is subjected again to the post-processing activation step after cooling.

As a result of studies conducted by the present inventors, it has been found that when the first nitride semiconductor layer, second nitride semiconductor layer formed thereon, and active layer structure which can be further formed thereon are epitaxial layers formed on a nonpolar plane and an epitaxial layer containing a possible p-type dopant material is further formed thereon, even if formed with very high flatness, the epitaxial layers formed on the nonpolar plane may be damaged relatively seriously compared to similar layers formed on a c-plane sapphire substrate, depending on the post-processing activation step after cooling (e.g., heat annealing). In some cases, the post-processing activation step after cooling, if carried out only to the extent of activating Mg sufficiently, may result in deterioration of optical characteristics. However, the present inventors have found that this problem can be overcome if there are first and second nitride semiconductor layers and a quantum well active layer structure formed as a result of crystal growth at relatively low temperatures.

It is considered that differences in the degree of deterioration in the post-processing activation step after cooling due to differences in the growth temperature of epitaxial layers formed on a nonpolar plane are characteristic of epitaxial layers formed on a nonpolar plane. When the epitaxial layers formed on a nonpolar plane with excellent flatness realized by the present invention are subjected to the post-processing activation step after cooling by means of so called heat annealing, preferably the temperatures used are between 650° C. and 750° C., and most preferably between 680° C. and 720° C. Preferably the duration of annealing is 1 minute to 30 minutes, and most preferably 3 minute to 10 minutes. Preferably the atmosphere is an oxygen atmosphere, nitrogen atmosphere, or combination thereof. Besides, the post-processing activation step after cooling may be carried out by means of electron irradiation.

In the present invention, when the first nitride semiconductor layer, second nitride semiconductor layer formed thereon, and active layer structure which can be further formed thereon are epitaxial layers formed on a nonpolar plane and when there is a layer preferably formed thereon and containing a possible p-type dopant material, the step of turning the epitaxial layer containing a possible p-type dopant material into a p-type layer is preferably carried out as an in-process activation step during cooling rather than as a separate, post-processing activation step after cooling, when viewed as a whole, because of simplicity and reduced damage.

The nitride semiconductor according to the present invention uses a nitride on a nonpolar-plane substrate as a base, as described above, but since the method according to the present invention has successfully overcome the conventional difficulty of growth on a nonpolar-plane substrate, the dislocation density in the epitaxial layers is very low. That is, preferably the dislocation density in the epitaxial layers of the nitride semiconductor according to the present invention is $3 \times 10^7$ ($cm^{-2}$) or below, and more preferably $5.0 \times 10^6$ ($cm^{-2}$) or below.

Figure 3A:
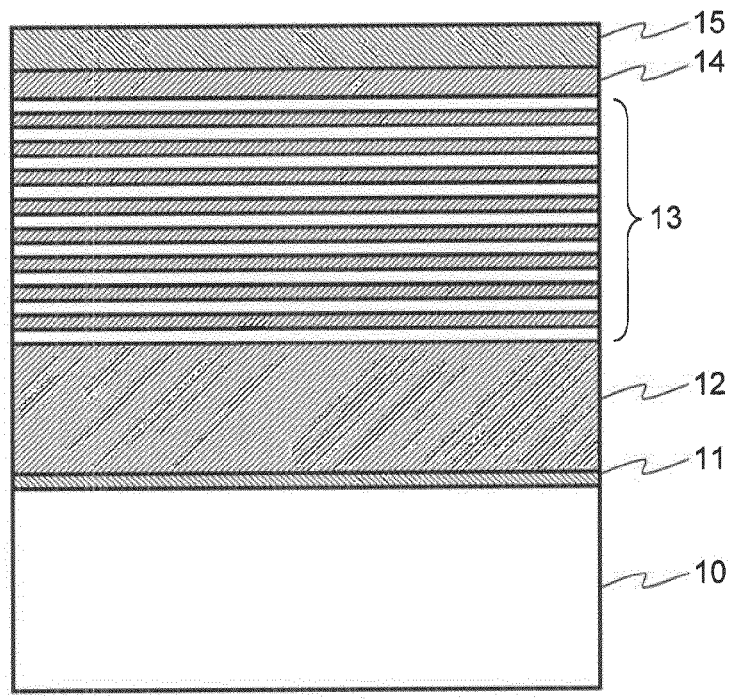
FIG. 3(A) is a simplified sectional view for illustrating an example of a nitride semiconductor according to the present invention.

FIG. 3(A) is a simplified sectional view for illustrating an example of the nitride semiconductor according to the present invention, obtained in the manner described above, where a GaN layer 11 not intentionally doped with Si and an n-type GaN layer 12 doped with Si are stacked on a GaN substrate 10 which is a freestanding GaN substrate whose principal plane is the (1-100) m-plane, an InGaN/GaN multi-quantum well active layer structure 13 formed by alternately laminating InGaN quantum well layers and GaN barrier layers is provided on the n-type GaN layer 12, and an Mg-doped AlGaN layer 14 and a GaN layer are formed on the multi-quantum well active layer structure 13.

The In concentration in the InGaN quantum well layers shown in FIG. 3(A) by way of example is, for example, 0.04 to 0.15 in terms of composition ratio, and the InGaN/GaN multi-quantum well active layer structure 13 is capable of emitting light with a wavelength of 400±30 nm.

Figure 4:
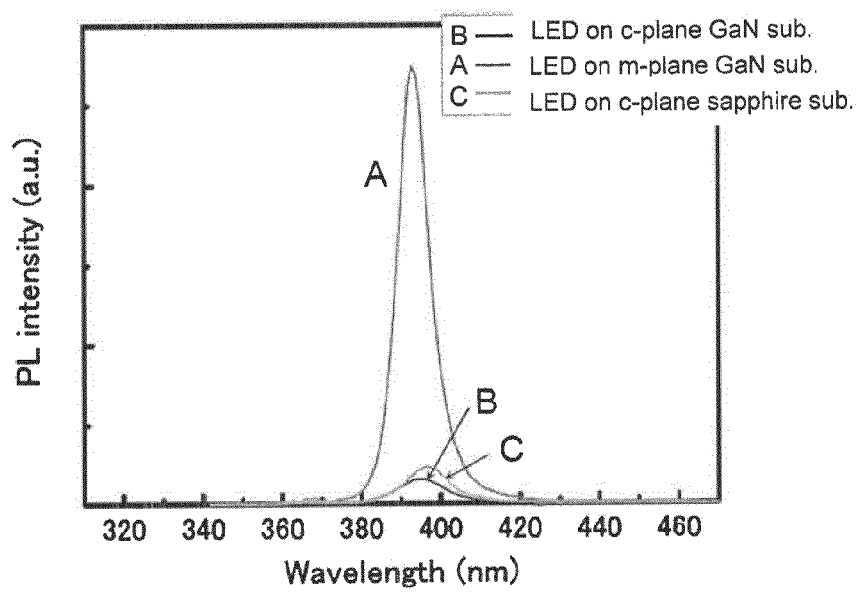
FIG. 4 is a diagram for illustrating PL emission characteristics of a specimen, which is an LED of the structure shown in FIG. 3(A) fabricated using an M-plane nitride semiconductor grown by the crystal growth method according to the present invention.

FIG. 4 shows PL emission characteristics of a specimen (A), which is an LED of the structure shown in FIG. 3(A) fabricated using an m-plane nitride semiconductor grown by the crystal growth method according to the present invention. PL characteristics of c-plane nitride semiconductor LEDs are also shown for the sake of comparison in FIG. 4, where c-plane nitride semiconductor LEDs provided for comparison are an LED specimen (B) of a c-plane nitride semiconductor grown on a c-plane freestanding GaN substrate and an LED specimen (C) of a c-plane nitride semiconductor grown on a sapphire substrate.

All the LED specimens are light-emitting elements of the stacked structure shown in FIG. 3(A). An optimum crystal growth sequence has been established for each specimen according to properties of the substrate used for the specimen. The surface morphology of all the specimens is quite good.

It can be seen from results shown in FIG. 4 that the PL emission (A) from a light-emitting layer (MQW layer) of the LED specimen according to the present invention has a much higher intensity than the PL emission (B and C) from light-emitting layers (MQW layers) of the c-plane nitride semiconductor LED specimens.

The differences in the PL intensity arise from differences in the crystallinity of the light-emitting layers of the LED specimens, and the present inventors believe that the primary causes thereof lie in that the composition in the epitaxial growth surface of a nitride semiconductor containing In tends to become more flat and uniform on a nonpolar plane (mainly the m-plane) than on the c-plane which is a polar plane and that since nitride semiconductor layers are flattened by adapting the epitaxial growth sequence according to the present invention to growth on the nonpolar plane, the light-emitting layer (MQW layer) formed on the nitride semiconductor layers is remarkably improved in crystallinity.

In addition, although it has theoretically been suggested that suppression of the QCSE effect will bring about improvements in luminous efficiency, a good epitaxial growth structure has not been available because growth on nonpolar planes has not necessarily been easy so far, and consequently excellent results such as described above has not been achieved yet. The present inventors believe that the crystal growth method according to the present invention has made it possible for the first time to obtain such good results.

Specifically, even if inactive gas is included in the constituent gas types of the main flow used in the heating step and subsequent epitaxial growth steps of the first and second nitride semiconductor layers, as is the case with the present invention, while optionally ensuring that an epitaxial growth surface formed using a nonpolar plane as a principal plane or a surface revealed during epitaxial growth will not be exposed excessively to active, $H_2$ gas and optionally supplying active, $NH_3$ gas which can serve as a nitrogen source material and active, $H_2$ gas, if the ratio of the inactive gas to all the constituent gas types of the main flow used in the heating step and subsequent epitaxial growth steps of the first and second nitride semiconductor layers is set between 0.5 and 1.0 (both inclusive) in terms of flow ratio, it is possible to obtain m-plane nitride semiconductor layers with high crystallinity and ensure high crystallinity of the quantum well active layer structure (MQW layer) epitaxially grown thereon.

In addition, in the nonpolar, m-plane nitride semiconductor layers, where In is taken in differently compared to the c-plane which is a polar plane, the luminous efficiency from light-emitting layers (MQW layers) containing In as a constituent is high because the In composition in the growth plane tends to become uniform and structurally flat for reasons such as a long diffusion length of In on an epitaxial growth surface as well as because the QCSE effect is suppressed.

Figure 5A:
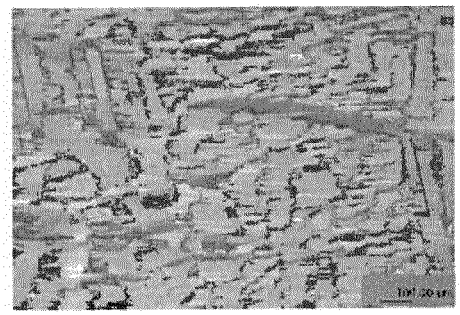
FIG. 5(A) is a diagram showing a differential interference microscopy image of sample A for illustrating estimated dependence on constituent gas types of a main flow during epitaxial growth of first and second nitride layers.
Figure 5B:
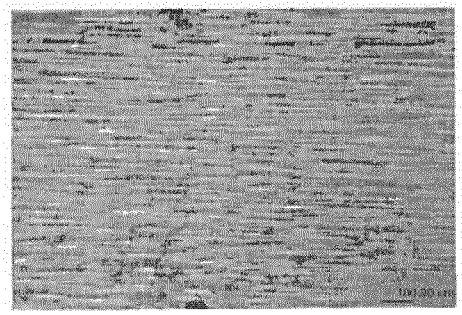
FIG. 5(B) is a diagram showing a differential interference microscopy image of sample B for illustrating estimated dependence on constituent gas types of a main flow during epitaxial growth of first and second nitride layers.
Figure 5C:
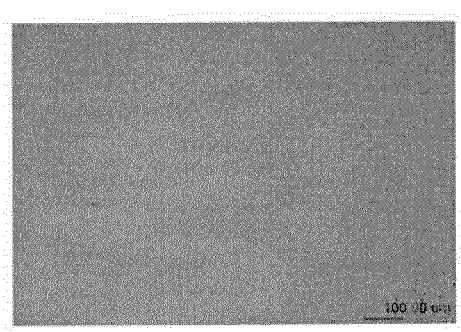
FIG. 5(C) is a diagram showing a differential interference microscopy image of sample C for illustrating estimated dependence on constituent gas types of a main flow during epitaxial growth of first and second nitride layers.

FIGS. 5(A) to 5(C) show differential interference microscopy images for illustrating results of studies concerning dependence on constituent gases of a main flow (see Table 1) during epitaxial growth (steps B and C) of first and second nitride layers. All the specimens are m-plane nitride semiconductor crystals grown on an m-plane freestanding GaN substrate.

The epitaxial growth of all the samples were carried out using $N_2$ for the main flow in the first heating step and using a gas mixture of $N_2$ and $NH_3$ (the flow ratio of the inactive gas component to all the constituent gases of the main flow: Fp=0.75) for the main flow in the second heating step.

Sample A (FIG. 5(A)) was obtained by supplying $NH_3$, $H_2$, and TMGa in the main flow in step B, and $NH_3$, $H_2$, TMGa, and $SiH_4$ in step C.

Sample B (FIG. 5(B)) was obtained by supplying $NH_3$, $N_2$, $H_2$, and TMGa in the main flow in step B, and $NH_3$, $N_2$, $H_2$, TMGa, and $SiH_4$ in step C.

Sample C (FIG. 5(C)) was obtained by supplying $NH_3$, $N_2$, and TMGa in the main flow in step B, and $NH_3$, $N_2$, $H_2$, TMGa, and $SiH_4$ in step C.

The flow ratio Fp of the inactive gas to all the constituent gases of the main flow in each step is shown in Table 1.

TABLE 1

| Specimen No. | A | B | C |
|---|---|---|---|
| Flow ratio of inactive gas to all constituent gases of main flow in step B | 0 | 0.24999 | 0.73747 |
| Flow ratio of inactive gas to all constituent gases of main flow in step C | 0 | 0.24997 | 0.7309 |

It can be seen from the results shown in FIGS. 5(A) to 5(C) that when the ratio of the inactive gas to the constituent gases of the main flow in the crystal growth step is small and especially if $H_2$ gas is contained excessively, surface flatness is decreased (FIGS. 5(A) and 5(B)). On the other hand, when the ratio of the inactive gas to the constituent gases of the main flow is high and $N_2$ is a major constituent of the main flow, introduction of defects into the nitride semiconductor layer is reduced, resulting in a flat surface (FIG. 5(C)).

According to studies conducted by the present inventors, if a Si source is intentionally supplied, for example, in the form of $SiH_4$ or $Si_2H_6$ during epitaxial growth of the first nitride semiconductor layer (step B), a lot of defects appear on the surface, resulting in noticeable deterioration of morphology. Also, if the reactor pressure is reduced excessively (to lower than 35 kilopascals) in step A and step B, the crystallinity of the first GaN layer is reduced in a microscopic sense, resulting in degradation of characteristics of the light-emitting layer. Furthermore, to obtain epitaxial layers with excellent optical characteristics and good morphology in step A (specifically, period $t_A$), step B, and step C, the ratio of the inactive gas to the constituent gases of the main flow needed to be 0.5 or above.

Furthermore, there is an appropriate range for the thickness of first GaN layer, and to obtain a nitride semiconductor film with excellent surface conditions and light emission characteristics, the first nitride semiconductor layer to be epitaxially grown without intentionally supplying Si in the form of $SiH_4$ or $Si_2H_6$ is preferably a relatively thin layer with a thickness in the range of 0.1 nm to 300 nm, more preferably in the range of 1.0 nm to 150 nm, and most preferably in the range of 5.0 nm to 50 nm.

The present inventors interpret these results as follows. If an intentionally Si-doped film is used for the first nitride semiconductor layer, products resulting from vapor phase reactions of $SiH_4$ or $Si_2H_6$ which are sources of Si supply attach to the surface of the base and to the surface of the first nitride semiconductor layer which has just started growing, and thereby prevent uniform growth within the surface. That is, in a microscopic sense, the first nitride semiconductor layer in the initial stage of growth starts local crystal growth in the surface. Once such non-uniform crystal growth within the surface is started, it is not possible to obtain a film with good surface morphology.

Thus, in the initial stage of epitaxial growth of a nitride semiconductor layer, it is important to thoroughly eliminate products which can cause non-uniform crystal growth within the surface. Once uniform crystal growth is started within the surface, surface morphology will not deteriorate noticeably even in the case of crystal growth of, for example, a Si-doped nitride semiconductor. This is why according to the present invention, the first nitride semiconductor layer is grown without intentional Si doping.

Of course, since vapor phase reactions of $SiH_4$ can easily be inhibited by reducing the pressure in the reactor, a specimen which uses a Si-doped film for the first nitride semiconductor layer can provide more or less good surface conditions, but excessively reduced pressure in the reactor induces nitrogen removal from the surface, thereby introducing defects and consequently reducing microscopic crystallinity. Thus, to reduce both introduction of defects into the first nitride semiconductor layer and impediments to growth caused by vapor phase reactions of the Si source, it is desirable not to excessively reduce the reactor pressure, but to keep the reactor pressure at 35 kilopascals or above and epitaxially grow the first nitride semiconductor layer without Si doping.

It was also confirmed that when a nitride semiconductor layer is newly grown on the first nitride semiconductor layer formed in the above manner, the surface morphology and optical characteristics of the newly formed nitride semiconductor layer are hardly deteriorated even if the pressure in the reactor is reduced or Si doping is used, to increase growth speed or for other purposes.

Thus, it is considered only necessary that the first nitride semiconductor layer according to the present invention does not contain elements which act as growth constraints. Consequently, there are various modes for forming a GaN layer without intentional Si doping. When not intentionally doped with Si, the first nitride semiconductor layer can be made of a III-V group nitride semiconductor (which hereinafter may be referred to collectively as a GaN-based semiconductor) such as InN, AlN, BN, GaInN, GaAlN, GaBN, InAlN, InBN, AlBN, GaInAlN, GaInBN, InAlBN, or GaInAlBN. Furthermore, there can also be a mode for epitaxially growing the first nitride semiconductor layer by supplying a possible dopant element other than Si—such as O, Mg, or Zn.

As shown in examples described later, it has been confirmed that if the first nitride semiconductor layer is not intentionally doped with Si even if intentionally doped with Mg or the like, when a nitride semiconductor layer is newly grown on the first nitride semiconductor layer, the surface morphology and optical characteristics of the entire epitaxial layer formed subsequently are hardly deteriorated. In particular, the present inventors have confirmed that when a GaN material is used, an Mg-doped layer rather than Si-doped or undoped layer has excellent heat resistance in relation to adherence to the ground.

An Mg-doped layer, even if doped with unintentionally mixed Si as well, can be used suitably as a first nitride semiconductor layer when heat resistance is required in relation to adherence to the surface of the base. Such a layer co-doped with Mg and Si is used, for example, in template fabrication or the like.

On the other hand, a first nitride semiconductor layer not intentionally doped with Si can suitably be used for light-emitting elements, electronic devices, and similar applications. In particular, the first nitride semiconductor layer can suitably be used for light-emitting elements and the like even if unintentionally doped with Si, when the concentration of the impurity can be kept between $3 \times 10^{17}$ $cm^{-3}$ and $1 \times 10^{21}$ $cm^{-3}$ both inclusive at peak in the case of Si.

Consequently, the present invention can achieve very flat morphology on the outermost surface of the epitaxial layer obtained by laminating the second nitride semiconductor layer onto the first nitride semiconductor layer or obtained by further forming a stacked structure thereon.

In particular, when the surface is measured with a contact-type surface roughness gage to determine average surface roughness or center line average roughness (Ra) which is an index of irregularity, preferably Ra of the outermost surface of the nitride semiconductor layer according to the present invention is 20.0 nm or below, more preferably 10.0 nm or below, still more preferably 8.0 nm or below, and most preferably 6.0 nm or below.

The value of Ra used herein is determined by linearly scanning the specimen surface with a stylus to obtain a roughness curve, turning around the roughness curve at a center line, and dividing the area defined by the turned roughness curve and the center line by the scan length.

A nitride semiconductor fabricated by the method according to the present invention have very flat morphology as described above, the nitride semiconductor including epitaxial layers made up of a first nitride semiconductor layer, second nitride semiconductor layer, and stacked structure formed in this order on a principal nitride plane of a base at least one principal plane of which is a nonpolar nitride, where the stacked structure includes an active layer. Consequently, when the active layer has a quantum well layer, the standard deviation in the thickness of the quantum well layer within the surface is normally 0.45 nm or below, preferably 0.4 nm or below, and more preferably 0.35 nm or below. Also, a coefficient of variation which represents dispersion of the thickness of the quantum well layer within the surface is normally 0.10 or below, and preferably 0.09 nm or below. There are grounds for the figures of the standard deviation in the thickness of the quantum well layer within the surface and the coefficient of variation which represents dispersion of the thickness within the surface. These grounds are supported empirically by a large amount of experimental data accumulated by the present inventors, which will be described in detail later in relation to examples.

Furthermore, major features of the nitride semiconductor fabricated by the method according to the present invention and including the epitaxial layers made up of the first nitride semiconductor layer, second nitride semiconductor layer, and stacked structure—including an active layer—formed in this order on the principal nitride plane of the base at least one principal plane of which is a nonpolar nitride are that when measured under specific conditions: (i) internal quantum efficiency is very much higher than conventionally known values, (ii) photoluminescent lifetime ($\tau(PL)$) is much longer than conventionally known values, (iii) radiative recombination lifetime ($\tau(R)$) is very much longer than conventionally known values, and (iv) the radiative recombination lifetime ($\tau(R)$) is shorter than non-radiative recombination lifetime. Moreover, these very excellent values were confirmed only when measured under low excitation density conditions prescribed by the present invention.

That is, with the nitride semiconductor according to the present invention (which includes the first nitride semiconductor layer, second nitride semiconductor layer, and stacked structure—including an active layer—formed on the principal nitride plane of the base at least one principal plane of which is a nonpolar nitride), the internal quantum efficiency determined by CW-PL measurements of the active layer under low excitation density conditions is 50% or above, and preferably 55% or above.

Also, with the nitride semiconductor according to the present invention, the internal quantum efficiency determined by pulsed optical PL measurements of the active layer under low excitation density conditions is 40% or above, preferably 50% or above, and more preferably 55% or above.

Also, with the nitride semiconductor according to the present invention, the photoluminescent lifetime ($\tau(PL)$) determined by time-resolved PL measurements of the active layer at room temperature under low excitation density conditions is 2 ns or above, preferably 2.3 ns or above, and more preferably 2.5 ns or above. There are grounds for these very excellent values. These grounds are supported empirically by a large amount of experimental data accumulated by the present inventors, which will be described in detail later in relation to examples and comparative examples. The present invention will be described more concretely below with reference to the examples and comparative examples.

EXAMPLE 1

In the present example, a stack of gallium nitride-based semiconductor thin films was grown by the MOCVD process and a near ultraviolet LED was fabricated. A series of crystal growth processes for that has already been outlined with reference to FIG. 2(A). Also, a layer structure after growth is schematically shown in FIG. 3(A).

The base used was a (1-100) m-plane oriented freestanding GaN substrate. The substrate measured 4.1 mm in the c-axis direction and 15 mm in the a-axis direction. Regarding electrical characteristics, the substrate was n-type and carrier density was $6.6 \times 10^{17}$ cm$^{-3}$. As a result of X-ray diffraction, the full-width at half maximum of a (10-12) reflection rocking curve was 34.2 arcsec., OFF angle in the c(+) direction was 0.25 degrees, and OFF angle in the A direction was 0.03 degrees. Also, the dislocation density was $5.0 \times 10^6$ cm$^{-2}$.

The m-plane freestanding GaN substrate was placed on a tray (susceptor) in a horizontal quartz reactor which normally operates under conditions of normal pressure. The pressure in the reactor was 100±2 kPa in all steps.

First, in the first heating step $t_B$, the base was heated by supplying $N_2$ as a main flow into the reactor at 10 L/min. When the temperature of the base reached 400° C., the second heating step $t_A$ was started. In the second heating step, $NH_3$ was supplied as a constituent gas of the first main flow at 7.5 L/min. and $N_2$ was supplied as a constituent gas of the second main flow at 12.5 L/min.

Subsequently, the substrate temperature was further raised to 1,000° C. by increasing $NH_3$ and $N_2$ to 10 L/min. and 30 L/min., respectively. Meanwhile, a subflow of $N_2$ gas was supplied at 20 L/min. and a non-growth-related flow of $N_2$ was supplied for purge and other purposes at 19 L/min. in total. In the second heating step, the flow ratio Fp of the inactive gas component to all the constituent gases of the main flow was 0.625 at the start of the second heating step, and 0.75 when the growth temperature was reached.

Next, in step B, $NH_3$ was supplied as a constituent gas of the first main flow at 10 L/min. As constituent gases of the second main flow, $N_2$ was supplied at 29.5 L/min. and $H_2$ was supplied at 0.5 L/min. Also, TMGa (at 0.0018 L/min. at a concentration of 100%) was supplied into the reactor using $H_2$ (0.5 L/min.) contained in the main flow, as a carrier gas. By supplying these main flow gases, an undoped GaN layer (first nitride semiconductor layer) was grown to a thickness of 40 nm.

Meanwhile, a gas mixture (20.5 L/min.) of $NH_3$ (0.5 L/min.) and $N_2$ (20 L/min.) was supplied as a subflow. Also, a non-growth-related flow of $N_2$ was supplied for purge and other purposes at 19 L/min. During the growth of the first nitride semiconductor layer, the flow ratio Fp of the inactive gas component to all the constituent gases of the main flow was 0.73747.

Next, in step C, $NH_3$ was supplied as a constituent gas of the first main flow at 10 L/min. As constituent gases of the second main flow, $N_2$ was supplied at 29.24 L/min. and $H_2$ was supplied at 0.76 L/min. Also, TMGa (at 0.0055 L/min. at a concentration of 100%) was supplied into the reactor using $H_2$ (0.5 L/min.) contained in the main flow, as a carrier gas, and $SiH_4$ (at $6 \times 10^{-7}$ L/min. at a concentration of 100%) was supplied into the reactor using $H_2$ (0.2 L/min.) contained in the main flow, as a carrier gas and using $H_2$ (0.06 L/min.) as a diluent gas.

By supplying these main flow gases, a Si-doped GaN layer (first nitride semiconductor layer) was grown to a thickness of 7 μm. Meanwhile, a gas mixture (25.5 L/min.) of $NH_3$ (0.5 L/min.) and $N_2$ (25 L/min.) was supplied as a subflow. Also, a non-growth-related flow of $N_2$ was supplied for purge and other purposes at 19 L/min. During the growth of the second nitride semiconductor layer, the flow ratio Fp of the inactive gas component to all the constituent gases of the main flow was 0.73090.

Next, the temperature of the base (substrate temperature) was set to 740° C. When the substrate temperature was stabilized sufficiently, a multi-quantum well active layer structure was formed by laminating a quantum well layer of $In_{0.07}Ga_{0.93}N$ (with a target thickness of 1.5 nm) and a GaN barrier layer (with a target thickness of 13 nm) alternately for eight cycles (step D). To grow the quantum well layers of $In_{0.07}Ga_{0.93}N$, $NH_3$ (10 L/min.) was used as a constituent gas of the first main flow. $N_2$ (20 L/min.), TMGa (0.000015 L/min.), and trimethylindium (TMIn: 0.00023 L/min.) were supplied as constituent gases of the second main flow, where $N_2$ contained in the main flow was used as a carrier gas at 0.5 L/min. each to supply the TMGa and TMIn.

To grow the GaN barrier layers, $NH_3$ (10 L/min.) was used as a constituent gas of the first main flow. $N_2$ (18.5 L/min.), $H_2$ (1.5 L/min.), and TMGa (0.000017 L/min.) were supplied as constituent gases of the second main flow, where $H_2$ (0.5 L/min.) contained in the main flow was used as a carrier gas to supply the TMGa.

In step D, a gas mixture of $NH_3$ (0.5 L/min.) and $N_2$ (25 L/min.) was supplied as a subflow at 25.5 L/min. Also, a non-growth-related flow of $N_2$ was supplied for purge and other purposes at 19 L/min. During the growth of the multi-quantum well active layer structure, the flow ratio Fp of the inactive gas component to all the constituent gases of the main flow was 0.66666 in the case of the InGaN well layers, and 0.61667 in the case of the GaN barrier layers.

Next, the substrate temperature was set to 1,000° C. and an Mg-doped $Al_{0.1}Ga_{0.9}N$ layer 50 nm thick was formed (step E). $NH_3$ (10 L/min.) was used as a constituent gas of the first main flow. $H_2$ (80 L/min.), trimethylaluminum (TMAl) (0.0001 L/min.), TMGa (0.0018 L/min.), and cyclopentadienyl magnesium ($Cp_2Mg$) ($4 \times 10^{-6}$ L/min.) were used as constituent gases of the second main flow, where $H_2$ contained in the main flow was used as a carrier gas at 0.5 L/min. each to supply the TMAl, TMGa, and $Cp_2Mg$.

An Mg-doped GaN layer 70 nm thick was epitaxially grown further on the Mg-doped $Al_{0.1}Ga_{0.9}N$ layer (step E). The GaN layer was grown by stopping the supply of TMAl and $H_2$ (50 L/min.) out of the main flow gases described above.

In step E, during the growth of the $Al_{0.1}Ga_{0.9}N$ layer, a gas mixture of $NH_3$ (0.5 L/min.) and $N_2$ (50 L/min.) was supplied as a subflow at 50.5 L/min. Also, a non-growth-related flow of $N_2$ (19 L/min) was supplied for purge and other purposes. During the growth of the Mg-doped $Al_{0.1}Ga_{0.9}N$ layer, the flow ratio Fp of the inactive gas component to all the constituent gases of the main flow was 0.

Also, in step E, during the growth of the Mg-doped GaN layer, a gas mixture of $NH_3$ (0.5 L/min.) and $N_2$ (20 L/min.) was supplied as a subflow at 20.5 L/min. Also, a non-growth-related flow of $N_2$ (19 L/min) was supplied for purge and other purposes. During the growth of the Mg-doped GaN layer, the flow ratio Fp of the inactive gas component to all the constituent gases of the main flow was 0.

When the growth steps were finished, the substrate temperature was lowered and the gases in the reactor were completely replaced with $N_2$. Then, the substrate was taken out and evaluated.

The surface of the substrate thus fabricated was extremely flat. The surface was measured with a contact-type surface roughness gage to determine average surface roughness or center line average roughness (Ra) which is an index of irregularity. As a result, Ra according to the present example was 4.9 nm. Also, when PL characteristics were measured under excitation by a laser beam with a wavelength of 325 nm, the peak wavelength was 391 nm, integrated intensity of the PL characteristics was as high as 96 in relative value, and standard deviation of wavelength distribution in the surface was as small as 0.8%.

EXAMPLE 2

In the present example, a stack of gallium nitride-based semiconductor thin films was grown by the MOCVD process and a near ultraviolet LED was fabricated. A series of crystal growth processes for that has already been outlined with reference to FIG. 2(A). Also, a layer structure after growth is schematically shown in FIG. 3(A).

The base used was a (1-100) m-plane oriented freestanding GaN substrate. The substrate measured 4.2 mm in the c-axis direction and 15 mm in the a-axis direction. Regarding electrical characteristics, the substrate was n-type and carrier density was $6.7 \times 10^{17}$ $cm^{-3}$. As a result of X-ray diffraction, the full-width at half maximum of a (10-12) reflection rocking curve was 32.8 arcsec., OFF angle in the c(+) direction was 0.29 degrees, and OFF angle in the a direction was 0.05 degrees. Also, the dislocation density was $5.4 \times 10^6$ $cm^{-2}$. The m-plane freestanding GaN substrate was placed on a tray (susceptor) in a horizontal quartz reactor which normally operates under conditions of normal pressure. The pressure in the reactor was 100±2 kPa in all steps.

First, in the first heating step $t_B$, the base was heated by supplying $N_2$ as a main flow into the reactor at 10 L/min. When the temperature of the base reached 400° C., the second heating step $t_A$ was started. In the second heating step, $NH_3$ was supplied as a constituent gas of the first main flow at 7.5 L/min. and $N_2$ was supplied as a constituent gas of the second main flow at 12.5 L/min.

Subsequently, the substrate temperature was further raised to 1,000° C. by increasing $NH_3$ and $N_2$ to 10 L/min. and 30 L/min., respectively. Meanwhile, a subflow of $N_2$ gas was supplied at 20 L/min. and a non-growth-related flow of $N_2$ was supplied for purge and other purposes at 19 L/min. in total. In the second heating step, the flow ratio Fp of the inactive gas component to all the constituent gases of the main flow was 0.625 at the start of the second heating step, and 0.75 when the growth temperature was reached.

Next, in step B, $NH_3$ was supplied as a constituent gas of the first main flow at 20 L/min. As constituent gases of the second main flow, $N_2$ was supplied at 29.5 L/min. and $H_2$ was supplied at 0.5 L/min. Also, TMGa (at 0.0018 L/min. at a concentration of 100%) was supplied into the reactor using $H_2$ (0.5 L/min.) contained in the main flow, as a carrier gas. By supplying these main flow gases, an undoped GaN layer (first nitride semiconductor layer) was grown to a thickness of 40 nm.

Meanwhile, a gas mixture (20.5 L/min.) of $NH_3$ (0.5 L/min.) and $N_2$ (20 L/min.) was supplied as a subflow. Also, a non-growth-related flow of $N_2$ was supplied for purge and other purposes at 19 L/min. During the growth of the first nitride semiconductor layer, the flow ratio Fp of the inactive gas component to all the constituent gases of the main flow was 0.58998.

Subsequent steps C, D, and E were carried out under the same conditions as those in Example 1.

When the growth steps were finished, the substrate temperature was lowered and the gases in the reactor were completely replaced with $N_2$. Then, the substrate was taken out and evaluated.

The surface of the substrate thus fabricated had good flatness although there were slight irregularities. The surface was measured with a contact-type surface roughness gage to determine center line average roughness (Ra). As a result, Ra according to the present example was 17.4 nm. Also, when PL characteristics were measured under excitation by a laser beam with a wavelength of 325 nm, the peak wavelength was 396 nm, integrated intensity of the PL characteristics was as high as 68 in relative value, and standard deviation of wavelength distribution in the surface was as small as 0.9%.

EXAMPLE 3

In the present example, a stack of gallium nitride-based semiconductor thin films was grown by the MOCVD process and a near ultraviolet LED was fabricated. A series of crystal growth processes for that has already been outlined with reference to FIG. 2(A). Also, a layer structure after growth is schematically shown in FIG. 3(A).

The base used was a (1-100) m-plane oriented freestanding GaN substrate. The substrate measured 4.0 mm in the c-axis direction and 15 mm in the a-axis direction. Regarding electrical characteristics, the substrate was n-type and carrier density was $6.4 \times 10^{17}$ cm$^{-3}$. As a result of X-ray diffraction, the full-width at half maximum of a (10-12) reflection rocking curve was 36.7 arcsec., OFF angle in the c(+) direction was 3.0 degrees, and OFF angle in the a direction was 0.3 degrees. Also, the dislocation density was $5.1 \times 10^6$ cm$^{-2}$. The m-plane freestanding GaN substrate was placed on a tray (susceptor) in a horizontal quartz reactor which normally operates under conditions of normal pressure. The pressure in the reactor was 100±2 kPa in all steps.

First, in the first heating step $t_B$, the base was heated by supplying $N_2$ as a main flow into the reactor at 10 L/min. When the temperature of the base reached 400° C., the second heating step $t_A$ was started. In the second heating step, $NH_3$ was supplied as a constituent gas of the first main flow at 7.5 L/min. and $N_2$ was supplied as a constituent gas of the second main flow at 10 L/min.

Subsequently, the substrate temperature was further raised to 1,000° C. by increasing both $NH_3$ and $N_2$ to 15 L/min. Meanwhile, a subflow of $N_2$ gas was supplied at 20 L/min. and a non-growth-related flow of $N_2$ was supplied for purge and other purposes at 19 L/min. in total. In the second heating step, the flow ratio Fp of the inactive gas component to all the constituent gases of the main flow was 0.57143 at the start of the second heating step, and 0.50 when the growth temperature was reached.

Next, in step B, $NH_3$ was supplied as a constituent gas of the first main flow at 10 L/min. As constituent gases of the second main flow, $N_2$ was supplied at 29.5 L/min. and $H_2$ was supplied at 0.5 L/min. Also, TMGa (0.0018 L/min. at a concentration of 100%) was supplied into the reactor using $H_2$ (0.5 L/min.) contained in the main flow, as a carrier gas. By supplying these main flow gases, an undoped GaN layer (first nitride semiconductor layer) was grown to a thickness of 120 nm.

Meanwhile, a gas mixture (20.5 L/min.) of $NH_3$ (0.5 L/min.) and $N_2$ (20 L/min.) was supplied as a subflow. Also, a non-growth-related flow of $N_2$ was supplied for purge and other purposes at 19 L/min. During the growth of the first nitride semiconductor layer, the flow ratio Fp of the inactive gas component to all the constituent gases of the main flow was 0.73747.

Next, in step C, $NH_3$ was supplied as a constituent gas of the first main flow at 10 L/min. As constituent gases of the second main flow, $N_2$ was supplied at 29.294 L/min. and $H_2$ was supplied at 0.706 L/min. Also, TMGa (at 0.0055 L/min. at a concentration of 100%) was supplied into the reactor using $H_2$ (0.5 L/min.) contained in the main flow, as a carrier gas, and $SiH_4$ (at $6 \times 10^{-8}$ L/min. at a concentration of 100%) was supplied into the reactor using $H_2$ (0.2 L/min.) contained in the main flow, as a carrier gas and using $H_2$ (0.006 L/min.) as a diluent gas. By supplying these main flow gases, a Si-doped GaN layer (first nitride semiconductor layer) was grown to a thickness of 1 μm.

Meanwhile, a gas mixture (25.5 L/min.) of $NH_3$ (0.5 L/min.) and $N_2$ (25 L/min.) was supplied as a subflow. Also, a non-growth-related flow of $N_2$ was supplied for purge and other purposes at 19 L/min. During the growth of the second nitride semiconductor layer, the flow ratio Fp of the inactive gas component to all the constituent gases of the main flow was 0.78579.

Next, the temperature of the base (substrate temperature) was set to 740° C. When the substrate temperature was stabilized sufficiently, a multi-quantum well active layer structure was formed by laminating a quantum well layer of $In_{0.07}Ga_{0.93}N$ (with a target thickness of 1.5 nm) and a GaN barrier layer (with a target thickness of 13 nm) alternately for eight cycles (step D). To grow the quantum well layers of $In_{0.07}Ga_{0.93}N$, $NH_3$ (10 L/min.) was used as a constituent gas of the first main flow. $N_2$ (20 L/min.), TMGa (0.000015 L/min.), and TMIn (0.00023 L/min.) were supplied as constituent gases of the second main flow, where $N_2$ contained in the main flow was used as a carrier gas at 0.5 L/min. each to supply the TMGa and TMIn.

To grow the GaN barrier layers, $NH_3$ (10 L/min.) was used as a constituent gas of the first main flow. $N_2$ (18.5 L/min.), $H_2$ (1.5 L/min.), and TMGa (0.000017 L/min.) were supplied as constituent gases of the second main flow, where $H_2$ (0.5 L/min.) contained in the main flow was used as a carrier gas to supply the TMGa.

In step D, a gas mixture of $NH_3$ (0.5 L/min.) and $N_2$ (25 L/min.) was supplied as a subflow at 25.5 L/min. Also, a non-growth-related flow of $N_2$ was supplied for purge and other purposes at 19 L/min. During the growth of the multi-quantum well active layer structure, the flow ratio Fp of the inactive gas component to all the constituent gases of the main flow was 0.66666 in the case of the InGaN well layers, and 0.61667 in the case of the GaN barrier layers.

Next, the substrate temperature was set to 1,000° C. and an Mg-doped $Al_{0.1}Ga_{0.9}N$ layer 50 nm thick was formed (step E). $NH_3$ (10 L/min.) was used as a constituent gas of the first main flow. $H_2$ (80 L/min.), TMAl (0.0001 L/min.), TMGa (0.0018 L/min.), and $Cp_2Mg$ ($4 \times 10^{-6}$ L/min.) were used as constituent gases of the second main flow, where $H_2$ contained in the main flow was used as a carrier gas at 0.5 L/min. each to supply the TMAl, TMGa, and $Cp_2Mg$.

An Mg-doped GaN layer 70 nm thick was epitaxially grown further on the Mg-doped $Al_{0.1}Ga_{0.9}N$ layer (step E). The GaN layer was grown by stopping the supply of TMAl and $H_2$ (50 L/min.) out of the main flow gases described above.

In step E, during the growth of the $Al_{0.1}Ga_{0.9}N$ layer, a gas mixture of $NH_3$ (0.5 L/min.) and $N_2$ (50 L/min.) was supplied as a subflow at 50.5 L/min. Also, a non-growth-related flow of $N_2$ (19 L/min) was supplied for purge and other purposes. During the growth of the Mg-doped $Al_{0.1}Ga_{0.9}N$ layer, the flow ratio Fp of the inactive gas component to all the constituent gases of the main flow was 0.

Also, in step E, during the growth of the Mg-doped GaN layer, a gas mixture of $NH_3$ (0.5 L/min.) and $N_2$ (20 L/min.) was supplied as a subflow at 20.5 L/min. Also, a non-growth-related flow of $N_2$ (19 L/min) was supplied for purge and other purposes. During the growth of the Mg-doped GaN layer, the flow ratio Fp of the inactive gas component to all the constituent gases of the main flow was 0. When the growth steps were finished, the substrate temperature was lowered and the gases in the reactor were completely replaced with $N_2$. Then, the substrate was taken out and evaluated.

The surface of the substrate thus fabricated had good flatness although there were very slight irregularities. The surface was measured with a contact-type surface roughness gage to determine center line average roughness (Ra). As a result, Ra according to the present example was 8.2 nm. Also, when PL characteristics were measured under excitation by a laser beam with a wavelength of 325 nm, the peak wavelength was 390 nm, integrated intensity of the PL characteristics was as high as 45 in relative value, and standard deviation of wavelength distribution in the surface was as small as 0.9%.

EXAMPLE 4

Figure 2B:
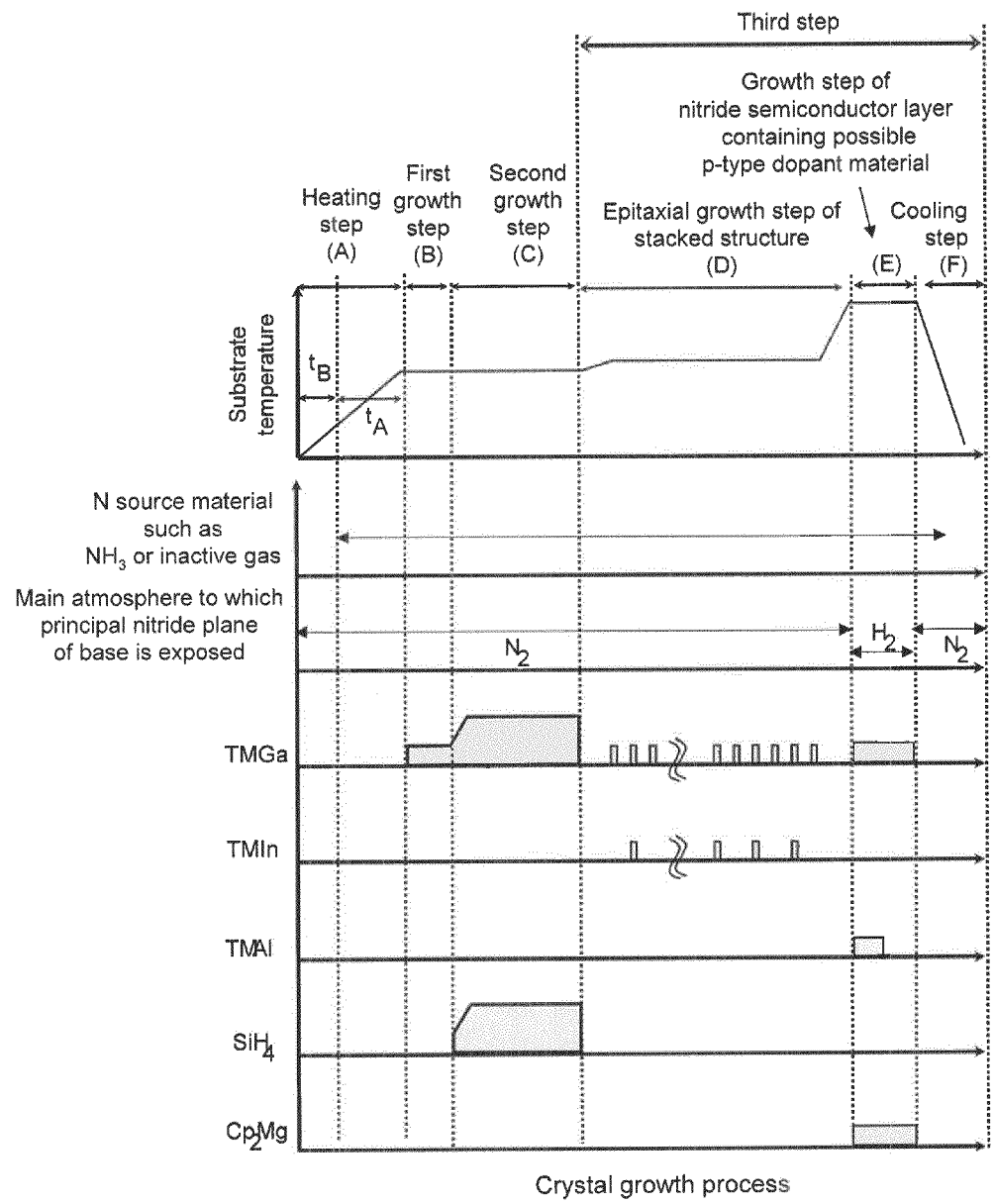
FIG. 2(B) is a diagram for illustrating an exemplary sequence of a nitride semiconductor crystal growth method according to Example 4.

In the present example, a stack of gallium nitride-based semiconductor thin films was grown by the MOCVD process and a near ultraviolet LED was fabricated. A series of crystal growth processes will be outlined with reference to FIG. 2(B). Also, a layer structure after growth is schematically shown in FIG. 3(A).

The base used was a (1-100) m-plane oriented freestanding GaN substrate. The substrate measured 3.8 mm in the c-axis direction and 15 mm in the a-axis direction. Regarding electrical characteristics, the substrate was n-type and carrier density was $6.9 \times 10^{17}$ cm$^{-3}$. As a result of X-ray diffraction, the full-width at half maximum of a (10-12) reflection rocking curve was 30.4 arcsec., OFF angle in the c(+) direction was −1.35 degrees, and OFF angle in the a direction was 1.01 degrees. Also, the dislocation density was $5.6 \times 10^6$ cm$^{-2}$.

The m-plane freestanding GaN substrate was placed on a tray (susceptor) in a horizontal quartz reactor which normally operates under conditions of normal pressure. The pressure in the reactor was 100±2 kPa in all steps.

First, in the first heating step $t_B$, the base was heated by supplying $N_2$ as a main flow into the reactor at 10 L/min. When the temperature of the base reached 400° C., the second heating step $t_A$ was started. In the second heating step, $NH_3$ was supplied as a constituent gas of the first main flow at 10 L/min. and $N_2$ was supplied as a constituent gas of the second main flow at 17.5 L/min.

Subsequently, the substrate temperature was further raised to 700° C. by increasing $NH_3$ and $N_2$ to 12.5 L/min. and 20 L/min., respectively. Meanwhile, a subflow of $N_2$ gas was supplied at 20 L/min. and a non-growth-related flow of $N_2$ was supplied for purge and other purposes at 19 L/min. in total. In the second heating step, the flow ratio Fp of the inactive gas component to all the constituent gases of the main flow was 0.50 at the start of the second heating step, and 0.58333 when the growth temperature was reached.

Next, in step B, $NH_3$ was supplied as a constituent gas of the first main flow at 10 L/min. As constituent gases of the second main flow, $N_2$ was supplied at 29.5 L/min. and $H_2$ was supplied at 0.5 L/min. Also, TMGa (at 0.0018 L/min. at a concentration of 100%) was supplied into the reactor using $H_2$ (0.5 L/min.) contained in the main flow, as a carrier gas. By supplying these main flow gases, an undoped GaN layer (first nitride semiconductor layer) was grown to a thickness of 1 nm.

Meanwhile, a gas mixture (20.5 L/min.) of $NH_3$ (0.5 L/min.) and $N_2$ (20 L/min.) was supplied as a subflow. Also, a non-growth-related flow of $N_2$ was supplied for purge and other purposes at 19 L/min. During the growth of the first nitride semiconductor layer, the flow ratio Fp of the inactive gas component to all the constituent gases of the main flow was 0.73747.

Next, in step C, $NH_3$ was supplied as a constituent gas of the first main flow at 10 L/min. As constituent gases of the second main flow, $N_2$ was supplied at 39.24 L/min. and $H_2$ was supplied at 0.82 L/min. Also, TMGa (at 0.0055 L/min. at a concentration of 100%) was supplied into the reactor using $H_2$ (0.5 L/min.) contained in the main flow, as a carrier gas, and $SiH_4$ (at $6 \times 10^{-8}$ L/min. at a concentration of 100%) was supplied into the reactor using $H_2$ (0.2 L/min.) contained in the main flow, as a carrier gas and using $H_2$ (0.006 L/min.) as a diluent gas. By supplying these main flow gases, a Si-doped GaN layer (first nitride semiconductor layer) was grown to a thickness of 0.5 μm.

Meanwhile, a gas mixture (25.5 L/min.) of $NH_3$ (0.5 L/min.) and $N_2$ (25 L/min.) was supplied as a subflow. Also, a non-growth-related flow of $N_2$ was supplied for purge and other purposes at 19 L/min. During the growth of the second nitride semiconductor layer, the flow ratio Fp of the inactive gas component to all the constituent gases of the main flow was 0.78377.

Next, the temperature of the base (substrate temperature) was set to 740° C. When the substrate temperature was stabilized sufficiently, a multi-quantum well active layer structure was formed by laminating a quantum well layer of $In_{0.11}Ga_{0.89}N$ (with a target thickness of 1.5 nm) and a GaN barrier layer (with a target thickness of 13 nm) alternately for eight cycles (step D).

To grow the quantum well layers of $In_{0.11}Ga_{0.89}N$, $NH_3$ (10 L/min.) was used as a constituent gas of the first main flow. $N_2$ (20 L/min.), TMGa (0.000015 L/min.), and TMIn (0.00023 L/min.) were supplied as constituent gases of the second main flow, where $N_2$ contained in the main flow was used as a carrier gas at 0.5 L/min. each to supply the TMGa and TMIn.

To grow the GaN barrier layers, $NH_3$ (10 L/min.) was used as a constituent gas of the first main flow. $N_2$ (18.5 L/min.), $H_2$ (1.5 L/min.), and TMGa (0.000017 L/min.) were supplied as constituent gases of the second main flow, where $H_2$ (0.5 L/min.) contained in the main flow was used as a carrier gas to supply the TMGa.

In step D, a gas mixture of $NH_3$ (0.5 L/min.) and $N_2$ (25 L/min.) was supplied as a subflow at 25.5 L/min. Also, a non-growth-related flow of $N_2$ was supplied for purge and other purposes at 19 L/min. During the growth of the multi-quantum well active layer structure, the flow ratio Fp of the inactive gas component to all the constituent gases of the main flow was 0.66666 in the case of the InGaN well layers, and 0.61667 in the case of the GaN barrier layers.

Next, the substrate temperature was set to 1,000° C. and an Mg-doped $Al_{0.1}Ga_{0.9}N$ layer 50 nm thick was formed (step E). $NH_3$ (10 L/min.) was used as a constituent gas of the first main flow. $H_2$ (80 L/min.), TMAl (0.0001 L/min.), TMGa (0.0018 L/min.), and $Cp_2Mg$ ($4 \times 10^{-6}$ L/min.) were used as constituent gases of the second main flow, where $H_2$ contained in the main flow was used as a carrier gas at 0.5 L/min. each to supply the TMAl, TMGa, and Cp$_2$Mg.

An Mg-doped GaN layer 70 nm thick was epitaxially grown further on the Mg-doped Al$_{0.1}$Ga$_{0.9}$N layer (step E). The GaN layer was grown by stopping the supply of TMAl and H$_2$ (50 L/min.) out of the main flow gases described above.

In step E, during the growth of the Al$_{0.1}$Ga$_{0.9}$N layer, a gas mixture of NH$_3$ (0.5 L/min.) and N$_2$ (50 L/min.) was supplied as a subflow at 50.5 L/min. Also, a non-growth-related flow of N$_2$ (19 L/min) was supplied for purge and other purposes. During the growth of the Mg-doped Al$_{0.1}$Ga$_{0.9}$N layer, the flow ratio Fp of the inactive gas component to all the constituent gases of the main flow was 0.

Also, in step E, during the growth of the Mg-doped GaN layer, a gas mixture of NH$_3$ (0.5 L/min.) and N$_2$ (20 L/min.) was supplied as a subflow at 20.5 L/min. Also, a non-growth-related flow of N$_2$ (19 L/min) was supplied for purge and other purposes. During the growth of the Mg-doped GaN layer, the flow ratio Fp of the inactive gas component to all the constituent gases of the main flow was 0.

When the growth steps were finished, the substrate temperature was lowered and the gases in the reactor were completely replaced with N$_2$. Then, the substrate was taken out and evaluated.

The surface of the substrate thus fabricated was extremely flat. The surface was measured with a contact-type surface roughness gage to determine center line average roughness (Ra). As a result, Ra according to the present example was 5.2 nm. Also, when PL characteristics were measured under excitation by a laser beam with a wavelength of 325 nm, the peak wavelength was 412 nm, integrated intensity of the PL characteristics was as high as 90 in relative value, and standard deviation of wavelength distribution in the surface was as small as 1.0%.

EXAMPLE 5

In the present example, a stack of gallium nitride-based semiconductor thin films was grown by the MOCVD process and a blue-color LED was fabricated. A series of crystal growth processes for that has already been outlined with reference to FIG. 2(A). Also, a layer structure after growth is schematically shown in FIG. 3(A).

The base used was a (1-100) m-plane oriented freestanding GaN substrate. The substrate measured 12 mm in the c-axis direction and 20 mm in the a-axis direction. Regarding electrical characteristics, the substrate was n-type and carrier density was 1.5×10$^{18}$ cm$^{-3}$. As a result of X-ray diffraction, the full-width at half maximum of a (10-12) reflection rocking curve was 48.1 arcsec., OFF angle in the c(+) direction was −0.85 degrees, and OFF angle in the a direction was 2.64 degrees. Also, the dislocation density was 4.0×10$^6$ cm$^{-2}$.

The m-plane freestanding GaN substrate was placed on a tray (susceptor) in a horizontal quartz reactor which normally operates under conditions of normal pressure. The pressure in the reactor was 100±2 kPa in all steps.

First, in the first heating step $t_B$, the base was heated by supplying N$_2$ as a main flow into the reactor at 10 L/min. When the temperature of the base reached 400° C., the second heating step $t_A$ was started. In the second heating step, NH$_3$ was supplied as a constituent gas of the first main flow at 7.5 L/min. and N$_2$ was supplied as a constituent gas of the second main flow at 10 L/min.

Subsequently, the substrate temperature was further raised to 1,000° C. by increasing NH$_3$ and N$_2$ to 10 L/min. and 17.5 L/min., respectively. Meanwhile, a subflow of N$_2$ gas was supplied at 20 L/min. and a non-growth-related flow of N$_2$ was supplied for purge and other purposes at 19 L/min. in total. In the second heating step, the flow ratio Fp of the inactive gas component to all the constituent gases of the main flow was 0.57143 at the start of the second heating step, and 0.63636 when the growth temperature was reached.

Next, in step B, NH$_3$ was supplied as a constituent gas of the first main flow at 10 L/min. As constituent gases of the second main flow, N$_2$ was supplied at 49.5 L/min. and H$_2$ was supplied at 0.5 L/min. Also, TMGa (0.0018 L/min. at a concentration of 100%) was supplied into the reactor using H$_2$ (0.5 L/min.) contained in the main flow, as a carrier gas. By supplying these main flow gases, an undoped GaN layer (first nitride semiconductor layer) was grown to a thickness of 15 nm. Meanwhile, a gas mixture (20.5 L/min.) of NH$_3$ (0.5 L/min.) and N$_2$ (20 L/min.) was supplied as a subflow. Also, a non-growth-related flow of N$_2$ was supplied for purge and other purposes at 19 L/min. During the growth of the first nitride semiconductor layer, the flow ratio Fp of the inactive gas component to all the constituent gases of the main flow was 0.82498.

Next, in step C, NH$_3$ was supplied as a constituent gas of the first main flow at 10 L/min. As constituent gases of the second main flow, N$_2$ was supplied at 49.24 L/min. and H$_2$ was supplied at 0.82 L/min. Also, TMGa (at 0.0055 L/min. at a concentration of 100%) was supplied into the reactor using H$_2$ (0.5 L/min.) contained in the main flow, as a carrier gas, and SiH$_4$ (at 6×10$^{-8}$ L/min. at a concentration of 100%) was supplied into the reactor using H$_2$ (0.2 L/min.) contained in the main flow, as a carrier gas and using H$_2$ (0.006 L/min.) as a diluent gas. By supplying these main flow gases, a Si-doped GaN layer (first nitride semiconductor layer) was grown to a thickness of 0.5 μm.

Meanwhile, a gas mixture (25.5 L/min.) of NH$_3$ (0.5 L/min.) and N$_2$ (25 L/min.) was supplied as a subflow. Also, a non-growth-related flow of N$_2$ was supplied for purge and other purposes at 19 L/min. During the growth of the second nitride semiconductor layer, the flow ratio Fp of the inactive gas component to all the constituent gases of the main flow was 0.81977.

Next, the temperature of the base (substrate temperature) was set to 700° C. When the substrate temperature was stabilized sufficiently, a multi-quantum well active layer structure was formed by laminating a quantum well layer of In$_{0.14}$Ga$_{0.86}$N (with a target thickness of 1.5 nm) and a GaN barrier layer (with a target thickness of 13 nm) alternately for eight cycles (step D). To grow the quantum well layers of In$_{0.14}$Ga$_{0.86}$N, NH$_3$ (10 L/min.) was used as a constituent gas of the first main flow. N$_2$ (20 L/min.), TMGa (0.000008 L/min.), and TMIn (0.00023 L/min.) were supplied as constituent gases of the second main flow, where N$_2$ contained in the main flow was used as a carrier gas at 0.5 L/min. each to supply the TMGa and TMIn.

To grow the GaN barrier layers, NH$_3$ (10 L/min.) was used as a constituent gas of the first main flow. N$_2$ (18.5 L/min.), H$_2$ (1.5 L/min.), and TMGa (0.000017 L/min.) were supplied as constituent gases of the second main flow, where H$_2$ (0.5 L/min.) contained in the main flow was used as a carrier gas to supply the TMGa.

In step D, a gas mixture of NH$_3$ (0.5 L/min.) and N$_2$ (25 L/min.) was supplied as a subflow at 25.5 L/min. Also, a non-growth-related flow of N$_2$ was supplied for purge and other purposes at 19 L/min. During the growth of the multi-quantum well active layer structure, the flow ratio Fp of the inactive gas component to all the constituent gases of the main flow was 0.66666 in the case of the InGaN well layers, and 0.61667 in the case of the GaN barrier layers.

Next, the substrate temperature was set to 1,000° C. and an Mg-doped $Al_{0.1}Ga_{0.9}N$ layer 50 nm thick was formed (step E). $NH_3$ (10 L/min.) was used as a constituent gas of the first main flow. $H_2$ (80 L/min.), TMAl (0.0001 L/min.), TMGa (0.0018 L/min.), and $Cp_2Mg$ ($4\times10^{-6}$ L/min.) were used as constituent gases of the second main flow, where $H_2$ contained in the main flow was used as a carrier gas at 0.5 L/min. each to supply the TMAl, TMGa, and $Cp_2Mg$.

An Mg-doped GaN layer 70 nm thick was epitaxially grown further on the Mg-doped $Al_{0.1}Ga_{0.9}N$ layer (step E). The GaN layer was grown by stopping the supply of TMAl and $H_2$ (50 L/min.) out of the main flow gases described above.

In step E, during the growth of the $Al_{0.1}Ga_{0.9}N$ layer, a gas mixture of $NH_3$ (0.5 L/min.) and $N_2$ (50 L/min.) was supplied as a subflow at 50.5 L/min. Also, a non-growth-related flow of $N_2$ (19 L/min) was supplied for purge and other purposes. During the growth of the Mg-doped $Al_{0.1}Ga_{0.9}N$ layer, the flow ratio Fp of the inactive gas component to all the constituent gases of the main flow was 0.

Also, in step E, during the growth of the Mg-doped GaN layer, a gas mixture of $NH_3$ (0.5 L/min.) and $N_2$ (20 L/min.) was supplied as a subflow at 20.5 L/min. Also, a non-growth-related flow of $N_2$ (19 L/min) was supplied for purge and other purposes. During the growth of the Mg-doped GaN layer, the flow ratio Fp of the inactive gas component to all the constituent gases of the main flow was 0.

When the growth steps were finished, the substrate temperature was lowered and the gases in the reactor were completely replaced with $N_2$. Then, the substrate was taken out and evaluated.

The surface of the substrate thus fabricated was extremely flat. The surface was measured with a contact-type surface roughness gage to determine center line average roughness (Ra). As a result, Ra according to the present example was 4.8 nm. Also, when PL characteristics were measured under excitation by a laser beam with a wavelength of 325 nm, the peak wavelength was 440 nm, integrated intensity of the PL characteristics was as high as 51 in relative value, and standard deviation of wavelength distribution in the surface was 1.1%.

EXAMPLE 6

Figure 2C:
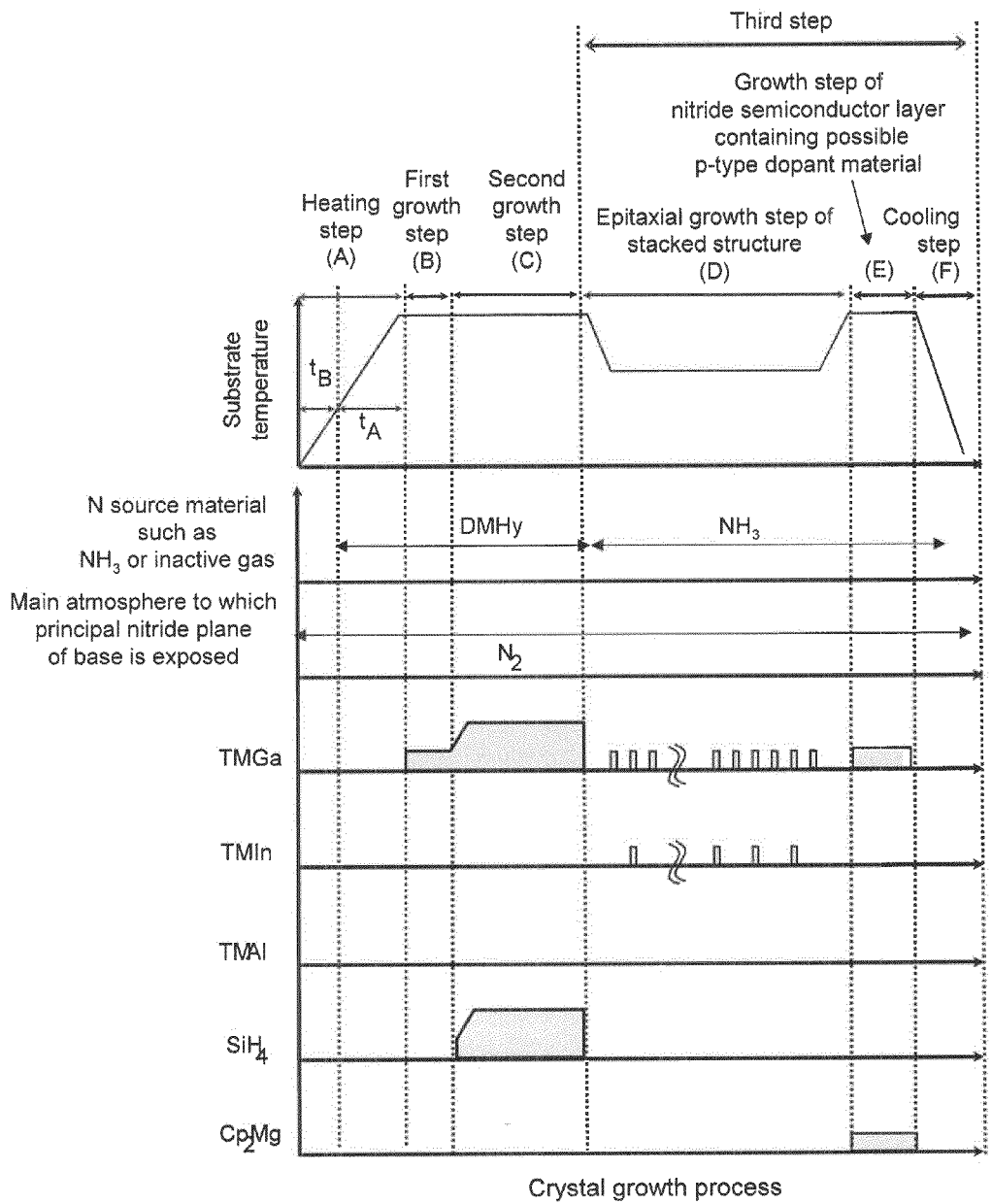
FIG. 2(C) is a diagram for illustrating an exemplary sequence of a nitride semiconductor crystal growth method according to Example 6.
Figure 3B:
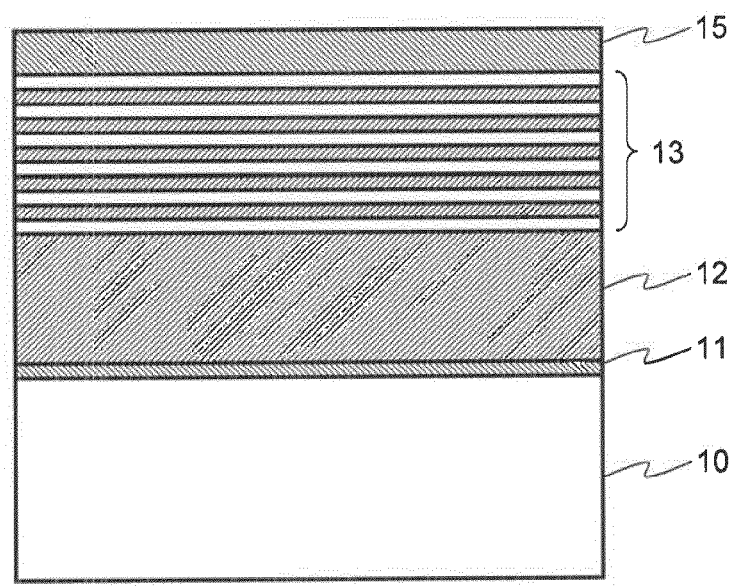
FIG. 3(B) is a simplified sectional view for illustrating an example of a nitride semiconductor according to Example 6.

In the present example, a stack of gallium nitride-based semiconductor thin films was grown by the MOCVD process and a near ultraviolet LED was fabricated. A series of crystal growth processes will be outlined with reference to FIG. 2(C). Also, a layer structure after growth is schematically shown in FIG. 3(B).

The base used was a (1-100) m-plane oriented freestanding GaN substrate. The substrate measured 10 mm in the c-axis direction and 15 mm in the a-axis direction. Regarding electrical characteristics, the substrate was n-type and carrier density was $6.7\times10^{17}$ $cm^{-3}$. As a result of X-ray diffraction, the full-width at half maximum of a (10-12) reflection rocking curve was 31.1 arcsec., OFF angle in the c(+) direction was 4.2 degrees, and OFF angle in the a direction was 0.02 degrees. Also, the dislocation density was $5.2\times10^6$ $cm^{-2}$.

The m-plane freestanding GaN substrate was placed on a susceptor in a vertical stainless steel reactor which normally operates under conditions of reduced pressure. No subflow piping was provided in the reactor.

First, in the first heating step $t_B$, with the reactor pressure set to 40 kPa, the base was heated by supplying $N_2$ as a main flow into the reactor at 20 L/min. When the temperature of the base reached 400° C., the second heating step $t_A$ was started. In the second heating step, 1,1-dimethyl hydrazine (1,1-DMHy) which is a inactive gas was supplied as a constituent gas of the first main flow at 0.003 L/min. using $N_2$ (0.5 L/min.) contained in the main flow, as a carrier gas, and $N_2$ was supplied as a constituent gas of the second main flow at 15 L/min.

Subsequently, the substrate temperature was further raised to 1,040° C. by increasing $N_2$ to 20 L/min. Meanwhile, a non-growth-related flow of $N_2$ was supplied for purge and other purposes at 6.375 L/min. in total. In the second heating step, the flow ratio Fp of the inactive gas component to all the constituent gases of the main flow was 1.0 from the start of the second heating step to the time when the growth temperature was reached.

Next, in step B, the reactor pressure was set to 40 kPa. As a constituent gas of the first main flow, 1,1-DMHy was supplied at 0.0229 L/min. using $N_2$ (0.5 L/min.) contained in the main flow, as a carrier gas. On the other hand, as constituent gases of the second main flow, $N_2$ (20 L/min.) and TMGa (at 0.0018 L/min. at a concentration of 100%) were supplied into the reactor, where $N_2$ (0.5 L/min.) contained in the main flow was used as a carrier gas to supply the TMGa. By supplying these main flow gases, an undoped GaN layer (first nitride semiconductor layer) was grown to a thickness of 40 nm. Meanwhile, a non-growth-related flow of $N_2$ was supplied for purge and other purposes at 6.375 L/min. During the growth of the first nitride semiconductor layer, the flow ratio Fp of the inactive gas component to all the constituent gases of the main flow was 0.99875.

Next, in step C, the reactor pressure was set to 8 kPa. As a constituent gas of the first main flow, 1,1-DMHy was supplied at 0.104 L/min. using $N_2$ (2.27 L/min.) contained in the main flow, as a carrier gas. On the other hand, as constituent gases of the second main flow, $N_2$ (20 L/min.), TMGa (at 0.0018 L/min. at a concentration of 100%), and $SiH_4$ (at $6\times10^{-8}$ L/min. at a concentration of 100%) were supplied into the reactor, where TMGa was supplied using $N_2$ (0.5 L/min.) contained in the main flow, as a carrier gas, and $SiH_4$ was supplied using $N_2$ (0.2 L/min.) contained in the main flow, as a diluent gas. By supplying these main flow gases, a Si-doped GaN layer (first nitride semiconductor layer) was grown to a thickness of 4 μm.

Meanwhile, a non-growth-related flow of $N_2$ was supplied for purge and other purposes at 6.375 L/min. During the growth of the second nitride semiconductor layer, the flow ratio Fp of the inactive gas component to all the constituent gases of the main flow was 0.99448.

Next, with the reactor pressure set to 67 kPa, a multi-quantum well active layer structure was formed by alternately laminating a quantum well layer of $In_{0.07}Ga_{0.93}N$ (with a target thickness of 1.5 nm) with the temperature of the base (substrate temperature) set at 740° C. and a GaN barrier layer (with a target thickness of 13 nm) with the temperature of the base set at 840° C. for five cycles (step D). To grow the quantum well layers of $In_{0.07}Ga_{0.93}N$, $NH_3$ (12 L/min.) was used as a constituent gas of the first main flow. $N_2$ (10 L/min.), TMGa (0.000008 L/min.), and TMIn (0.00023 L/min.) were supplied as constituent gases of the second main flow, where $N_2$ contained in the main flow was used as a carrier gas at 0.5 L/min. each to supply the TMGa and TMIn.

To grow the GaN barrier layers, $NH_3$ (12 L/min.) was used as a constituent gas of the first main flow. $N_2$ (9.5 L/min.), $H_2$ (0.5 L/min.), and TMGa (0.000017 L/min.) were supplied as constituent gases of the second main flow, where $H_2$ (0.5 L/min.) contained in the main flow was used as a carrier gas to supply the TMGa.

A non-growth-related flow of $N_2$ was supplied for purge and other purposes at 6.375 L/min. During the growth of the multi-quantum well active layer structure, the flow ratio Fp of the inactive gas component to all the constituent gases of the main flow was 0.45452 in the case of the InGaN well layers, and 0.43179 in the case of the GaN barrier layers.

Next, with the reactor pressure set to 36 kPa and the substrate temperature set to 1,000° C., an Mg-doped GaN layer was epitaxially grown to a thickness of 120 nm (step E). As a constituent gas of the first main flow, 1,1-DMHy was supplied at 0.0229 L/min. using $N_2$ (0.5 L/min.) contained in the main flow, as a carrier gas. On the other hand, as constituent gases of the second main flow, $N_2$ (14 L/min.), $H_2$ (1 L/min.), TMGa (0.0018 L/min.), and $Cp_2Mg$ ($4 \times 10^{-6}$ L/min.) were used, where $H_2$ contained in the main flow was used as a carrier gas at 0.5 L/min. each to supply the TMGa and $Cp_2Mg$.

During the growth of the Mg-doped GaN layer, in step E, a non-growth-related flow of $N_2$ (6.375 L/min.) was supplied for purge and other purposes. During the growth of the Mg-doped GaN layer, the flow ratio Fp of the inactive gas component to all the constituent gases of the main flow was 0.93180.

When the growth steps were finished, the substrate temperature was lowered and the gases in the reactor were completely replaced with $N_2$. Then, the substrate was taken out and evaluated.

The surface of the substrate thus fabricated had good flatness although there were very slight irregularities. The surface was measured with a contact-type surface roughness gage to determine center line average roughness (Ra). As a result, Ra according to the present example was 9.1 nm. Also, when PL characteristics were measured under excitation by a laser beam with a wavelength of 325 nm, the peak wavelength was 395 nm, integrated intensity of the PL characteristics was as high as 109 in relative value, and standard deviation of wavelength distribution in the surface was as small as 0.9%.

EXAMPLE 7

Figure 2D:
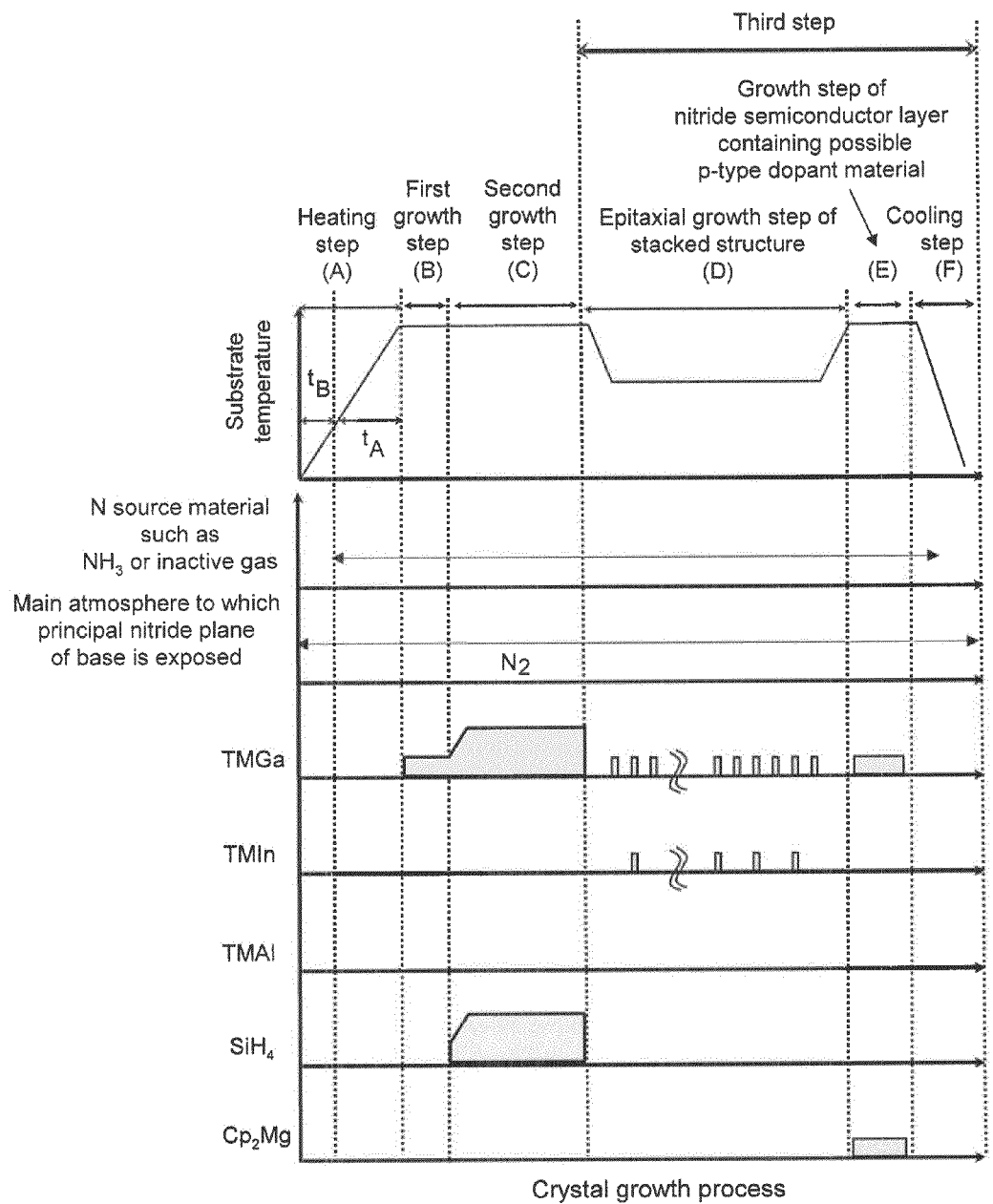
FIG. 2(D) is a diagram for illustrating an exemplary sequence of a nitride semiconductor crystal growth method according to Example 7.

In the present example, a stack of gallium nitride-based semiconductor thin films was grown by the MOCVD process and a near ultraviolet LED was fabricated. A series of crystal growth processes will be outlined with reference to FIG. 2(D). Also, a layer structure after growth is schematically shown in FIG. 3(B).

The base used is an m-plane template fabricated by growing an m-plane oriented GaN layer to 0.5 μm on a (1-100) m-plane ZnO substrate 2 inches in diameter.

The m-plane GaN template is placed on a susceptor in a stainless steel planetary reactor which normally operates under conditions of reduced pressure.

First, in the first heating step $t_B$, with the reactor pressure set to 40 kPa, the base is heated by supplying $N_2$ as a main flow into the reactor at 30 L/min. When the temperature of the base reaches 400° C., the second heating step $t_A$ can be started. In the second heating step, $NH_3$ is supplied as a constituent gas of the first main flow at 7.5 L/min., and $N_2$ and Ar are supplied as constituent gases of the second main flow at 27.5 L/min. and 10 L/min., respectively.

Subsequently, with the reactor pressure set at 40 kPa, the substrate temperature is further raised to 1,000° C. by increasing $NH_3$ and $N_2$ to 10 L/min. and 80 L/min., respectively. Meanwhile, a subflow of $N_2$ gas is supplied at 30 L/min. and a non-growth-related flow of $N_2$ is supplied for purge and other purposes at 21 L/min. in total. In the second heating step, the flow ratio Fp of the inactive gas component to all the constituent gases of the main flow is 0.83333 at the start of the second heating step, and 0.90 when the growth temperature is reached.

Next, in step B, with the reactor pressure set at 40 kPa, $NH_3$ is supplied as a constituent gas of the first main flow at 10 L/min. As constituent gases of the second main flow, $N_2$ is supplied at 50 L/min. and Ar is supplied at 10 L/min. Also, TMGa (0.0081 L/min. at a concentration of 100%) is supplied into the reactor using $N_2$ (0.5 L/min.) contained in the main flow, as a carrier gas. By supplying these main flow gases, an undoped GaN layer (first nitride semiconductor layer) is grown to a thickness of 10 nm.

Meanwhile, a gas mixture (35 L/min.) of $NH_3$ (1 L/min.) and $N_2$ (34 L/min.) is supplied as a subflow. Also, a non-growth-related flow of $N_2$ is supplied for purge and other purposes at 21 L/min. During the growth of the first nitride semiconductor layer, the flow ratio Fp of the inactive gas component to all the constituent gases of the main flow is 0.85704.

Next, in step C, with the reactor pressure set to 12 kPa, $NH_3$ is supplied as a constituent gas of the first main flow at 10 L/min. As constituent gases of the second main flow, $N_2$ is supplied at 70 L/min. and Ar is supplied at 10 L/min. Also, TMGa (at 0.026 L/min. at a concentration of 100%) is supplied into the reactor using $N_2$ (0.5 L/min.) contained in the main flow, as a carrier gas, and $SiH_4$ (at $1.8 \times 10^{-6}$ L/min. at a concentration of 100%) is supplied into the reactor using $N_2$ (0.2 L/min.) contained in the main flow, as a diluent gas. By supplying these main flow gases, a Si-doped GaN layer (first nitride semiconductor layer) can be grown to a thickness of 15 μm.

Meanwhile, a gas mixture (35 L/min.) of $NH_3$ (1 L/min.) and $N_2$ (34 L/min.) is supplied as a subflow. Also, a non-growth-related flow of $N_2$ is supplied for purge and other purposes at 21 L/min. During the growth of the second nitride semiconductor layer, the flow ratio Fp of the inactive gas component to all the constituent gases of the main flow is 0.88864.

Next, with the reactor pressure set to 40 kPa and the temperature of the base (substrate temperature) set to 740° C., a multi-quantum well active layer structure can be formed by alternately laminating a quantum well layer of $In_{0.08}Ga_{0.92}N$ (with a target thickness of 1.5 nm) and a GaN barrier layer (with a target thickness of 13 nm) for five cycles (step D). To grow the quantum well layers of $In_{0.08}Ga_{0.92}N$, $NH_3$ (10 L/min.) is used as a constituent gas of the first main flow. $N_2$ (60 L/min.), TMGa (0.00013 L/min.), and TMIn (0.00023 L/min.) are supplied as constituent gases of the second main flow, where $N_2$ contained in the main flow is used as a carrier gas at 0.5 L/min. each to supply the TMGa and TMIn.

To grow the GaN barrier layers, $NH_3$ (10 L/min.) is used as a constituent gas of the first main flow. $N_2$ (60 L/min.) and TMGa (0.0075 L/min.) are supplied as constituent gases of the second main flow, where $N_2$ (0.5 L/min.) contained in the main flow is used as a carrier gas to supply the TMGa.

In step D, a gas mixture of $NH_3$ (1 L/min.) and $N_2$ (34 L/min.) is supplied as a subflow at 35 L/min. Also, a non-growth-related flow of $N_2$ is supplied for purge and other purposes at 21 L/min. During the growth of the multi-quantum well active layer structure, the flow ratio Fp of the inactive gas component to all the constituent gases of the main flow is 0.85713 in the case of both InGaN well layers and GaN barrier layers.

Next, with the reactor pressure set at 40 kPa and the substrate temperature set to 1,000° C., an Mg-doped GaN layer can be formed to a thickness of 120 nm (step E). In so doing, $NH_3$ (10 L/min.) is supplied as a constituent gas of the first main flow. Besides, as constituent gases of the second main flow, $N_2$ (60 L/min.), TMGa (0.0018 L/min.), and $Cp_2Mg$ ($6 \times 10^{-5}$ L/min.) are used, where $N_2$ contained in the main flow is used as a carrier gas at 0.5 L/min. each to supply the TMGa and $Cp_2Mg$.

In step E, a gas mixture of $NH_3$ (1 L/min.) and $N_2$ (34 L/min.) is supplied as a subflow at 35 L/min. Also, a non-growth-related flow of $N_2$ is supplied for purge and other purposes at 21 L/min. During the growth of the Mg-doped GaN layer, the flow ratio Fp of the inactive gas component to all the constituent gases of the main flow is 0.85704.

In this way, a near ultraviolet LED can be fabricated on an M-plane GaN template (base) of a ZnO substrate.

COMPARATIVE EXAMPLE 1

Figure 2E:
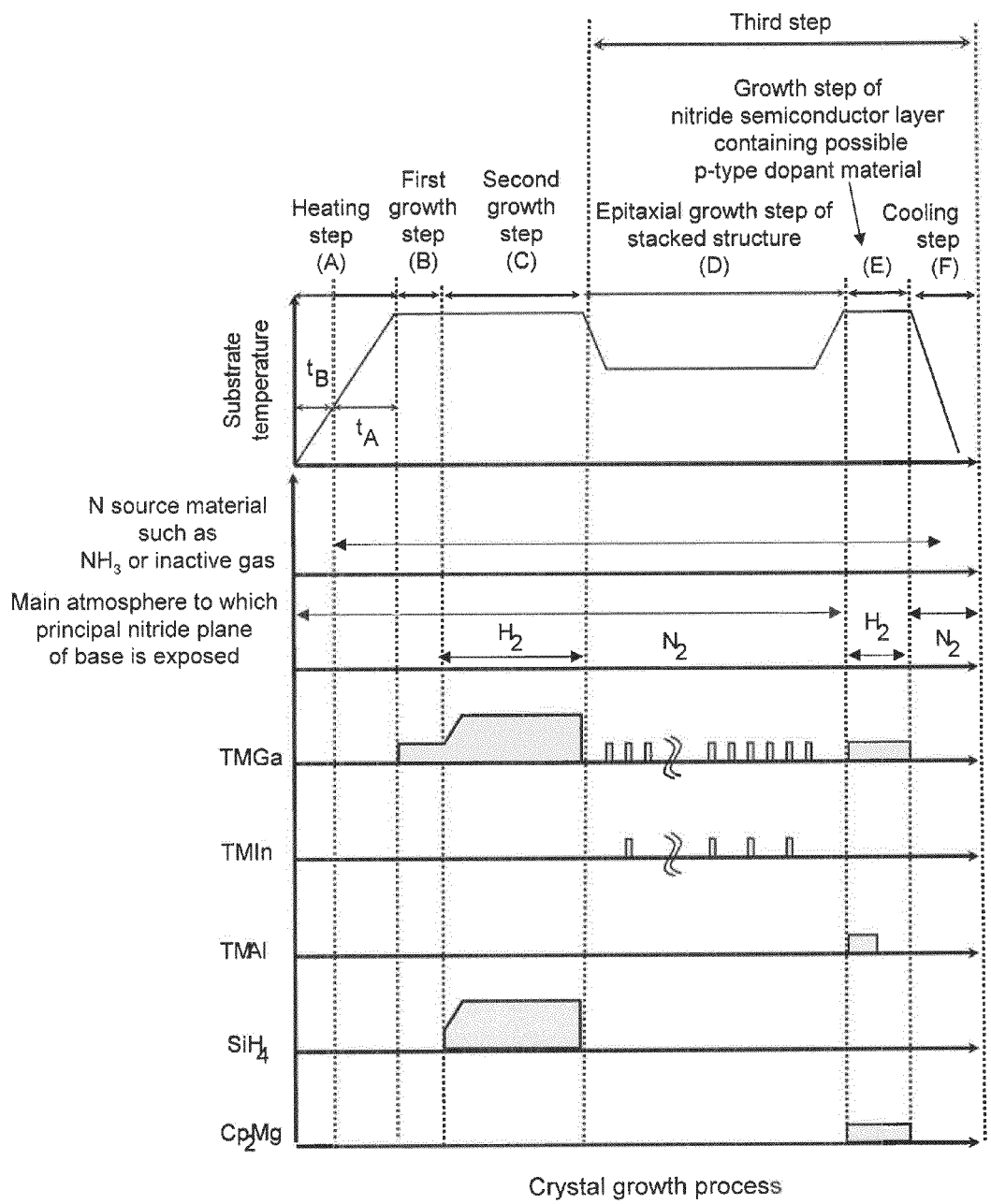
FIG. 2(E) is a diagram for illustrating an exemplary sequence of a nitride semiconductor crystal growth method according to Comparative Example 1.

In the present comparative example, a stack of gallium nitride-based semiconductor thin films was grown by the MOCVD process and a near ultraviolet LED was fabricated. A series of crystal growth processes will be outlined with reference to FIG. 2(E). Also, a layer structure after growth is schematically shown in FIG. 3(A).

The base used was a (1-100) m-plane oriented freestanding GaN substrate. The substrate measured 3.5 mm in the c-axis direction and 15 mm in the a-axis direction. Regarding electrical characteristics, the substrate was n-type and carrier density was $7.5 \times 10^{17}$ cm$^{-3}$. As a result of X-ray diffraction, the full-width at half maximum of a (10-12) reflection rocking curve was 29.8 arcsec., OFF angle in the c(+) direction was 0.5 degrees, and OFF angle in the a direction was 0.02 degrees. Also, the dislocation density was $5.1 \times 10^6$ cm$^{-2}$.

The m-plane freestanding GaN substrate was placed on a tray (susceptor) in a horizontal quartz reactor which normally operates under conditions of normal pressure. The pressure in the reactor was 100±2 kPa in all steps.

First, in the first heating step $t_B$, the base was heated by supplying $N_2$ as a main flow into the reactor at 10 L/min. When the temperature of the base reached 400° C., the second heating step $t_A$ was started. In the second heating step, $NH_3$ was supplied as a constituent gas of the first main flow at 7.5 L/min., and $N_2$ and $H_2$ were supplied as constituent gases of the second main flow at 7.5 L/min and 5 L/min, respectively.

Subsequently, the substrate temperature was further raised to 1,000° C. by increasing both $NH_3$ and $N_2$ to 15 L/min. Meanwhile, a subflow of $N_2$ was supplied at 20 L/min. and a non-growth-related flow of $N_2$ was supplied for purge and other purposes at 19 L/min. in total. In the second heating step, the flow ratio Fp of the inactive gas component to all the constituent gases of the main flow was 0.375 at the start of the second heating step, and 0.42857 when the growth temperature was reached.

Next, in step B, $NH_3$ was supplied as a constituent gas of the first main flow at 10 L/min. As constituent gases of the second main flow, $N_2$ was supplied at 29.5 L/min. and $H_2$ was supplied at 0.5 L/min. Also, TMGa (0.0018 L/min. at a concentration of 100%) was supplied into the reactor using $H_2$ (0.5 L/min.) contained in the main flow, as a carrier gas. By supplying these main flow gases, an undoped GaN layer (first nitride semiconductor layer) was grown to a thickness of 40 nm.

Meanwhile, a gas mixture (20.5 L/min.) of $NH_3$ (0.5 L/min.) and $N_2$ (20 L/min.) was supplied as a subflow. Also, a non-growth-related flow of $N_2$ was supplied for purge and other purposes at 19 L/min. During the growth of the first nitride semiconductor layer, the flow ratio Fp of the inactive gas component to all the constituent gases of the main flow was 0.73747.

Next, in step C, $NH_3$ was supplied as a constituent gas of the first main flow at 10 L/min. As constituent gases of the second main flow, $N_2$ was supplied at 39.24 L/min. and $H_2$ was supplied at 0.76 L/min. Also, TMGa (at 0.0055 L/min. at a concentration of 100%) was supplied into the reactor using $H_2$ (0.5 L/min.) contained in the main flow, as a carrier gas, and $SiH_4$ (at $6 \times 10^{-7}$ L/min. at a concentration of 100%) was supplied into the reactor using $H_2$ (0.2 L/min.) contained in the main flow, as a carrier gas and using $H_2$ (0.06 L/min.) as a diluent gas. By supplying these main flow gases, a Si-doped GaN layer (first nitride semiconductor layer) was grown to a thickness of 7 μm.

Meanwhile, a gas mixture (25.5 L/min.) of $NH_3$ (0.5 L/min.) and $N_2$ (25 L/min.) was supplied as a subflow. Also, a non-growth-related flow of $N_2$ was supplied for purge and other purposes at 19 L/min. During the growth of the second nitride semiconductor layer, the flow ratio Fp of the inactive gas component to all the constituent gases of the main flow was 0.78471.

Next, the temperature of the base (substrate temperature) was set to 740° C. When the substrate temperature was stabilized sufficiently, a multi-quantum well active layer structure was formed by laminating a quantum well layer of $In_{0.07}Ga_{0.93}N$ (with a target thickness of 1.5 nm) and a GaN barrier layer (with a target thickness of 13 nm) alternately for eight cycles (step D). To grow the quantum well layers of $In_{0.07}Ga_{0.93}N$, $NH_3$ (10 L/min.) was used as a constituent gas of the first main flow. $N_2$ (20 L/min.), TMGa (0.000015 L/min.), and TMIn (0.00023 L/min.) were supplied as constituent gases of the second main flow, where $N_2$ contained in the main flow was used as a carrier gas at 0.5 L/min. each to supply the TMGa and TMIn.

To grow the GaN barrier layers, $NH_3$ (10 L/min.) was used as a constituent gas of the first main flow. $N_2$ (18.5 L/min.), $H_2$ (1.5 L/min.), and TMGa (0.000017 L/min.) were supplied as constituent gases of the second main flow, where $H_2$ (0.5 L/min.) contained in the main flow was used as a carrier gas to supply the TMGa.

In step D, a gas mixture of $NH_3$ (0.5 L/min.) and $N_2$ (25 L/min.) was supplied as a subflow at 25.5 L/min. Also, a non-growth-related flow of $N_2$ was supplied for purge and other purposes at 19 L/min. During the growth of the multi-quantum well active layer structure, the flow ratio Fp of the inactive gas component to all the constituent gases of the main flow was 0.66666 in the case of the InGaN well layers, and 0.61667 in the case of the GaN barrier layers.

Next, the substrate temperature was set to 1,000° C. and an Mg-doped $Al_{0.1}Ga_{0.9}N$ layer 50 nm thick was formed (step E). $NH_3$ (10 L/min.) was used as a constituent gas of the first main flow. $H_2$ (80 L/min.), TMAl (0.0001 L/min.), TMGa (0.0018 L/min.), and $Cp_2Mg$ ($4 \times 10^{-6}$ L/min.) were used as constituent gases of the second main flow, where $H_2$ contained in the main flow was used as a carrier gas at 0.5 L/min. each to supply the TMAl, TMGa, and $Cp_2Mg$.

An Mg-doped GaN layer 70 nm thick was epitaxially grown further on the Mg-doped $Al_{0.1}Ga_{0.9}N$ layer (step E). The GaN layer was grown by stopping the supply of TMAl and $H_2$ (50 L/min.) out of the main flow gases described above.

In step E, during the growth of the $Al_{0.1}Ga_{0.9}N$ layer, a gas mixture of $NH_3$ (0.5 L/min.) and $N_2$ (50 L/min.) was supplied as a subflow at 50.5 L/min. Also, a non-growth-related flow of $N_2$ (19 L/min) was supplied for purge and other purposes. During the growth of the Mg-doped $Al_{0.1}Ga_{0.9}N$ layer, the flow ratio Fp of the inactive gas component to all the constituent gases of the main flow was 0.

Also, in step E, during the growth of the Mg-doped GaN layer, a gas mixture of $NH_3$ (0.5 L/min.) and $N_2$ (20 L/min.) was supplied as a subflow at 20.5 L/min. Also, a non-growthrelated flow of N$_2$ (19 L/min.) was supplied for purge and other purposes. During the growth of the Mg-doped GaN layer, the flow ratio Fp of the inactive gas component to all the constituent gases of the main flow was 0.

When the growth steps were finished, the substrate temperature was lowered and the gases in the reactor were completely replaced with N$_2$. Then, the substrate was taken out and evaluated.

The surface of the substrate thus fabricated was extremely flat. The surface was measured with a contact-type surface roughness gage to determine center line average roughness (Ra). As a result, Ra according to the present comparative example was 5.4 nm. However, when PL characteristics were measured under excitation by a laser beam with a wavelength of 325 nm, the peak wavelength was 391 nm and integrated intensity of the PL characteristics was 2 in relative value, which was extremely low, meaning poor optical characteristics. Incidentally, the standard deviation of wavelength distribution in the surface was 0.8%.

COMPARATIVE EXAMPLE 2

In the present comparative example, a stack of gallium nitride-based semiconductor thin films was grown by the MOCVD process and a near ultraviolet LED was fabricated. A series of crystal growth processes will be outlined with reference to FIG. 2(E). Also, a layer structure after growth is schematically shown in FIG. 3(A).

The base used was a (1-100) m-plane oriented freestanding GaN substrate. The substrate measured 3.6 mm in the c-axis direction and 15 mm in the a-axis direction. Regarding electrical characteristics, the substrate was n-type and carrier density was $7.1 \times 10^{17}$ cm$^{-3}$. As a result of X-ray diffraction, the full-width at half maximum of a (10-12) reflection rocking curve was 32.1 arcsec., OFF angle in the c(+) direction was −1.2 degrees, and OFF angle in the a direction was 0.03 degrees. Also, the dislocation density was $5.3 \times 10^6$ cm$^{-2}$.

The m-plane freestanding GaN substrate was placed on a tray (susceptor) in a horizontal quartz reactor which normally operates under conditions of normal pressure. The pressure in the reactor was 100±2 kPa in all steps.

First, in the first heating step t$_B$, the base was heated by supplying N$_2$ as a main flow into the reactor at 10 L/min. When the temperature of the base reached 400° C., the second heating step t$_A$ was started. In the second heating step, NH$_3$ was supplied as a constituent gas of the first main flow at 7.5 L/min. and N$_2$ was supplied as a constituent gas of the second main flow at 12.5 L/min.

Subsequently, the substrate temperature was further raised to 1,000° C. by increasing NH$_3$ and N$_2$ to 10 L/min. and 30 L/min., respectively. Meanwhile, a subflow of N$_2$ gas was supplied at 20 L/min. and a non-growth-related flow of N$_2$ was supplied for purge and other purposes at 19 L/min. in total. In the second heating step, the flow ratio Fp of the inactive gas component to all the constituent gases of the main flow was 0.625 at the start of the second heating step, and 0.75 when the growth temperature was reached.

Next, in step B, NH$_3$ was supplied as a constituent gas of the first main flow at 10 L/min. As constituent gases of the second main flow, N$_2$ was supplied at 15 L/min. and H$_2$ was supplied at 15 L/min. Also, TMGa (at 0.0018 L/min. at a concentration of 100%) was supplied into the reactor using H$_2$ (0.5 L/min.) contained in the main flow, as a carrier gas. By supplying these main flow gases, an undoped GaN layer (first nitride semiconductor layer) was grown to a thickness of 10 nm.

Meanwhile, a gas mixture (20.5 L/min.) of NH$_3$ (0.5 L/min.) and N$_2$ (20 L/min.) was supplied as a subflow. Also, a non-growth-related flow of N$_2$ was supplied for purge and other purposes at 19 L/min. During the growth of the first nitride semiconductor layer, the flow ratio Fp of the inactive gas component to all the constituent gases of the main flow was 0.37498.

Next, in step C, NH$_3$ was supplied as a constituent gas of the first main flow at 10 L/min. As constituent gases of the second main flow, N$_2$ and H$_2$ were supplied at 20 L/min. each. Also, TMGa (at 0.0055 L/min. at a concentration of 100%) was supplied into the reactor using H$_2$ (0.5 L/min.) contained in the main flow, as a carrier gas, and SiH$_4$ (at $6 \times 10^{-7}$ L/min. at a concentration of 100%) was supplied into the reactor using H$_2$ (0.2 L/min.) contained in the main flow, as a carrier gas and using H$_2$ (0.06 L/min.) as a diluent gas. By supplying these main flow gases, a Si-doped GaN layer (first nitride semiconductor layer) was grown to a thickness of 2 μm.

Meanwhile, a gas mixture (25.5 L/min.) of NH$_3$ (0.5 L/min.) and N$_2$ (25 L/min.) was supplied as a subflow. Also, a non-growth-related flow of N$_2$ was supplied for purge and other purposes at 19 L/min. During the growth of the second nitride semiconductor layer, the flow ratio Fp of the inactive gas component to all the constituent gases of the main flow was 0.39996.

Subsequent steps D and E were carried out under exactly the same conditions as those in Example 1.

When the growth steps were finished, the substrate temperature was lowered and the gases in the reactor were completely replaced with N$_2$. Then, the substrate was taken out and evaluated.

The substrate thus fabricated had poor surface conditions with severe irregularities. The surface was measured with a contact-type surface roughness gage to determine center line average roughness (Ra). As a result, Ra according to the present comparative example was 159 nm. Also, when PL characteristics were measured under excitation by a laser beam with a wavelength of 325 nm, the peak wavelength was 425 nm and integrated intensity of the PL characteristics was 1 in relative value, which was extremely low, meaning poor optical characteristics. The standard deviation of wavelength distribution in the surface was 2.5%.

COMPARATIVE EXAMPLE 3

In the present comparative example, a stack of gallium nitride-based semiconductor thin films was grown by the MOCVD process and a near ultraviolet LED was fabricated. A series of crystal growth processes for that has already been outlined with reference to FIG. 2(A). Also, a layer structure after growth is schematically shown in FIG. 3(A).

The base used was a (1-100) m-plane oriented freestanding GaN substrate. The substrate measured 10 mm in the c-axis direction and 15 mm in the a-axis direction. Regarding electrical characteristics, the substrate was n-type and carrier density was $7.5 \times 10^{17}$ cm$^{-3}$. As a result of X-ray diffraction, the full-width at half maximum of a (10-12) reflection rocking curve was 31.6 arcsec., OFF angle in the c(+) direction was −9.8 degrees, and OFF angle in the a direction was 0.31 degrees. Also, the dislocation density was $5.3 \times 10^6$ cm$^{-2}$.

The M-plane freestanding GaN substrate was placed on a tray (susceptor) in a horizontal quartz reactor which normally operates under conditions of normal pressure. The pressure in the reactor was 100±2 kPa in all steps. The growth conditions used were exactly the same as in Example 1.

The substrate thus fabricated had poor surface conditions with severe irregularities. The surface was measured with a contact-type surface roughness gage to determine center line average roughness (Ra). As a result, Ra according to the present comparative example was 71 nm. Also, when PL characteristics were measured under excitation by a laser beam with a wavelength of 325 nm, the peak wavelength was 420 nm and integrated intensity of the PL characteristics was 1 in relative value, which was extremely low, meaning poor optical characteristics. The standard deviation of wavelength distribution in the surface was 2.2%.

COMPARATIVE EXAMPLE 4

Figure 2F:
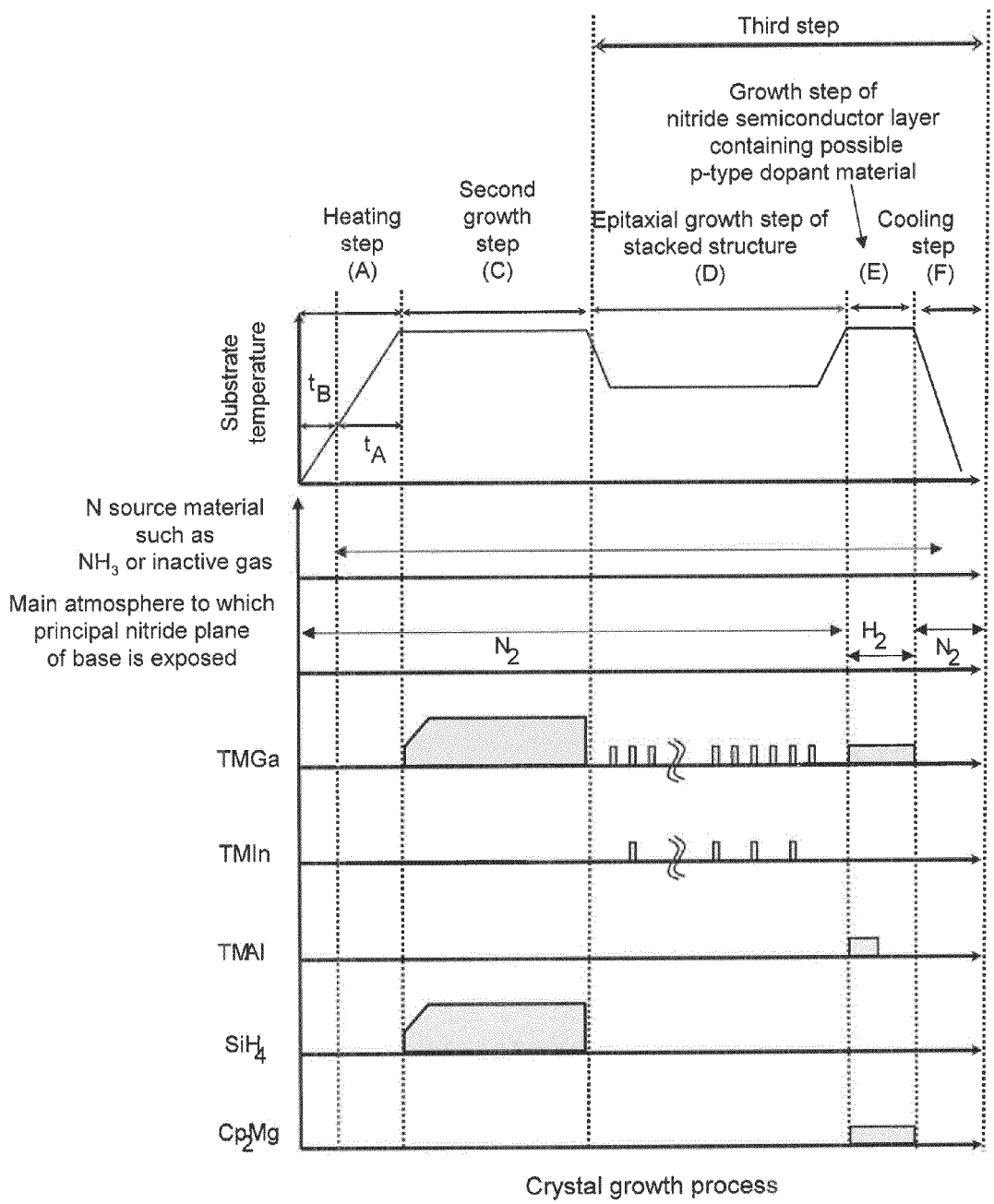
FIG. 2(F) is a diagram for illustrating an exemplary sequence of a nitride semiconductor crystal growth method according to Comparative Example 4.
Figure 3C:
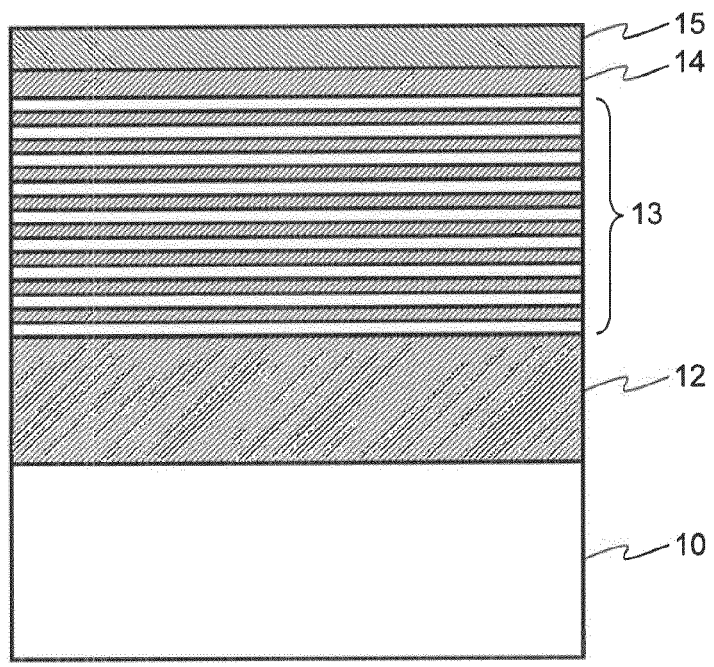
FIG. 3(C) is a simplified sectional view for illustrating an example of a nitride semiconductor according to Comparative Example 4.

In the present comparative example, a stack of gallium nitride-based semiconductor thin films was grown by the MOCVD process and a near ultraviolet LED was fabricated. A series of crystal growth processes for that has already been outlined with reference to FIG. 2(F). Also, a layer structure after growth is schematically shown in FIG. 3(C).

The base used was a (1-100) m-plane oriented freestanding GaN substrate. The substrate measured 10 mm in the c-axis direction and 15 mm in the a-axis direction. Regarding electrical characteristics, the substrate was n-type and carrier density was $7.4 \times 10^{17}$ cm$^{-3}$. As a result of X-ray diffraction, the full-width at half maximum of a (10-12) reflection rocking curve was 35.3 arcsec., OFF angle in the c(+) direction was 0.96 degrees, and OFF angle in the a direction was 0.02 degrees. Also, the dislocation density was $5.5 \times 10^6$ cm$^{-2}$.

The m-plane freestanding GaN substrate was placed on a tray (susceptor) in a horizontal quartz reactor which normally operates under conditions of normal pressure. The pressure in the reactor was 100±2 kPa in all steps.

In the first heating step $t_B$, the base was heated by supplying N$_2$ as a main flow into the reactor at 10 L/min. When the temperature of the base reached 400° C., the second heating step $t_A$ was started. In the second heating step, NH$_3$ was supplied as a constituent gas of the first main flow at 7.5 L/min. and N$_2$ was supplied as a constituent gas of the second main flow at 12.5 L/min.

Subsequently, the substrate temperature was further raised to 1,000° C. by increasing NH$_3$ and N$_2$ to 10 L/min. and 30 L/min., respectively. Meanwhile, a subflow of N$_2$ gas was supplied at 20 L/min. and a non-growth-related flow of N$_2$ was supplied for purge and other purposes at 19 L/min. in total. In the second heating step, the flow ratio Fp of the inactive gas component to all the constituent gases of the main flow was 0.625 at the start of the second heating step, and 0.75 when the growth temperature was reached.

Next, step B was omitted.

Next, in step C, NH$_3$ was supplied as a constituent gas of the first main flow at 10 L/min. As constituent gases of the second main flow, N$_2$ was supplied at 20 L/min. and H$_2$ was supplied at 0.706 L/min. Also, TMGa (at 0.0055 L/min. at a concentration of 100%) was supplied into the reactor using H$_2$ (0.5 L/min.) contained in the main flow, as a carrier gas, and SiH$_4$ (at $6 \times 10^{-8}$ L/min. at a concentration of 100%) was supplied into the reactor using H$_2$ (0.2 L/min.) contained in the main flow, as a carrier gas and using H$_2$ (0.006 L/min.) as a diluent gas. By supplying these main flow gases, a Si-doped GaN layer (first nitride semiconductor layer) was grown to a thickness of 4 μm.

Meanwhile, a gas mixture (25.5 L/min.) of NH$_3$ (0.5 L/min.) and N$_2$ (25 L/min.) was supplied as a subflow. Also, a non-growth-related flow of N$_2$ was supplied for purge and other purposes at 19 L/min. During the growth of the second nitride semiconductor layer, the flow ratio Fp of the inactive gas component to all the constituent gases of the main flow was 0.78579.

Subsequent steps D and E were carried out under exactly the same conditions as those in Comparative Example 1.

When the growth steps were finished, the substrate temperature was lowered and the gases in the reactor were completely replaced with N$_2$. Then, the substrate was taken out and evaluated.

The substrate thus fabricated had poor surface conditions with severe irregularities. The surface was measured with a contact-type surface roughness gage to determine center line average roughness (Ra). As a result, Ra according to the present comparative example was 78 nm. Also, when PL characteristics were measured under excitation by a laser beam with a wavelength of 325 nm, the peak wavelength was 405 nm and integrated intensity of the PL characteristics was 1 in relative value, which was extremely low, meaning poor optical characteristics. Incidentally, the standard deviation of wavelength distribution in the surface was 1.6%.

COMPARATIVE EXAMPLE 5

In the present comparative example, a stack of gallium nitride-based semiconductor thin films was grown by the MOCVD process and a near ultraviolet LED was fabricated. A series of crystal growth processes for that has already been outlined with reference to FIG. 2(A). The base used was a (1-100) m-plane oriented, n-type, freestanding GaN substrate whose carrier density was $6.7 \times 10^{17}$ cm$^{-3}$ and whose full-width at half maximum of a (10-12) reflection X-ray rocking curve was 30.6 arcsec.

The base was placed on a susceptor in a vertical stainless steel reactor which normally operates under conditions of reduced pressure. No subflow piping was provided in the growth apparatus. First, in the first heating step, with the pressure set to 14 kPa, the base was heated by supplying a main flow of nitrogen gas into the reactor at 20 L/min. When the temperature of the base reached 500° C., the second heating step was started. In the second heating step, NH$_3$ was supplied as a constituent gas of the first main flow at 5 L/min., and N$_2$ was supplied as a constituent gas of the second main flow at 15 L/min.

Under these conditions of the main flow, the temperature of the base was raised to 1,040° C. In the second heating step, the flow ratio Fp of the inactive gas component to all the constituent gases of the main flow was 0.75.

Next, the reactor pressure was set to 14 kPa, and NH$_3$ was supplied as a constituent gas of the first main flow at 5 L/min. Besides, hydrogen (0.5 L/min.), nitrogen (14.5 L/min.), and TMGa (0.0022 L/min., at a concentration of 100%) were supplied as constituent gases of the second main flow, where hydrogen (0.5 L/min.) contained in the main flow was used as a carrier gas to supply the TMGa. Under these conditions of the main flow, an undoped GaN layer (first nitride semiconductor layer) was grown to a thickness of 40 nm (step B). During the growth of the first nitride semiconductor layer, the flow ratio Fp of the inactive gas component to all the constituent gases (excluding non-growth-related flow) of the main flow was 0.72492.

Next, the reactor pressure was set to 8 kPa, and NH$_3$ (10 L/min) was supplied as a constituent gas of the first main flow. Besides, hydrogen (0.5 L/min.), nitrogen (14.5 L/min.), TMGa (0.0071 L/min., at a concentration of 100%), and SiH$_4$ (at $6 \times 10^{-7}$ L/min. at a concentration of 100%) were supplied as constituent gases of the second main flow, where TMGa was supplied using hydrogen (0.5 L/min.) contained in the main flow, as a carrier gas, and SiH$_4$ was supplied using nitrogen (0.2 L/min.) contained in the main flow, as a diluent gas. Under these conditions of the main flow, a crystal of an n-type GaN layer (second nitride semiconductor layer) was grown to a thickness of 7 μm. (step C).

During the growth of the second nitride semiconductor layer, the flow ratio Fp of the inactive gas component to all the constituent gases of the main flow was 0.57986.

Next, with the reactor pressure set to 67 kPa, a multi-quantum well active layer structure was formed by alternately laminating a quantum well layer of $In_{0.07}Ga_{0.85}N$ (with a target thickness of 1.5 nm) with the temperature of the base set at 720° C. and a GaN barrier layer (with a target thickness of 13 nm) with the temperature of the base set at 840° C. for five cycles (step D).

During the growth of the GaN barrier layers, $NH_3$ (12 L/min) was supplied as a constituent gas of the first main flow. Besides, nitrogen (9.5 L/min.), hydrogen (0.5 L/min.), and TMGa (0.000013 L/min.) were supplied as constituent gases of the second main flow, where hydrogen (0.5 L/min.) contained in the main flow was used as a carrier gas to supply the TMGa.

During the growth of the $In_{0.07}Ga_{0.85}N$ quantum well layers, $NH_3$ (12 L/min) was supplied as a constituent gas of the first main flow. Besides, nitrogen (10 L/min.), TMGa (0.000009 L/min.), and TMIn (0.00022 L/min.) were supplied as constituent gases of the second main flow, where nitrogen contained in the main flow was used as a carrier gas at 0.5 L/min. each to supply the TMGa and TMIn.

During the growth of the multi-quantum well active layer structure in step D, the flow ratio Fp of the inactive gas component to all the constituent gases of the main flow was 0.43179 in the case of the barrier layers, and 0.45452 in the case of the well layers.

Next, with the temperature of the base set to 1,000° C. and with the reactor pressure set to 36 kPa, an Mg-doped GaN layer was grown epitaxially (step E). In so doing, $NH_3$ (5 L/min.) was supplied as a constituent gas of the first main flow. Besides, hydrogen (15 L/min.), TMGa, and $Cp_2Mg$ were supplied as constituent gases of the second main flow. Under these conditions of the main flow, the Mg-doped GaN layer was formed to 120 nm.

When the growth steps were finished, the temperature of the base was lowered to 400° C. in the gas atmosphere containing a mixture of nitrogen gas (15 L/min.) and $NH_3$ gas (5 L/min), the gas mixture of $NH_3$ and nitrogen in the reactor was completely replaced with nitrogen gas, the pressure in the reactor was returned to atmospheric pressure, and the substrate was taken out into the air.

FIG. 3(B) is a simplified sectional view of the nitride semiconductor obtained in this way. The surface of the nitride semiconductor substrate thus obtained was extremely flat. Ra measured with a surface roughness gage was 5.2 nm. However, when measured under excitation by a laser beam with a wavelength of 325 nm, the peak wavelength of a PL spectrum was 390 nm and integrated intensity of the PL spectrum was 1 in relative value, which was very weak, meaning very poor optical characteristics.

COMPARATIVE EXAMPLE 6

In the present comparative example, a stack of gallium nitride-based semiconductor thin films was grown by the MOCVD process and a near ultraviolet LED was fabricated. A series of crystal growth processes for that has already been outlined with reference to FIG. 2(A). Also, a layer structure after growth is schematically shown in FIG. 3(A).

The base used was made of c-plane sapphire on which an undoped GaN layer 1 μm thick and an n-type GaN layer (with a carrier concentration of $5 \times 10^{18}$ $cm^{-3}$) 3.5 μm thick were stacked successively, the c-plane being a polar plane. The base was used by being taken out of the reactor once. The GaN on the surface of the base was polar and c(+)-oriented. The base was placed on a tray (susceptor) in a horizontal quartz reactor which normally operates under conditions of normal pressure. The pressure in the reactor was 100±2 kPa in all steps.

All the growth conditions used from the heating step to the end were exactly the same as in Example 1.

The surface of the substrate thus fabricated was very rough and completely clouded. The surface was measured with a contact-type surface roughness gage to determine center line average roughness (Ra). As a result, Ra according to the present comparative example was 376 nm. On the other hand, an attempt to measure PL characteristics under excitation by a laser beam with a wavelength of 325 nm resulted in a complete failure to observe PL emission.

Examples and comparative examples have been described above, and the present inventors interpret the results as follows based on the comparison between the examples and comparative examples.

In Comparative Example 1, Fp in $t_A$ was too low, resulting in introduction of defects and thereby causing deterioration of PL characteristics.

In Comparative Example 2, Fp in the first and second growth steps was too low, resulting in introduction of surface morphology.

In Comparative Example 3, the OFF angle of the substrate used was too large, resulting in abnormal growth, thereby causing deterioration of the surface and thus an increase in Ra. Too large an OFF angle results in extremely small atom step height (terrace width) on the substrate surface. For example, when the OFF angle is 5 degrees, the atom step height is 3.5 nm, which obstructs proper step-flow growth, resulting in deterioration of the surface.

In Comparative Example 4, since Si-doping was done in a practically initial stage of growth by omitting step B, growth was inhibited, resulting in extreme deterioration of the surface.

In Comparative Example 5, excessive pressure reduction in $t_A$ caused introduction of defects, resulting in deterioration of the MQW's PL characteristics.

In Comparative Example 6, since the principal plane of the base is the c-plane, large Fp in step A (specifically, period $t_A$), step B, and step C caused surface roughness, unlike in the case of m-plane growth.

Also, the present inventors interpret differences between the inventions disclosed in the prior literature listed above and the present invention as follows.

The crystal growth method described in Patent Document 1 (invention in Patent Document 1) differs from the crystal growth method according to the present invention in that: (1) the invention in Patent Document 1 practically bears growth on the polar plane in mind, (2) an atmosphere (gas making up a main flow) in a heating step before the growth of a nitride semiconductor layer is a hydrogen atmosphere, (3) the reactor pressure in an initial growth stage of the nitride semiconductor layer is in an excessively reduced state, and (4) a Si source material ($SiH_4$) is intentionally introduced when the growth of the nitride semiconductor layer is started.

Hydrogen gas induces removal of nitrogen atoms near a surface by the etching effect of hydrogen gas, causing introduction of defects into the surface of the nitride semiconductor, and thereby inducing tremendous deterioration in crystallinity. Although reactor pressure suitable for crystal growth of a nitride semiconductor varies slightly depending on configuration of the reactor used, according to studies conducted by the present inventors, a reactor pressure of about 30 kPa is too low and still induces removal of nitrogen atoms. Furthermore, part of SiH$_4$ causes vapor phase reactions, and products of the reactions, if attach to the substrate surface, act as constraints on crystal growth, whose impact is quite noticeable in the initial stage of crystal growth.

On the other hand, the crystal growth method described in Patent Document 2 (invention in Patent Document 2) differs in that (1) the invention in Patent Document 2 uses substrate cleaning and a crystal growth sequence with growth on the polar plane practically in mind. Furthermore, an initial growth layer of nitride semiconductor layers is an undoped layer which does not contain Si. Although an undoped layer is less subject to growth inhibition effect of Si source material, the initial growth layer is as thick as 1 μm (see paragraph 32), and as a result of studies conducted by the present inventors, it is believed that such a thick undoped layer formed on an active layer can cause reduction in luminous intensity.

Patent Document 3 describes a method which initially fabricates Si-doped n-type GaN layer on a GaN substrate, but the method causes deterioration of surface morphology.

Patent Documents 1 and 4 state that it is difficult to form a good film on an m-plane. It is believed that this is because growth conditions on nonpolar planes (e.g., m-plane) are completely different from widely used growth conditions on polar planes (e.g., c-plane).

That is, as can be seen from Comparative Example 6, on the c-plane, a high ratio of inactive gas is not used in the first and second growth steps because a high ratio of inactive gas can increase surface roughness. However, as described herein, in the case of epitaxial growth on a nonpolar plane (e.g., m-plane), it is necessary to increase the ratio of inactive gas unlike on a polar plane (e.g., c-plane) because flat surface morphology is realized only by increasing the ratio of inactive gas.

Furthermore, the H-VPE growth, stripe mask formation, and MOCVD lateral overgrowth described in Patent Document 4 require a large number of man-hours. Also, Patent Document 4 states that in order to reduce defects, it is useful to increase the ratio of hydrogen to the ambient gases and reduce the pressure in an initial growth stage. However, according to studies conducted by the present inventors, it is not possible to simultaneously realize good crystallinity and surface flatness using such a method.

The present invention solves the above problems with the conventional methods and reduces the influence of the QCSE effect using a nonpolar plane. Consequently, the present invention provides a high-quality nitride semiconductor characterized both good surface morphology and optical characteristics as well as high luminous efficiency when used as a light-emitting element.

EXAMPLE 8

In the present example, an LED which, having been fabricated by the crystal growth technique according to the present invention, emits near ultraviolet light was checked for flatness of the multi-quantum well (MQW) layer using a transmission electron microscopy (TEM) observation technique. A series of crystal growth processes for that has already been outlined with reference to FIG. 2(A). Also, a layer structure after growth is similar to the one schematically shown in FIG. 3(A).

The base used was a (1-100) m-plane oriented freestanding GaN substrate. The substrate measured 4.0 mm in the c-axis direction and 20 mm in the a-axis direction. The substrate had been doped with Si (Si concentration: 6.2×10$^{17}$ cm$^{-3}$).

Regarding electrical characteristics, the substrate was n-type and carrier density was 6.5×10$^{17}$ cm$^{-3}$. As a result of X-ray diffraction, the full-width at half maximum of a (10-12) reflection rocking curve was 36.2 arcsec., OFF angle in the c(+) direction was −0.145 degrees, and OFF angle in the a direction was 0.05 degrees. Also, the dislocation density was 5.1×10$^6$ cm$^{-2}$.

The m-plane freestanding GaN substrate was placed on a tray (susceptor) in a horizontal quartz reactor which normally operates under conditions of normal pressure, and an LED having the same layered structure as in FIG. 3(A) was fabricated under the same conditions as Example 1 except that the film thickness of the second semiconductor layer (Si-doped, n-type GaN layer) was 4.2 μm.

The surface of the substrate thus fabricated was measured with a contact-type surface roughness gage, and it was found that Ra=4.7 nm, confirming that the substrate had an extremely flat surface. Also, when PL characteristics were measured under excitation by a laser beam with a wavelength of 325 nm, the peak wavelength was 394 nm and integrated intensity of the PL characteristics was 89 in relative value, which was extremely high, indicating an extremely high PL intensity.

The LED specimen with the above-described characteristics was processed into a thin film using the procedures described below and observed under a high-angle annular dark-field scanning transmission electron microscope (HAADF-STEM). First, the specimen was mechanically polished to a film thickness of 50 μm or below using a parallel pre-polishing machine and rotary polishing pad. Next, the specimen was subjected to Ar ion milling at an acceleration voltage of 2 kV to 5 kV and at a milling angle of 2 to 4 degrees using PIPS (registered trademark) Model 691 made by Gatan, Inc. and thereby processed into a thin film of thickness (about 50 nm) suitable for high-angle annular dark-field scanning transmission electron microscopy (HAADF-STEM). The thin film thus obtained was fixed to a Mo mesh and used as an observation specimen.

The equipment used for HAADF-STEM observation was TECNAI G2 F20 made by FEI Company and equipped with a field emission gun (FEG). TECNAI G2 F20 is equipped with an annular dark-field detector (Model 3000 made by Fischione, Inc.) for HAADF-STEM observation described later.

Incidentally, HAADF-STEM was used to provide high contrast during observation of a layer containing heavy atoms such as In atoms without causing damage to the specimen because observation in the present example was intended to clearly observe an InGaN/GaN interface as described later. An acceleration voltage of an electron beam was 200 Kv.

The observation specimen described above was observed under the HAADF-STEM by a-axis incidence. The observation field of view was set to a range in which the average thickness of each quantum well layer can be determined without sacrificing the resolution of the HAADF-STEM apparatus. Specifically, the range is set to cover 190 nm in a direction perpendicular to the stacking direction of the quantum well layers.

Now, the reason why the HAADF-STEM technique was used will be described briefly. To observe the thickness and the like of a quantum well (QW) accurately, the premise is not to damage the observation specimen. This is because if the specimen is damaged by injection of an electron beam, a resulting TEM image often does not reflect an actual state (contains artifacts) (see, for example, Non-Patent Document 3: C. J. Humphreys et al., "Applications Environmental Impact and Microstructure of Light-Emitting Diodes" MICROSCOPY AND ANALYSIS, NOVEMBER 2007, pp. 5-8).

In view of the above circumstances, it is essential to carry out observations at low temperatures under conditions of low dosage (decreased current density per unit time) and low current density (decreased current density per unit area) by cooling the specimen. As an observation method which satisfies the above conditions, low-temperature observation using the HAADF-STEM technique is the most desirable.

Regarding the HAADF-STEM technique, descriptions can be found in Non-Patent Document 4 (K. SAITOH, "High-resolution Z-contact Imaging by the HAADF-STEM Method", J. Cryst. Soc. Jpn., 47(1), 9-14 (2005)) and Non-Patent Document 5 (K. WATANABE; "Imaging in High Resolution HAADF-STEM", J. Cryst. Soc. Jpn., 47(1), 15-19 (2005)).

The HAADF-STEM technique, which uses a STEM image observed by scanning transmission electron microscopy (STEM), involves receiving electrons inelastically scattered at high angles in the STEM image by thermal diffuse scattering due to lattice vibrations using an annular detector, measuring the integrated intensity of the electrons as a function of probe position, and displaying the intensity as an image. Brightness of the image obtained by HAADF-STEM is proportional to the square of an atomic number. When observing a GaN/InGaN-based specimen, HAADF-STEM has the advantage of giving high contrast to a layer containing heavy atoms such as In atoms and allowing the specimen to be observed at low dosages.

In the present example, concrete observation conditions were controlled to be as follows. The incident angle of the electron beam was 10 mrad or below, spot diameter was 0.2 nm or below, and detected scattering angle was 70 mrad or above. Also, the following image data collection conditions were used. The magnification was 640,000, pixel resolution was 0.186 nm/pixel, scanning rate was 64 μsec./pixels, and frame size was 1024×1024 pixels. Incidentally, the pixel resolution (0.186 nm/pixel) approximately coincided with STEM resolution (0.18 nm) of the microscope used in the present experiment. Image data collection under these conditions is supposed to provide intensity data on each of the 1024×1024 pixels (approximately 1.05 million pixels) and consequently a two-dimensional intensity distribution. Also, 0.186 nm/pixel×1024 pixels approximately equals 190 nm, and thus roughly coincides with the observation range (190 nm) of the quantum well layer.

The incident direction of the electron beam upon the observation specimen was set parallel to the [11-20] direction of GaN with wurtzite crystal structure. Incidentally, observations may be carried out under conditions in which the incident electron beam is parallel to the [0001] direction. Furthermore, another electron beam incidence direction may also be selected. To cool the specimen, a liquid nitrogen injection cryo-holder (Model 636 DHM made by Gatan, Inc.) is used. When this cryo-holder is used, the lowest attainable temperature is in the temperature range of 77 to 140 K approximately 40 minutes after injection of liquid nitrogen. There is a report on an experiment in which temperatures were measured with a thermocouple attached to an observation specimen (Non-Patent Document 6).

To check the field of view or determine the incident direction of an electron beam, TEM observations were carried out. For the TEM observations, the current density of the electron beam was set between 30 to 500 A/$m_2$ to avoid damage to the specimen. Incidentally, it was confirmed that an electron beam of 500 A/$m_2$ injected for 10 minutes under the cryogenic conditions did not change morphology of the specimen.

Figure 6:
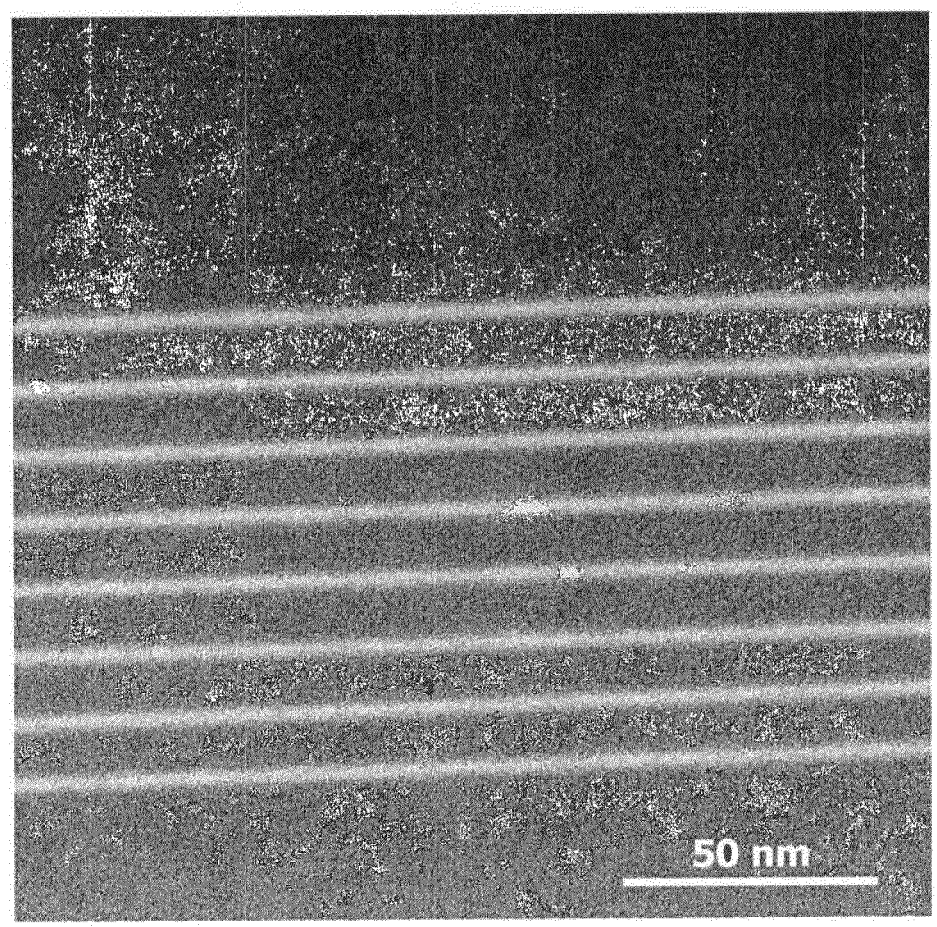
FIG. 6 is a diagram showing a STEM image obtained in Example 8.
Figure 7:
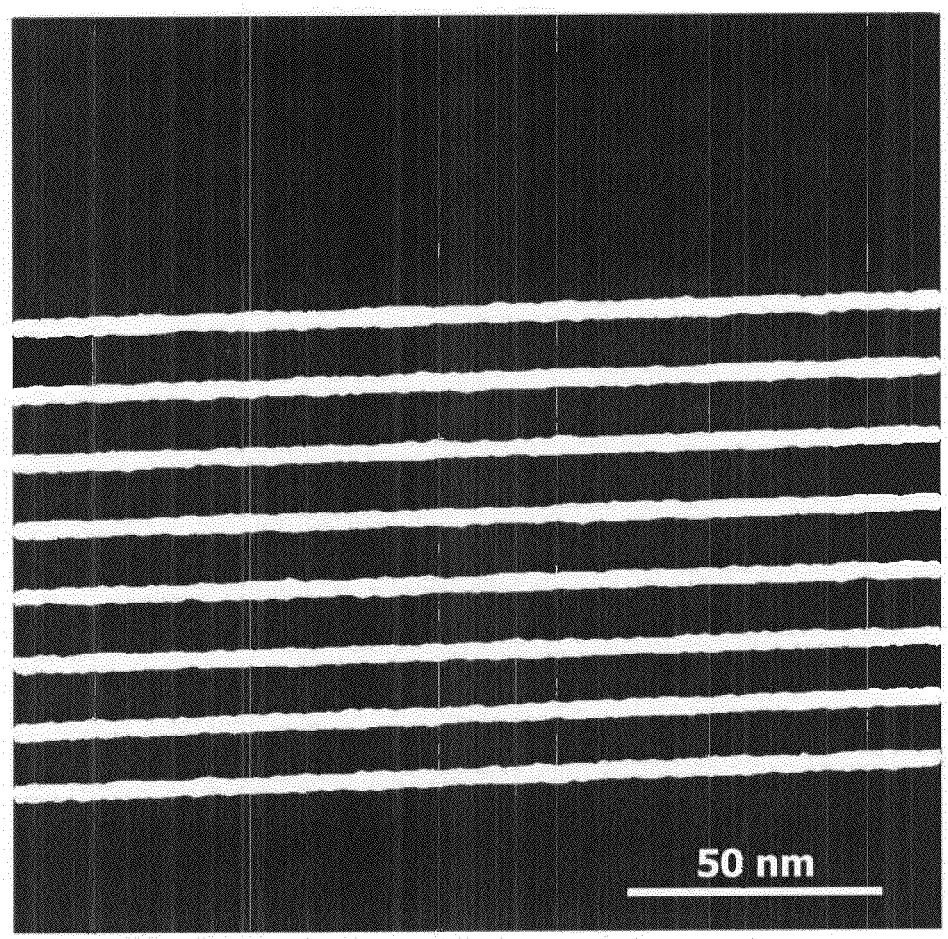
FIG. 7 is a diagram showing results of image processing performed to calculate average thickness of each quantum well layer from the STEM image in FIG. 6.

FIG. 6 shows a HAADF-STEM image obtained in this way and FIG. 7 shows results of image processing performed to calculate the average thickness of each quantum well layer from the HAADF-STEM image.

The image processing as referred to herein involves (1) digitalizing the HAADF-STEM image, (2) approximating each quantum well layer by an ellipsoid, (3) rotating the image so that the major axis of the ellipsoid will be parallel to the horizontal direction (X-axis direction) of the image, (4) calculating all thicknesses in the Y-axis direction for all pixels in the X-axis direction in each quantum well layer, (5) and thereby calculating "the average thickness, standard deviation, and coefficient of variation of each quantum well layer. The "coefficient of variation" is obtained by dividing the standard deviation by the average value and is referred to as "CV value."

Table 2 summarizes the average thicknesses (nm) of the quantum well layers (w1 to w8) obtained in this way, where w1 is the average thickness of the lowest quantum well layer (on the substrate side) and w8 is the average thickness of the highest quantum well layer (on the front side). At the same time, the table also shows the standard deviation (see expression 1 described later) and coefficient of variation (CV value) of the thickness in the Y-axis direction in each layer.

TABLE 2

| Quantum well layer | Average thickness (nm) | Standard deviation (nm) | Coefficient of variation |
|---|---|---|---|
| w8 | 3.84 | 0.29 | 0.075 |
| w7 | 3.73 | 0.28 | 0.076 |
| w6 | 3.62 | 0.29 | 0.081 |
| w5 | 3.65 | 0.29 | 0.079 |
| w4 | 3.61 | 0.31 | 0.085 |
| w3 | 3.61 | 0.26 | 0.072 |
| w2 | 3.65 | 0.21 | 0.059 |
| w1 | 3.65 | 0.29 | 0.081 |

To demonstrate the flatness of the multi-quantum well (MQW) layer of the LED according to the present example, a comparative specimen was fabricated under the following conditions.

COMPARATIVE EXAMPLE 7

Figure 2Q:
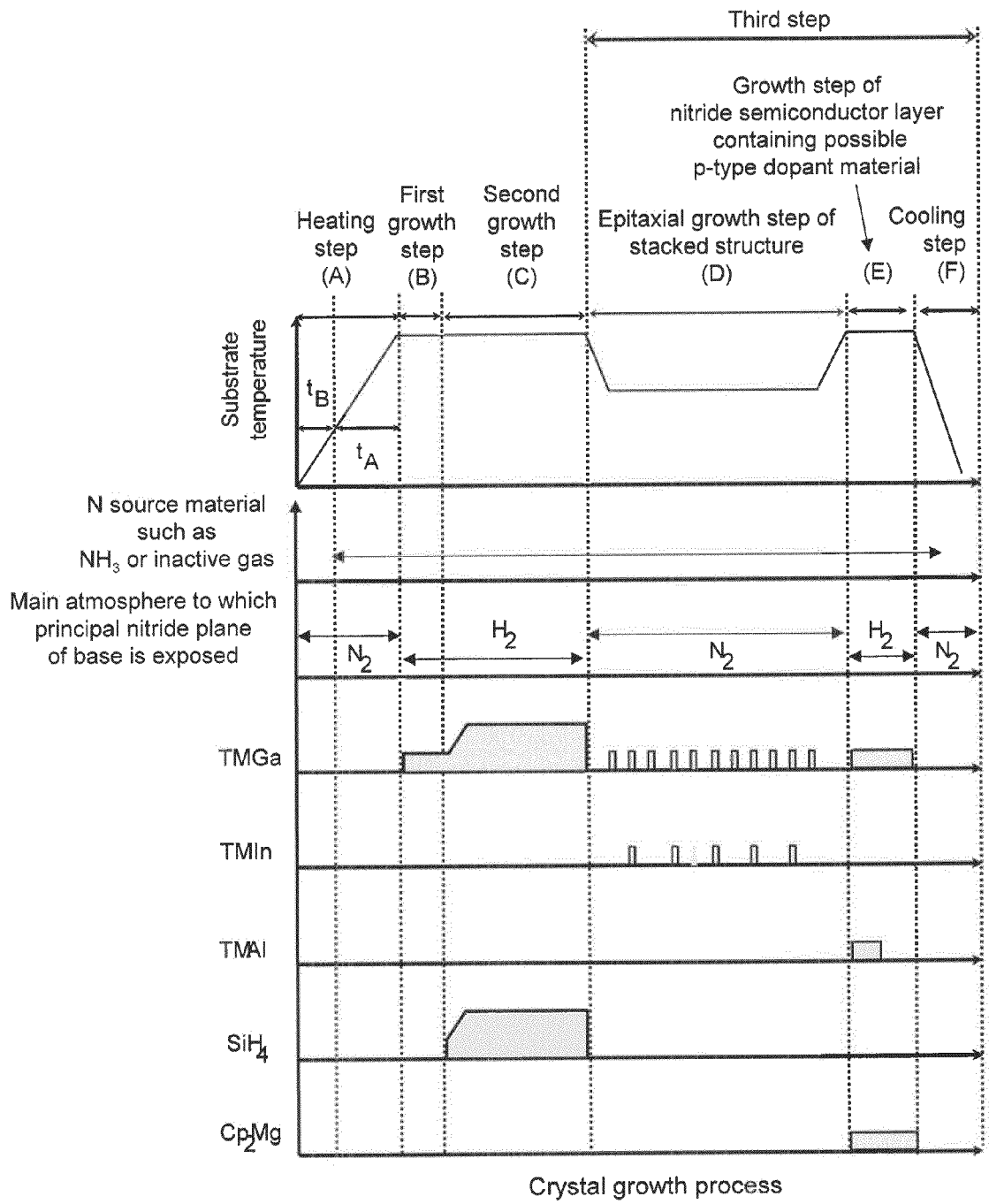
FIG. 2(Q) is a diagram for illustrating an exemplary sequence of a nitride semiconductor crystal growth method according to Comparative Example 7.
Figure 3D:
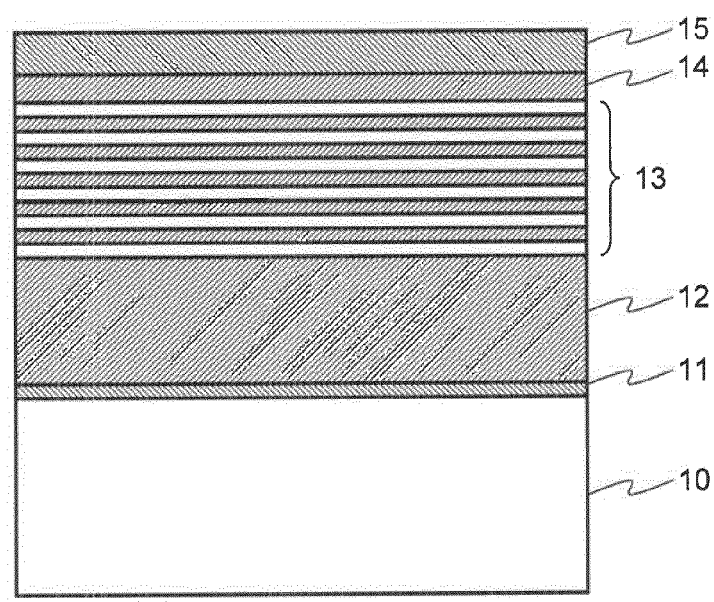
FIG. 3(D) is a diagram for illustrating a stacked structure of a specimen (5-period MQW) according to Comparative Example 7.

The comparative specimen was an LED fabricated by growing a stack of gallium nitride-based semiconductor thin films by the MOCVD process. A series of crystal growth processes for that has already been outlined with reference to FIG. 2(Q). The stacked structure of the MQW is a 5-period structure as shown in FIG. 3(D).

The base used was a (1-100) m-plane oriented freestanding GaN substrate. The substrate measured 4.1 mm in the c-axis direction and 15 mm in the a-axis direction. The substrate had been doped with Si whose concentration was $6.2 \times 10^{17}$ cm$^{-3}$. Regarding electrical characteristics, the substrate was n-type and carrier density was $6.5 \times 10^{17}$ cm$^{-3}$. As a result of X-ray diffraction, the full-width at half maximum of a (10-12) reflection rocking curve was 38.9 arcsec., OFF angle in the c(+) direction was −0.165 degrees, and OFF angle in the a direction was 0.05 degrees. Also, the dislocation density was $5.8 \times 10^6$ cm$^{-2}$.

The m-plane freestanding GaN substrate was placed on a tray (susceptor) in a horizontal quartz reactor which normally operates under conditions of normal pressure, and an LED structure was fabricated.

The heating steps were carried out in the same manner as in Example 8.

In step B next, the same conditions as in Example 8 were used except that N$_2$ and H$_2$ were supplied at 0 L/min and 30 L/min, respectively as a constituent gases of the first main flow. In so doing, Fp=0.0.

In step C next, the same conditions as in Example 8 were used except that N$_2$ and H$_2$ were supplied at 0 L/min and 40 L/min, respectively as a constituent gases of the first main flow and that the thickness of the Si-doped GaN layer (second nitride semiconductor layer) was 1.7 µm. In so doing, Fp=0.0.

In steps D and E next, the same conditions as in Example 8 were used.

When the growth steps were finished, the substrate temperature was lowered and the gases in the reactor were completely replaced with N$_2$. Then, the substrate was taken out and evaluated.

The surface of the substrate thus fabricated had severe irregularities. When the surface was measured with a contact-type surface roughness gage, Ra=210 nm, meaning that the flatness was much inferior compared to Example 8 (Ra=4.7 nm). Also, when PL characteristics were measured under excitation by a laser beam with a wavelength of 325 nm, the peak wavelength was 423 nm and integrated intensity of the PL characteristics was 11 in relative value, which was very weak and much inferior to the integrated intensity (89) in relative value according to Example 8 as with the flatness.

Figure 8:
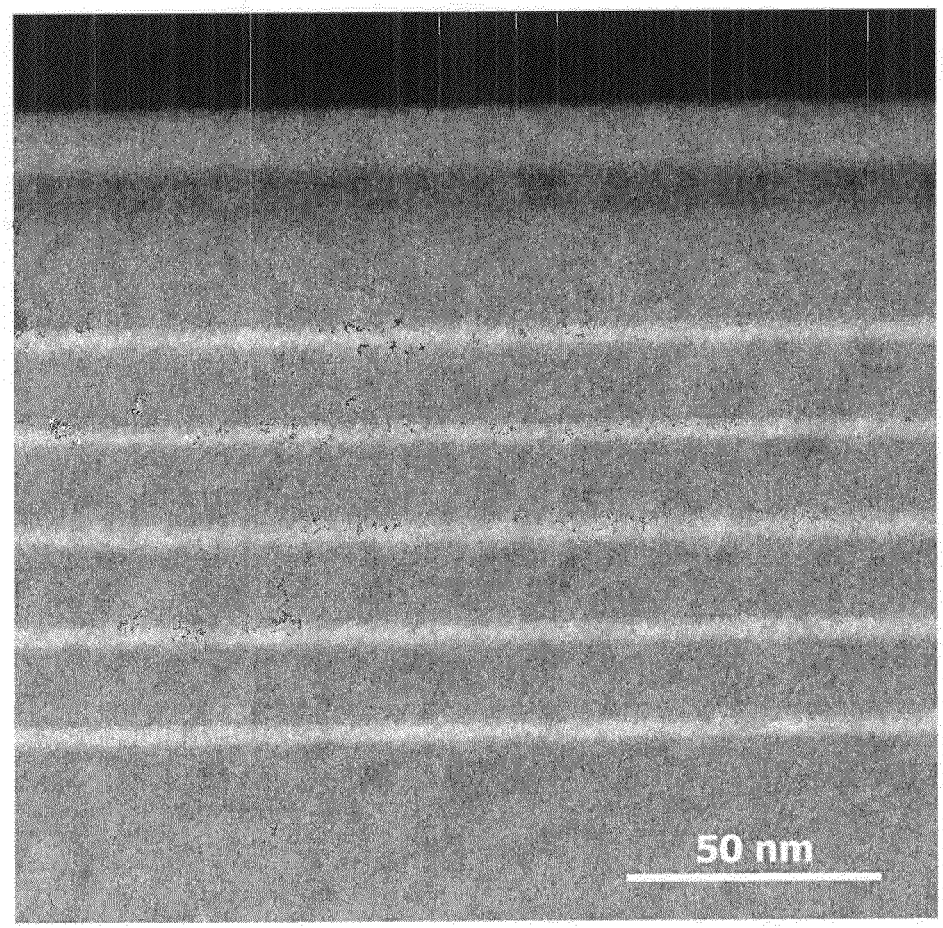
FIG. 8 is a diagram showing a STEM image obtained from an LED in Comparative Example 7.
Figure 9:
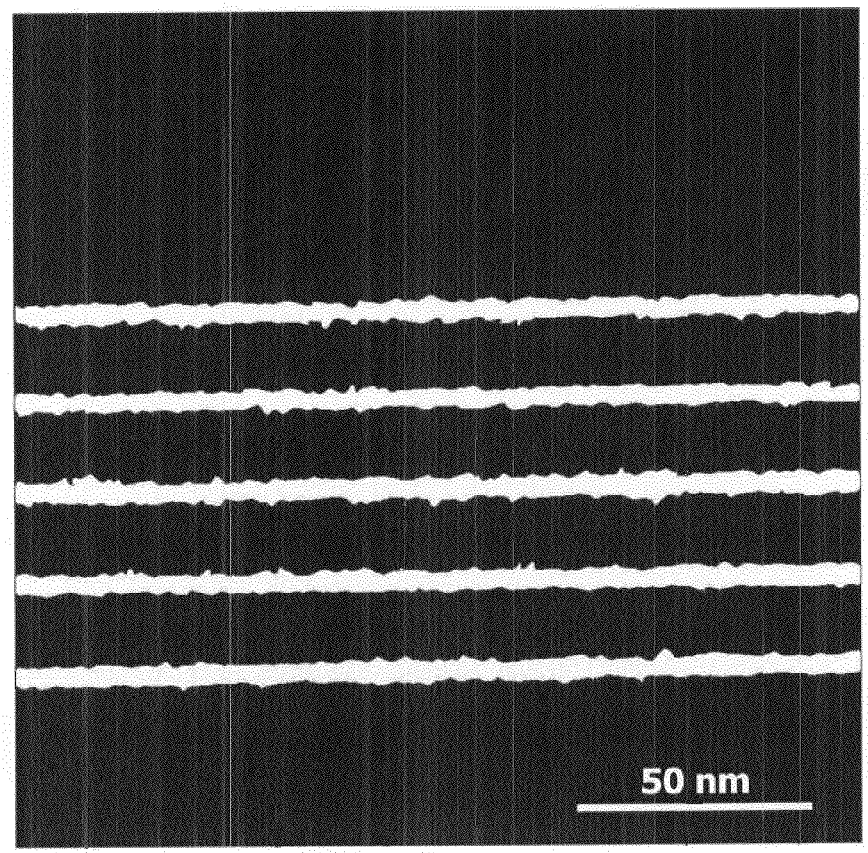
FIG. 9 is a diagram showing results of image processing performed to calculate average thickness of each quantum well layer from the STEM image in FIG. 8.

FIG. 8 shows a HAADF-STEM image obtained from an LED thus fabricated, the HAADF-STEM image having been obtained using procedures similar to those used in Example 8. FIG. 9 shows results of image processing performed in FIG. 8.

Table 3 summarizes the average thicknesses (nm) of the quantum well layers (w1 to w5) of the comparative specimen, the average thicknesses having been obtained as a result of the image processing, where w1 is the average thickness of the lowest quantum well layer (on the substrate side) and w5 is the average thickness of the highest quantum well layer (on the front side). At the same time, the table also shows the standard deviation (see expression 1 described later) and coefficient of variation of the thickness in the Y-axis direction in each layer.

TABLE 3

| Quantum well layer | Average thickness (nm) | Standard deviation (nm) | Coefficient of variation |
| --- | --- | --- | --- |
| w5 | 4.65 | 0.57 | 0.123 |
| w4 | 4.46 | 0.50 | 0.113 |
| w3 | 5.13 | 0.73 | 0.143 |
| w2 | 4.82 | 0.51 | 0.107 |
| w1 | 4.79 | 0.52 | 0.110 |

Figure 10:
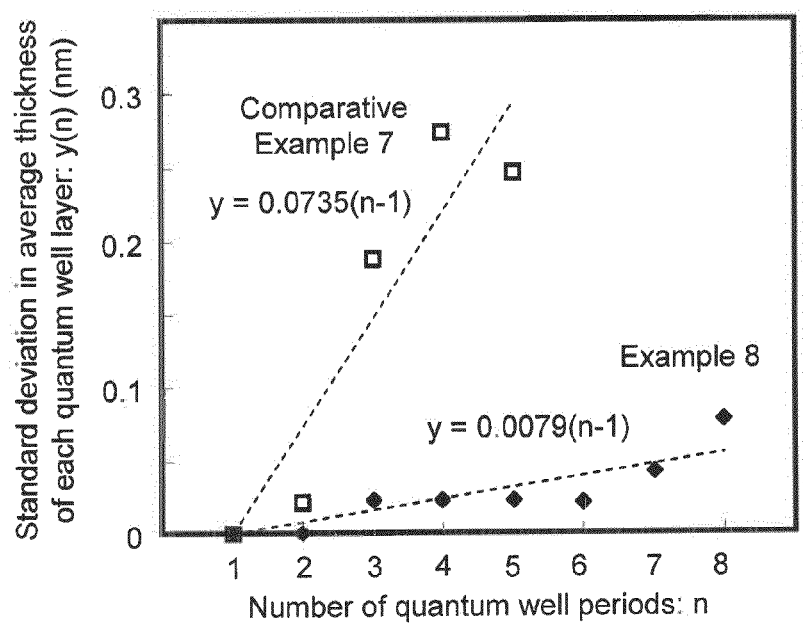
FIG. 10 is a diagram comparing uniformity of the average thicknesses of the quantum well layers (standard deviations of thicknesses of the quantum well layers) between Example 8 and Comparative Example 7.

FIG. 10 is a diagram plotted to show how the standard deviation of the average thickness of each quantum well layer changes as the quantum wells shown in Example 8 and Comparative Example 7 are stacked starting from the substrate side. As already described above, "the average thickness of each quantum well layer" is calculated by (1) digitalizing the HAADF-STEM image, (2) approximating each quantum well layer by an ellipsoid, (3) rotating the image so that the major axis of the ellipsoid will be parallel to the horizontal direction (X-axis direction) of the image, (4) calculating all thicknesses in the Y-axis direction for all pixels in the X-axis direction in each quantum well layer, (5) and thereby calculating "the average thickness, standard deviation, and coefficient of variation of each quantum well layer. The "coefficient of variation" is obtained by dividing the "standard deviation" by the "average" (standard deviation/average).

The standard deviation of the average thickness (of each quantum well layer) y(n) (nm) when the quantum wells are stacked over n periods starting from the substrate side was calculated using expression 1 shown below, where W$_n$ (nm) is the average thickness of the nth quantum well layer starting from the substrate side.

[Expression 1]

where it is assumed that n>1, and when n=1, the standard deviation of the average thickness is set to 0.

In Example 8, the standard deviation y(n) (nm) of the average thickness of each quantum well layer was generally related to the number n of quantum well periods by y(n)=0.0079(n−1), and was very small. On the other hand, in Comparative Example 7, there is generally a relation of the form y(n)=0.0735(n−1), showing that the standard deviation of the average thickness of each quantum well layer tended to increase as more quantum well layers were stacked.

In Example 8, the thickness of each quantum well layer has been designed to be 3.64 nm while in Comparative Example 7, the thickness of each quantum well layer has been designed to be 4.80 nm. It is apparent that the notable differences in the standard deviation y(n) (nm) of the average thickness of each quantum well layer originated in differences in the crystallinity of the quantum well layers including flatness rather than the differences in the design value of the average thickness.

In this way, the nitride semiconductor crystal growth method according to the present invention makes it possible to obtain an LED with a multi-quantum well active layer structure which has excellent layer thickness uniformity and in which dependence of the standard deviation y(n) (nm) of the average thickness of each quantum well layer on the number n of quantum well periods is approximately an order of magnitude lower than in the case of conventional methods when the observation specimen is evaluated nondestructively by the HAADF-STEM technique.

EXAMPLE 9

In the present example, a specimen similar to the one used in Example 8 was prepared and observed under an ultra high-voltage transmission electron microscope (UHV-TEM). A general-purpose TEM uses an acceleration voltage of about 100 to 400 kV, but an acceleration voltage of this magnitude provides effective penetrating ability of electrons on the order of a few hundred nm at the most and is not sufficient to observe expected crystal defects and dislocations in epitaxial layers on GaN substrates. Reasons for that are as follows.

In homoepitaxial growth of GaN-based material on a GaN substrate, unlike heteroepitaxial growth of GaN-based material on a sapphire substrate and the like, if proper epitaxial growth is realized after sufficient examination, it is considered essentially possible to reduce dislocations. Thus, in observation of crystal defects and dislocations, it is necessary to create a specimen having reasonable "thickness" so that dislocations will come into the observation field of view even if the specimen has a low dislocation density. To observe a specimen with such a thickness under a TEM, an electron accelerating voltage of 1,000 kV or above is required for observation.

When such an electron accelerating voltage is used, observable specimen thickness can be increased to about 1 to 2 μm. This makes it possible to observe dislocations even if the sample has a low dislocation density such as described above. If dislocation lines cannot be observed even when a specimen with such a thickness is observed, it is likely that the specimen has a considerably low dislocation density. In other words, even if dislocation lines are not observed when a sample with a thickness on the order of a few hundred nm at the most is observed, it is not possible to conclude that the dislocation density is sufficiently low.

Specifically, even if dislocations are not observed when a sample with a thickness on the order of a few hundred nm at the most is observed in an area several times as large as the field of view, this only means that the dislocation density is lower than approximately 10 to the eighth power ($cm^{-2}$). On the other hand, if dislocations are not observed even when a specimen whose thickness is increased to about 1 to 2 μm is observed in an area several times as large as the field of view, it is likely that the specimen has a dislocation density lower than approximately 10 to the seventh power ($cm^{-2}$).

Furthermore, dislocations may be unobservable depending on the incident direction of an electron beam. Thus, preferably the incident electron beam is adjusted to be parallel to the c-axis direction.

In view of the above circumstances, for TEM observations in the present example, an ultra high-voltage TEM with an effective penetrating ability in excess of 1 μm was used with the acceleration voltage of the electron beam set to 1,000 Kv. The specimen thickness was approximately 1.5 μm and the incident electron beam was parallel to the c-axis direction. Incidentally, the ultra high-voltage TEM used was JEM-ARM1000 made by JEOL Ltd.

Figure 11:
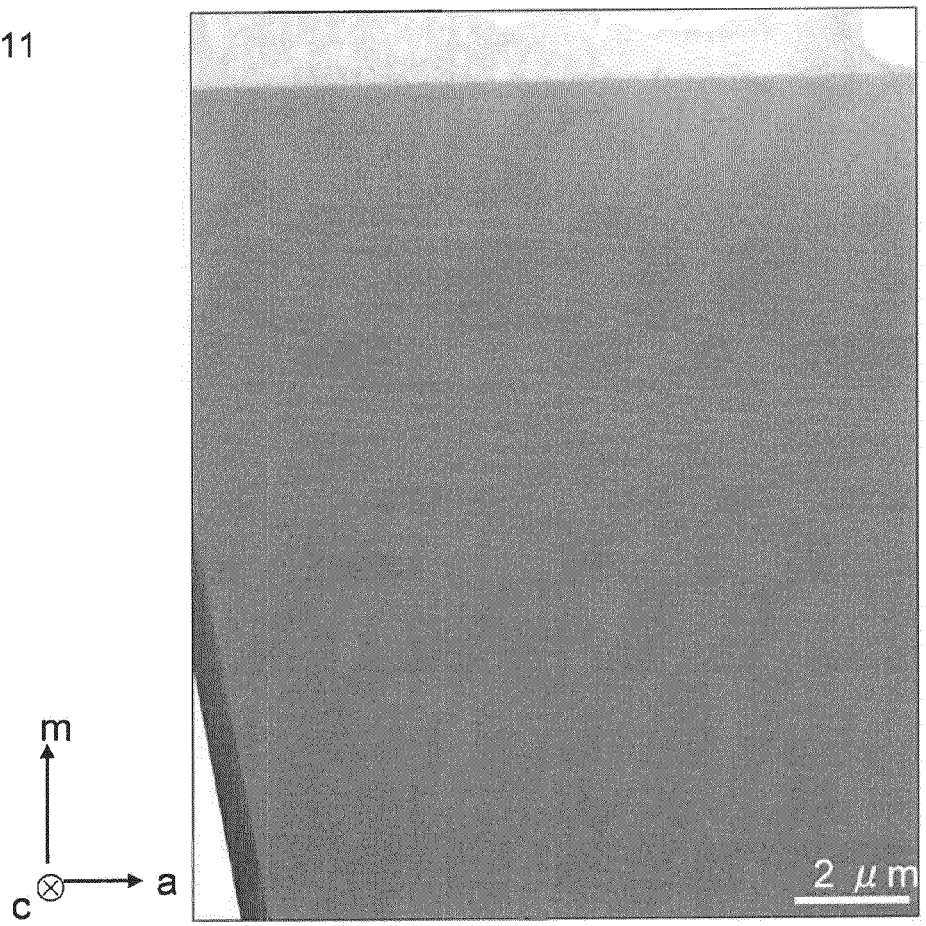
FIG. 11 is a diagram showing an image obtained by observing a specimen created in Example 9 under an ultra high-voltage TEM.

FIG. 11 shows an image obtained by observation under an ultra high-voltage TEM under the conditions described above. As shown in the photo, crystal defects and dislocations were not observed.

EXAMPLE 10

In the present example, the light emission characteristics of a multi-quantum well (MQW) layer fabricated by the crystal growth technique according to the present invention was evaluated by a photoluminescence (PL) technique to confirm that the MQW structure excelled internal quantum efficiency and emission lifetime.

Figure 2G:
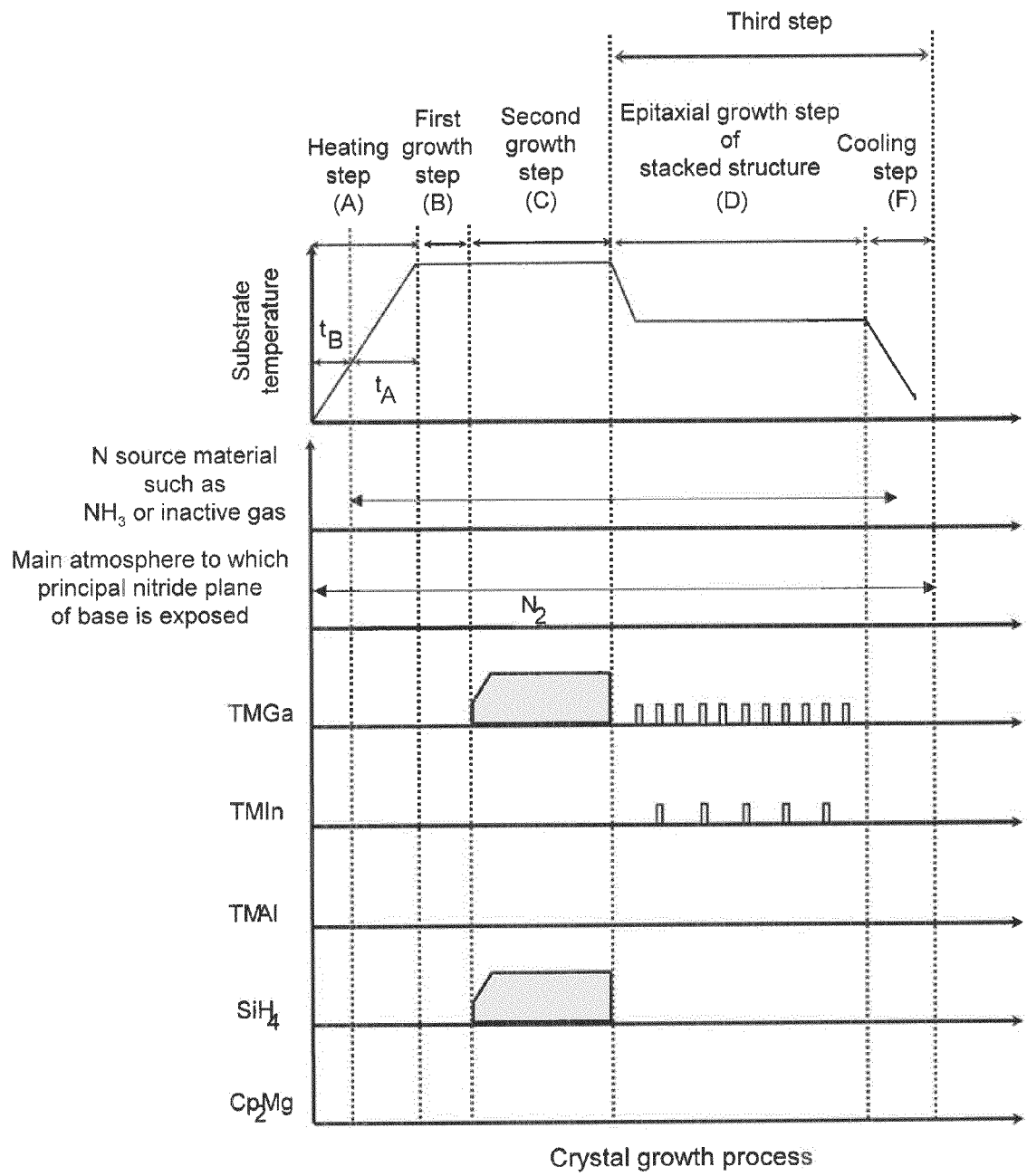
FIG. 2(G) is a diagram for illustrating a sequence of crystal growth method according to Example 10.
Figure 3E:
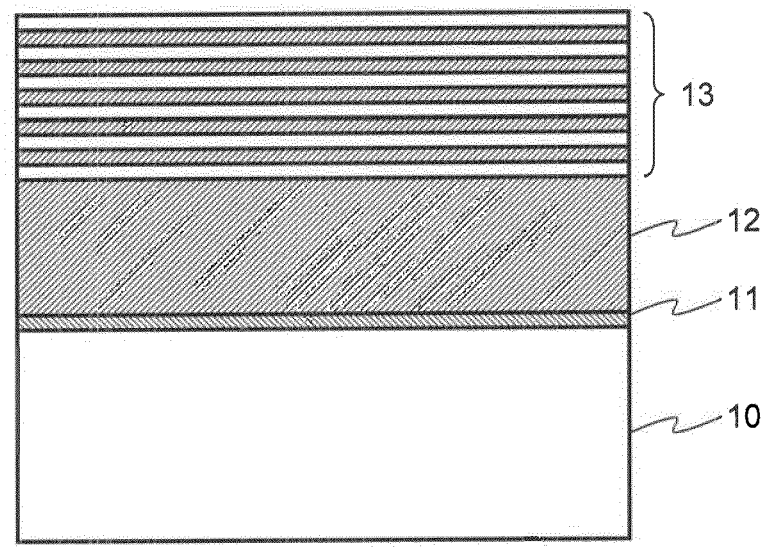
FIG. 3(E) is a diagram for illustrating a stacked structure of a specimen used in Example 10.

FIG. 3(E) is a diagram showing a stacked structure of a specimen used in the present example and FIG. 2(G) is a diagram for illustrating a sequence of the crystal growth method for the specimen. In this specimen, no Mg-doped layer is provided on the MQW structure, and a 5-period InGaN/GaN multi-quantum well active layer structure 13 is provided in the uppermost layer.

The base used was a (1-100) m-plane oriented freestanding GaN substrate. The substrate measured 4.1 mm in the c-axis direction and 15 mm in the a-axis direction. The substrate had been doped with Si whose concentration was $6.2\times10^{17}$ $cm^{-3}$. Regarding electrical characteristics, the substrate was n-type and carrier density was $6.5\times10^{17}$ $cm^{-3}$. As a result of X-ray diffraction, the full-width at half maximum of a (10-12) reflection rocking curve was 35 arcsec., OFF angle in the c(+) direction was −0.165 degrees, and OFF angle in the a direction was 0.05 degrees. Also, the dislocation density was $4.9\times10^6$ $cm^{-2}$.

The m-plane freestanding GaN substrate was placed on a tray (susceptor) in a horizontal quartz reactor which normally operates under conditions of normal pressure, and a quantum well structure was fabricated. The same crystal growth conditions as in example 8 were used except that the thickness of the second semiconductor layer (Si-doped, n-type GaN layer) was 2.5 μm, the quantum wells grown in step D had a 5-period structure, and that the substrate was cooled without using step E.

When the surface of the substrate thus fabricated was measured with a contact-type surface roughness gage, Ra=4.8 nm, indicating an extremely flat surface. Also, when PL characteristics were measured at room temperature under excitation by a laser beam with a wavelength of 325 nm, the peak wavelength was 393 nm and integrated intensity of the PL characteristics was 196 in relative value, indicating an extremely high PL intensity. The internal quantum efficiency and PL emission lifetime of the specimen were evaluated in the following manner.

First, the internal quantum efficiency of the specimen was evaluated as follows: PL(CW–PL) measurements were taken using a continuous wave (CW) as irradiating light for the specimen and time-resolved PL measurements were taken using pulsed light.

Figure 12:
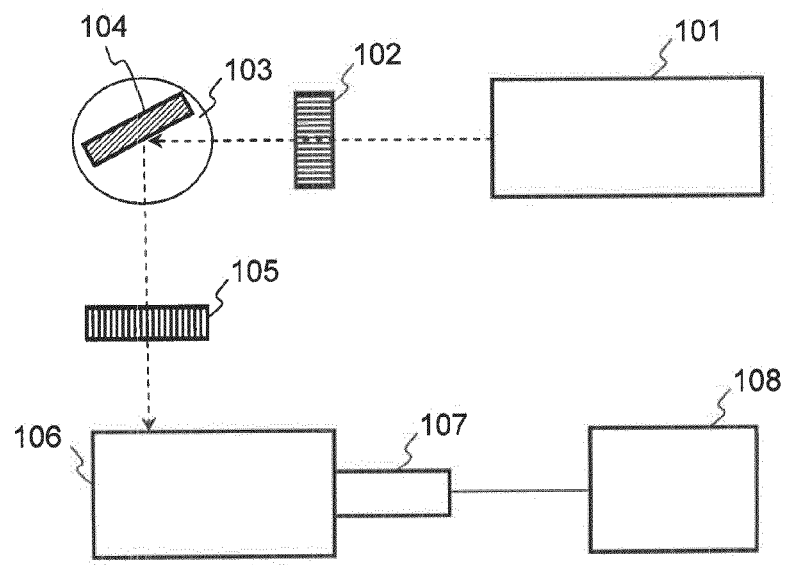
FIG. 12 is a block diagram of an optical system used for CW-PL measurements.

FIG. 12 is a block diagram of an optical system used for the CW-PL measurements. A He—Cd laser 101 with a wavelength of 325 nm is used as an excitation light source, laser beam intensity is adjusted by an ND filter 102, and a specimen 104 housed in a cryostat 103 is irradiated. PL light from the specimen 104 is passed through a ¼-wave plate 105, spectroscopically analyzed by a spectroscope 106, and measured by light amplifier 107. Then, data is collected by a control computer 108.

Specimen temperature was in the range of 13 K to 300 K. Laser power per unit area on the specimen surface was 150 W/$cm^2$. Under these conditions, photoexcited steady state excess carrier density was estimated to be in the range of $1\times10^{16}$ $cm^{-3}$ to $1\times10^{17}$ $cm^{-3}$.

Based on results of the CW-PL measurements, integrated intensity I(13K) was found by integrating the PL intensity from multi-quantum wells at 13 K with respect to luminous energy, and when the integrated intensity I(13K) was taken to be 1, similar integrated intensity I(300K) at 300 K was 58% of I(13K).

Figure 13:
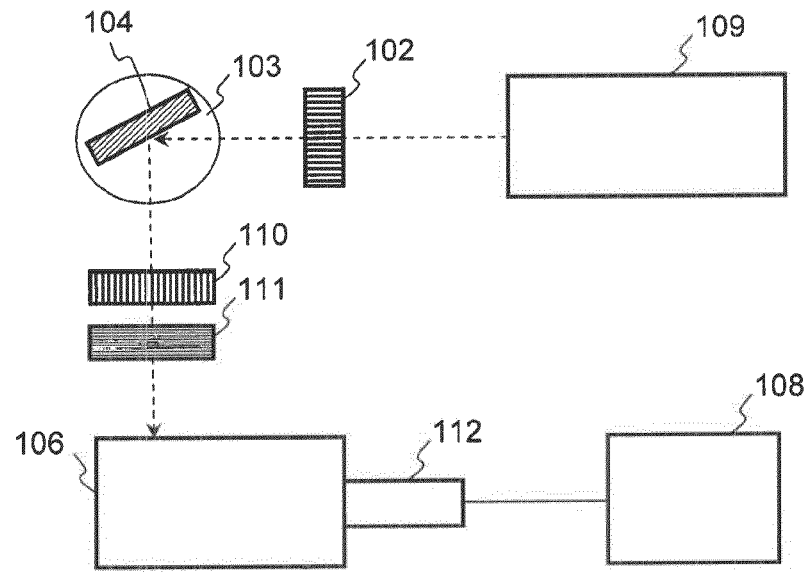
FIG. 13 is a block diagram of an optical system used for time-resolved PL measurements (with a polarizing filter)

FIG. 13 is a block diagram of an optical system used for time-resolved PL measurements (with a polarizing filter). An optical system including a tunable pulsed laser source 109 and streakscope (made by Hamamatsu Photonics K.K.) 112 was used in the time-resolved PL measurements. The tunable pulsed laser source included a mode-locked Ti:sapphire laser, Ti:sapphire regenerative amplifier, optical parametric amplifier, and high-frequency generating crystal. Pulse repetition frequency was 1 kHz and pulse width was 120 fs.

PL measurement based on selective excitation is effective in directly evaluating optical quality of a single quantum well layer or multiple quantum well layers included in an active layer structure. For example, to selectively excite multiple quantum well layers, it is necessary to select light which has energy lower than the band gap of GaN, but higher than the band gap of an InGaN quantum well layer. Therefore, the wavelength of the tunable pulsed laser was set to 370 nm. After being adjusted with the ultraviolet ND filter 102, pulse energy is directed at the specimen 104 in the cryostat 103 which can be cooled by liquid He. The PL from the specimen 104 passes through a polarizing filter 110 and depolarizer 111. Then, the PL is dispersed by a spectroscope 106 and led to the streakscope 112. Measurements were taken by varying the specimen temperature from 4 K to 300 K.

The polarizing filter 110 is placed between a condensing lens (not shown) and the spectroscope 106 and used to selectively pass light which has an electric field component perpendicular to the c-axis of the specimen 104 and thereby input the light into the spectroscope 106. The depolarizer 111 is used to avoid being influenced by polarization dependence of diffraction characteristics of the spectroscope 106. The pulse energy directed at the specimen 104 was determined by dividing power measured with a power meter by the repetition frequency. Pulse energy density per unit area was 1400 nJ/cm².

Although an accurate value of an absorption coefficient α at an excitation wavelength of one quantum well layer contained in the nitride semiconductor layer prepared in the present experiment is unknown, it is considered that a value in the range of $1\times10^4$ cm$^{-1}$ to $1\times10^5$ cm$^{-1}$ may be appropriate. If the absorption coefficient α of one quantum well layer is $1\times10^4$ cm$^{-1}$, an average density of excess carriers excited in all the quantum well layers contained in the nitride semiconductor layer is estimated to be approximately $3\times10^{16}$ cm$^{-3}$. Similarly, when the absorption coefficient α is $5\times10^4$ cm$^{-1}$, the average density of excited excess carriers is estimated to be approximately $1\times10^{17}$ cm$^{-3}$ and when the absorption coefficient α is $1\times10^5$ cm$^{-1}$, the average density of excited excess carriers is estimated to be approximately $3\times10^{17}$ cm$^{-3}$.

Based on results of the time-resolved PL measurements, PL intensity was found by time-integrating transient response of PL emission from the multi-quantum wells at 4 K and integrated intensity I(4K) was found by further integrating the PL intensity with respect to emission energy, and when the integrated intensity I(4K) was taken to be 1, similar integrated intensity I(300K) at 300 K was 93% of I(4K).

Also, at 300 K, based on data obtained by the time-resolved PL measurements (with a polarizing filter) and assuming that the pulse energy density per unit area was 1400 nJ/cm², PL lifetime was determined from the transient response (decay curve) of the PL intensity after pulse excitation with respect to time. If the PL lifetime is defined to be the time from maximum intensity on the decay curve of the PL intensity to the time when 1/e the maximum intensity is reached, the PL lifetime τ(PL) was 3.6 nsec. Also, radiative recombination lifetime τ(R) was 4.4 ns and non-radiative recombination lifetime τ(NR) was 20.6 ns. The radiative recombination lifetime τ(R) was determined from the expression τ(R)=τ(PL)/η, where η was internal quantum efficiency. Also, the non-radiative recombination lifetime τ(NR) was determined from the expression τ(NR)=τ(PL)/(1−η). As a result, it turned out that τ(R)<τ(NR).

Figure 14:
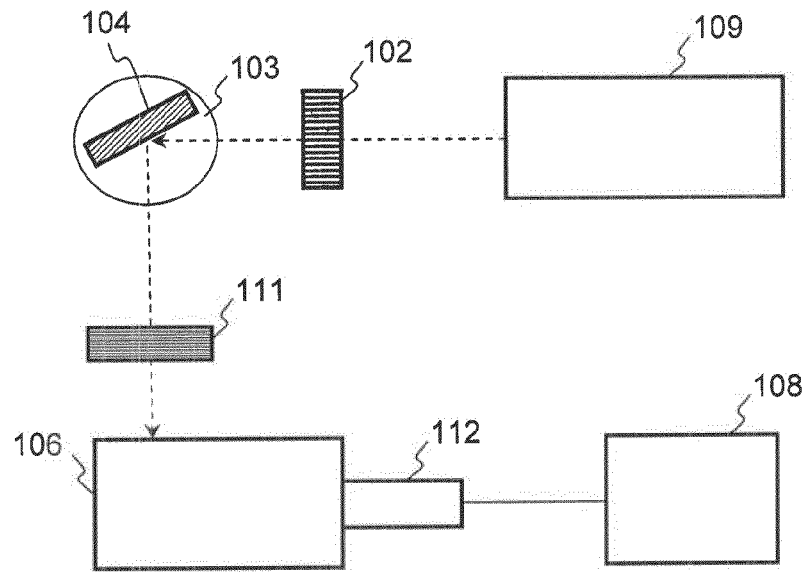
FIG. 14 is a block diagram of an optical system used for time-resolved PL measurements (without a polarizing filter)

FIG. 14 is a block diagram of an optical system used for time-resolved PL measurements (without a polarizing filter). FIG. 14 differs from FIG. 13 only in that the polarizing filter 110 is not used.

The pulse repetition frequency was 1 kHz and pulse width was 120 fs. The tunable pulsed laser source included a mode-locked Ti:sapphire laser, Ti:sapphire regenerative amplifier, optical parametric amplifier, and high-frequency generating crystal.

PL measurement based on selective excitation is effective in directly evaluating optical quality of a single quantum well layer or multiple quantum well layers included in an active layer structure. For example, to selectively excite multiple quantum well layers, it is necessary to select light which has energy lower than the band gap of GaN, but higher than the band gap of an InGaN quantum well layer. Therefore, the wavelength of the tunable pulsed laser was set to 370 nm.

After being adjusted with the ultraviolet ND filter 102, pulse energy is directed at the specimen 104 in the cryostat 103 which can be cooled by liquid He. The PL from the specimen 104 passes through the depolarizer 111. Then, the PL is dispersed by a spectroscope 106 and led to the streakscope 112. Measurements were taken by varying the specimen temperature from 4 K to 300 K. The pulse energy directed at the specimen 104 was determined by dividing power measured with a power meter by the repetition frequency. The pulse energy density per unit area was 510 nJ/cm².

Although an accurate value of an absorption coefficient α at an excitation wavelength of one quantum well layer contained in the nitride semiconductor layer prepared in the present experiment is unknown, it is considered that a value in the range of $1\times10^4$ cm$^{-1}$ to $1\times10^5$ cm$^{-1}$ may be appropriate. If the absorption coefficient α of one quantum well layer is $1\times10^4$ cm$^{-1}$, an average density of excess carriers excited in all the quantum well layers contained in the nitride semiconductor layer is estimated to be approximately $1\times10^{16}$ cm$^{-3}$. Similarly, when the absorption coefficient α is $5\times10^4$ cm$^{-1}$, the average density of excited excess carriers is estimated to be approximately $5\times10^{16}$ cm$^{-3}$. Also, when the absorption coefficient α is $1\times10^5$ cm$^{-1}$, the average density of excited excess carriers is estimated to be approximately $1\times10^{17}$ cm$^{-3}$.

Based on results of the time-resolved PL measurements, PL intensity was found by time-integrating transient response of PL emission from the multi-quantum wells at 4 K and integrated intensity I(4K) was found by further integrating the PL intensity with respect to emission energy, and when the integrated intensity I(4K) was taken to be 1, similar integrated intensity I(300K) at 300 K was 60% of I(4K).

Also, at 300 K, based on data obtained by the time-resolved PL measurements (without a polarizing filter) and assuming that the pulse energy density per unit area was 510 nJ/cm², PL lifetime was determined from the transient response (decay curve) of the PL intensity after pulse excitation with respect to time. If the PL lifetime is defined to be the time from maximum intensity on the decay curve of the PL intensity to the time when 1/e the maximum intensity is reached, the PL lifetime τ(PL) was 2.5 nsec. Also, radiative recombination lifetime τ(R) was 4.1 ns and non-radiative recombination lifetime τ(NR) was 6.3 ns. The radiative recombination lifetime τ(R) was determined from the expression τ(R)=τ(PL)/η, where η was internal quantum efficiency. Also, the non-radiative recombination lifetime τ(NR) was determined from the expression τ(NR)=τ(PL)/(1−η).

The value of the internal quantum efficiency obtained in the present example were much higher than conventionally known values, and so were the values of the non-radiative recombination lifetime τ(NR) and PL lifetime τ(PL). This confirms high quality of the nitride semiconductor crystals fabricated by the technique according to the present invention. To clarify this point, dependence of PL principles and internal quantum efficiency on excitation light intensity will be described below.

Figure 15:
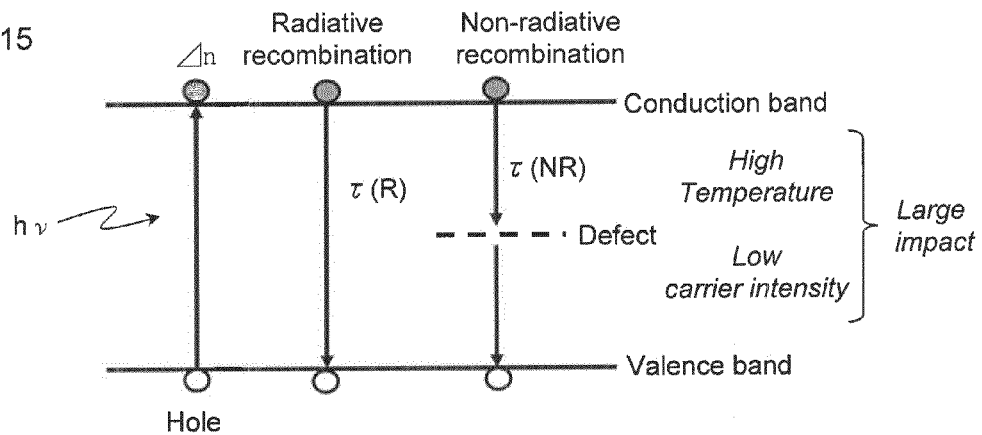
FIG. 15 is a band diagram for illustrating radiative recombination and non-radiative recombination which occur in a semiconductor crystal.

FIG. 15 is a band diagram for illustrating radiative recombination and non-radiative recombination which occur in a semiconductor crystal. As shown in FIG. 15, an electron-hole pair excited and generated by light with energy hv is annihilated through either radiative recombination in which the electron and hole directly recombine with each other between the lower end of a conduction band and upper end of valence band, thereby releasing the energy as light, or non-radiative recombination in which the electron and hole recombine with each other via a defect level formed within a forbidden band, thereby releasing the energy in a form other than light (mainly as heat).

In relation to this process, the "radiative recombination lifetime τ(R)" is defined to be the time required for carriers generated by excitation light generated by excitation light to decrease in total number to 1/e the initial number through radiative recombination. Similarly, the "non-radiative recombination lifetime τ(NR)" is defined to be the time required for carriers generated by excitation light to decrease in total number to 1/e the initial number through non-radiative recombination.

The internal quantum efficiency η is given by η=1/(1+τ(R)/τ(NR)). Thus, shorter τ(R) and longer τ(NR) result in a higher internal quantum efficiency n.

The time-resolved PL technique described above is used to observe the transient response of emission of electron-hole pairs generated by optical pulse excitation. If τ(PL) is the time required for decaying PL emission to reach 1/e the maximum intensity, τ(PL) is determined by competition between radiative recombination and non-radiative recombination, and is given by 1/τ(PL)=1/τ(R)+1/τ(NR).

If a specimen has poor crystallinity with large quantities of crystal defects, non-radiative recombination tends to occur more frequently than radiative recombination. Consequently, τ(NR) is short, and so is τ(PL) accordingly.

When a specimen has good crystallinity, even though non-radiative recombination makes a minor contribution, if τ(R) is short, so is τ(PL). On the other hand, if a specimen has good crystallinity with small quantities of crystal defects, τ(NR) is long, and so is τ(PL) accordingly.

Since a non-radiative recombination process is a thermal excitation type, the higher the temperature, the larger the contribution of the non-radiative recombination process. Thus, when measurements are taken with the specimen temperature set at cryogenic temperatures, the contribution (influence) of the non-radiative recombination process will be almost negligible. For this reason, in experimentally determining the internal quantum efficiency η, relative values of luminous intensity at room temperatures are often used with luminous intensity at cryogenic temperatures taken as 1. Furthermore, the contribution of the non-radiative recombination process increases with decreases in generated carrier density. In other words, the non-radiative recombination process saturates with increases in carrier density, increasing the contribution of the non-radiative recombination process in relative terms. Consequently, the internal quantum efficiency η tends to increase in appearance.

Figure 16:
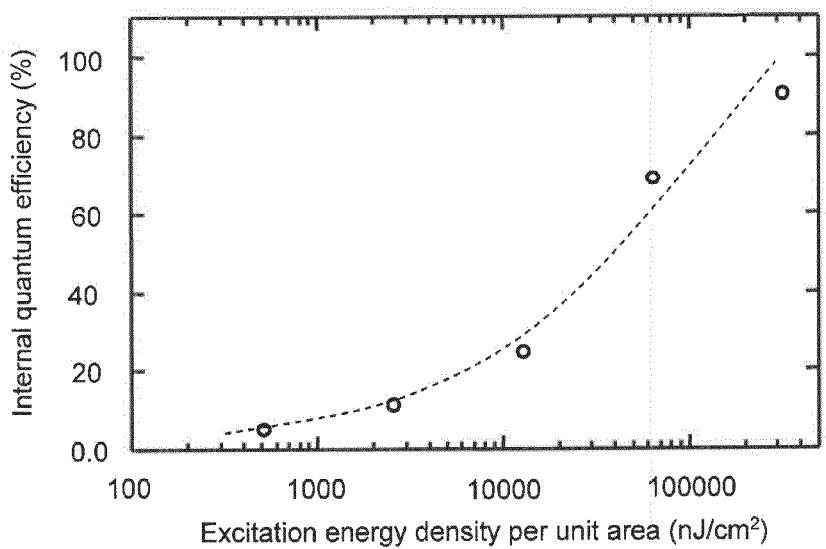
FIG. 16 is a diagram showing results of experiments conducted to check excitation energy density dependence of internal quantum efficiency of a multi-quantum well structure excited by optical pulses.

FIG. 16 is a diagram showing results of experiments conducted to check energy density dependence of internal quantum efficiency of a multi-quantum well structure excited by optical pulses. As can be seen from the results shown in FIG. 16, when excited energy density is as low as 500 nJ/cm², the internal quantum efficiency is very low, on the order of a few percent. However, even if the specimen is the same, when the excited energy density is high, such as above 300,000 nJ/cm², the internal quantum efficiency reaches 90% or above.

This means that in order to properly measure crystallinity of one specimen against another's using the PL technique, it is necessary to use conditions of low excited energy density in which the influence of the non-radiative recombination process is reflected strongly. That is, for evaluation by the PL technique, it is necessary to use low excited energy density, such as 2,000 nJ/cm² or below, and set the excess carrier density generated by light between about $5\times10^{16}$ (cm$^{-3}$) and $5\times10^{17}$ (cm$^{-3}$).

In more than a few cases, PL evaluations reported conventionally are not based on such basic studies, and are often performed under conditions of high excited energy density, i.e., essentially under conditions in which photoexcited excess carrier density generated in an active layer structure is excessively high. However, if internal quantum efficiency is determined under such conditions, proper evaluation of crystallinity is not possible, resulting only in "apparently" high values which do not reflect crystal quality.

Thus, the PL measurements under low excitation density conditions as referred to herein mean that a nitride semiconductor formed on a nonpolar, principal nitride plane of a base at least includes a layer which can be regarded as an optically active layer structure and that PL measurements are taken by setting photogenerated excess carrier density in the active layer structure between about $5\times10^{16}$ (cm$^{-3}$) and $5\times10^{17}$ (cm$^{-3}$). Furthermore, when the active layer structure is a multi-quantum well active layer, the PL measurements as referred to herein are taken by setting average photoexcited excess carrier density in all the quantum well layers between about $5\times10^{16}$ (cm$^{-3}$) and $5\times10^{17}$ (cm$^{-3}$)

Thus, in order to properly evaluate crystallinity, it is necessary to reduce the photoexcited excess carrier density in the active layer structure, or in the quantum well layers in the case of a multi-quantum well active layer structure, by changing the photoexcited energy density or photoexcited power density appropriately when the structure of an object to be measured changes.

In the present example, PL measurements were taken under low excitation energy density conditions, and CW-PL measurements indicated an integrated intensity of 58% (I(300K)/I(13K)=58%) at an excitation power density of 150 W/cm² while time-resolved PL measurements indicated an integrated intensity of 93% (I(300K)/I(4K)=93%) at an excitation energy density of 1400 nJ/cm², and 60% (I(300K)/I(4K)=60%) at an excitation energy density of 510 nJ/cm². This means that the nitride semiconductor crystal fabricated by the method according to the present invention has much higher crystallinity than conventional nitride semiconductor crystals.

COMPARATIVE EXAMPLE 8

Figure 2H:
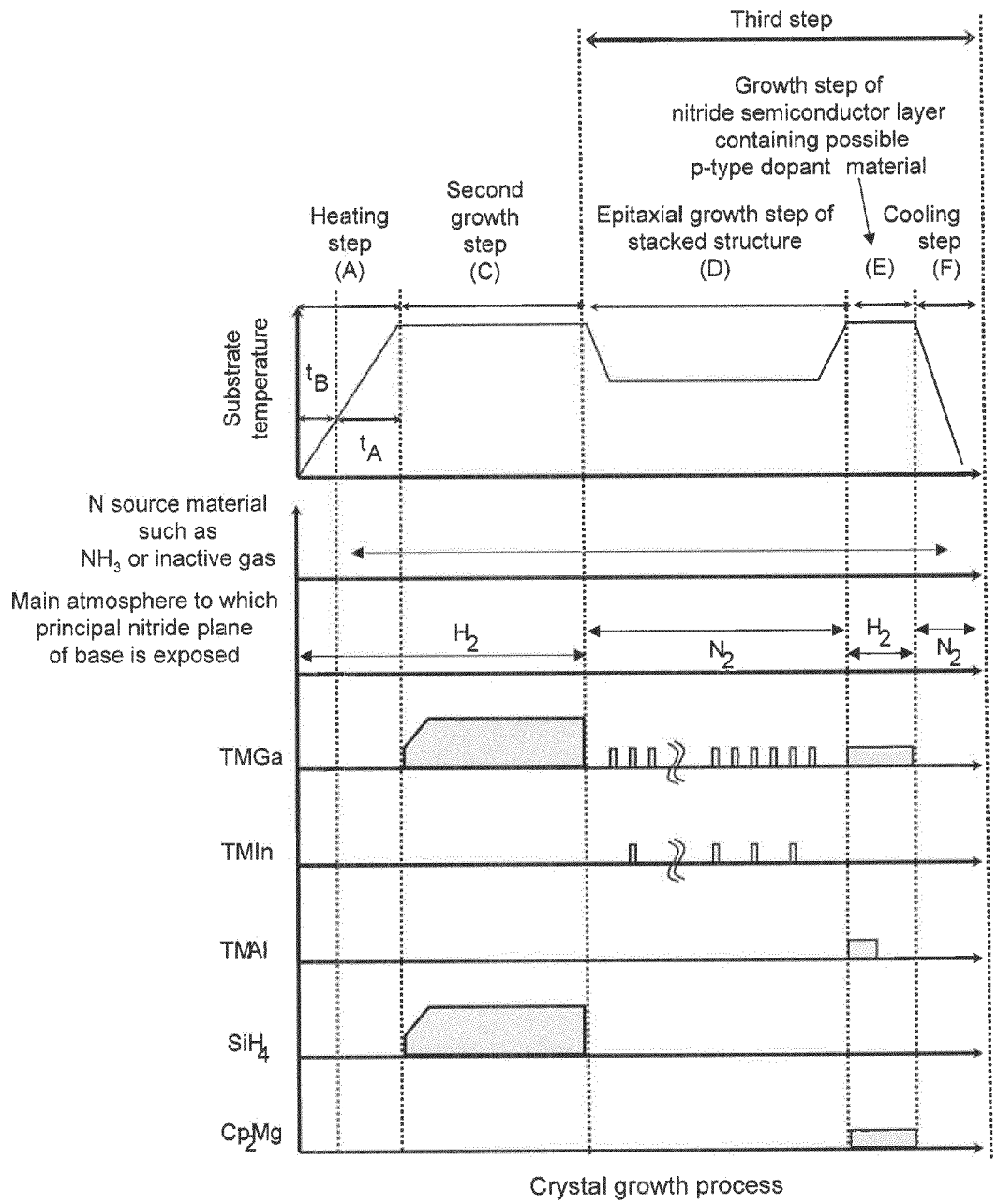
FIG. 2(H) is a diagram for illustrating an exemplary sequence of a nitride semiconductor crystal growth method according to Comparative Example 8.

In the present comparative example, a stack of gallium nitride-based semiconductor thin films was grown by the MOCVD process and a near ultraviolet LED was fabricated. A series of crystal growth processes is outlined in FIG. 2(H). Also, a layer structure after growth is schematically shown in FIG. 3(C).

The base used was a (1-100) m-plane oriented freestanding GaN substrate. The substrate measured 4.0 mm in the c-axis direction and 15 mm in the a-axis direction. Regarding electrical characteristics, the substrate was n-type and carrier density was $7.0\times10^{17}$ cm$^{-3}$. As a result of X-ray diffraction, the full-width at half maximum of a (10-12) reflection rocking curve was 37.5 arcsec., OFF angle in the c(+) direction was −0.28 degrees, and OFF angle in the a direction was 0.03 degrees. Also, the dislocation density was $5.0\times10^{6}$ cm$^{-2}$.

The m-plane freestanding GaN substrate was placed on a tray (susceptor) in a horizontal quartz reactor which normally operates under conditions of normal pressure. The pressure in the reactor was 100±2 kPa in all steps.

In the heating step (step A), first, in the first heating step $t_B$, the base was heated by supplying H$_2$ as a main flow into the reactor at 10 L/min. When the temperature of the base reached 400° C., the second heating step $t_A$ was started. In the second heating step, NH$_3$ was supplied as a constituent gas of the first main flow at 7.5 L/min. and H₂ was supplied as a constituent gas of the second main flow at 12.5 L/min.

Subsequently, the substrate temperature was further raised to 1,000° C. by increasing NH₃ and H₂ to 10 L/min. and 30 L/min., respectively. Meanwhile, a subflow of N₂ was supplied at 20 L/min. and a non-growth-related flow of N₂ was supplied for purge and other purposes at 19 L/min. in total. In the second heating step, the flow ratio Fp of the inactive gas component to all the constituent gases of the main flow was 0 throughout the entire heating step.

Next, the first growth step (step B) was omitted.

In the second growth step (step C) next, the same conditions as in Comparative Example 7 were used except that N₂ and H₂ were supplied at 0 L/min and 40 L/min, respectively as a constituent gases of the first main flow and that the thickness of the Si-doped GaN layer (second nitride semiconductor layer) was 4 μm. In so doing, Fp=0.0.

In step D of the third step, exactly the same conditions as in Comparative Example 7 were used.

In step E of the third step, exactly the same conditions as in Comparative Example 7 were used.

When the growth steps were finished, the substrate temperature was lowered and the gases in the reactor were completely replaced with N₂. Then, the substrate was taken out and evaluated.

The surface of the substrate thus fabricated had severe irregularities. When the surface was measured with a contact-type surface roughness gage, Ra=244 nm, indicating an extremely poor flatness. Also, when PL characteristics were measured under excitation by a laser beam with a wavelength of 325 nm, the peak wavelength was 422 nm and integrated intensity of the PL characteristics was as low as 10 in relative value.

Table 4 summarizes the average thicknesses (nm) of the quantum well layers (w1 to w8) of the comparative specimen, the average thicknesses having been obtained by observing HAADF-STEM images using the same procedures as in Example 8 and Comparative Example 7, where w1 is the average thickness of the lowest quantum well layer (on the substrate side) and w8 is the average thickness of the highest quantum well layer (on the front side). At the same time, the table also shows the standard deviation and coefficient of variation of the thickness of each layer.

TABLE 4

| Quantum well layer | Average thickness (nm) | Standard deviation (nm) | Coefficient of variation |
|---|---|---|---|
| w8 | 4.81 | 0.82 | 0.171 |
| w7 | 5.03 | 0.71 | 0.140 |
| w6 | 4.91 | 0.73 | 0.149 |
| w5 | 4.87 | 0.64 | 0.132 |
| w4 | 4.84 | 0.68 | 0.141 |
| w3 | 4.81 | 0.70 | 0.145 |
| w2 | 4.52 | 0.65 | 0.145 |
| w1 | 4.65 | 0.71 | 0.152 |

COMPARATIVE EXAMPLE 9

Figure 2I:
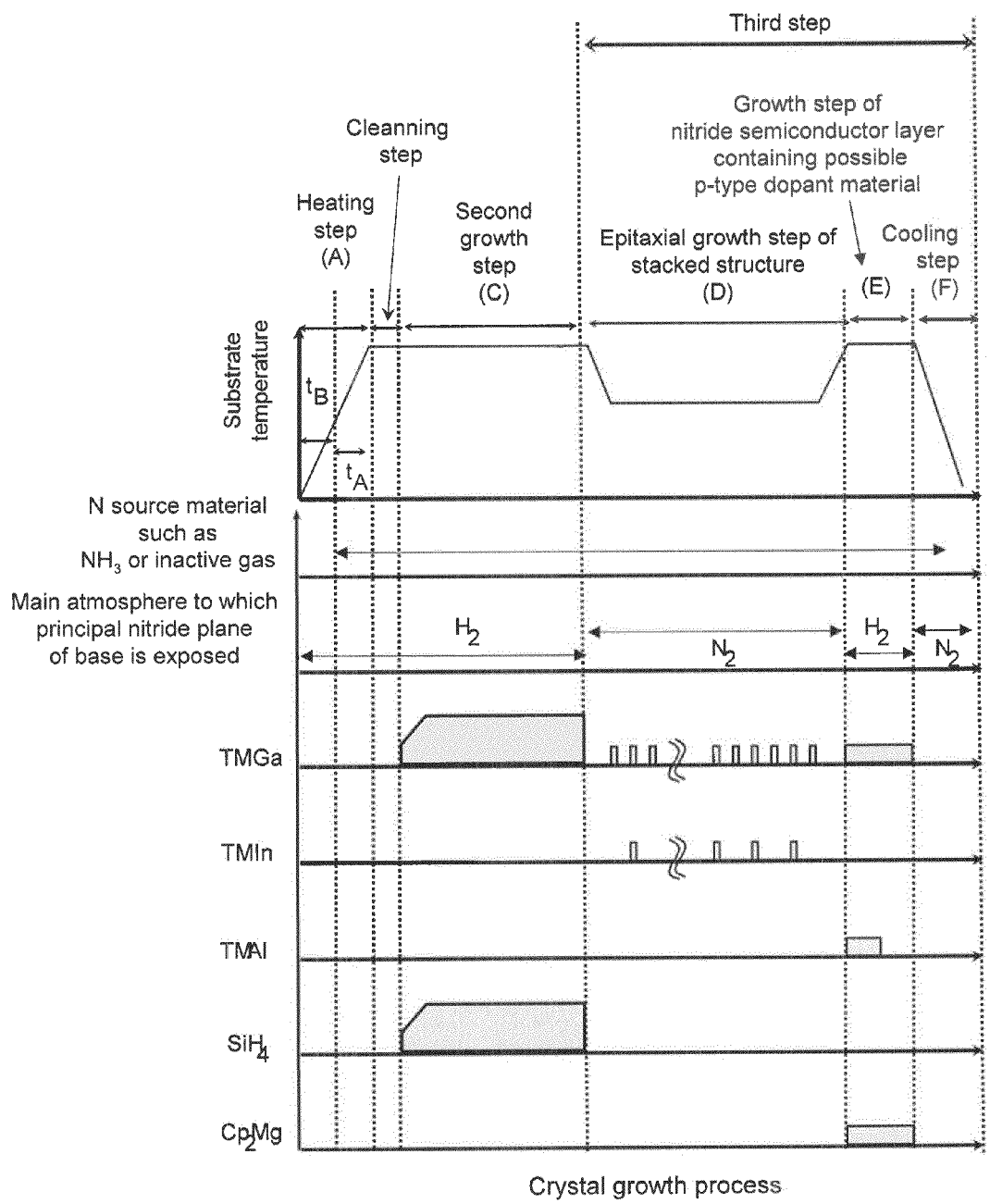
FIG. 2(I) is a diagram for illustrating an exemplary sequence of a nitride semiconductor crystal growth method according to Comparative Example 9.

In the present comparative example, a stack of gallium nitride-based semiconductor thin films was grown by the MOCVD process and a near ultraviolet LED was fabricated. A series of crystal growth processes is outlined in FIG. 2(I). Also, a layer structure after growth is schematically shown in FIG. 3(C).

The base used was a (1-100) m-plane oriented freestanding GaN substrate. The substrate measured 3.9 mm in the c-axis direction and 15 mm in the a-axis direction. Regarding electrical characteristics, the substrate was n-type and carrier density was $7.4 \times 10^{17}$ cm⁻³. As a result of X-ray diffraction, the full-width at half maximum of a (10-12) reflection rocking curve was 36.5 arcsec., OFF angle in the c(+) direction was −0.31 degrees, and OFF angle in the a direction was 0.02 degrees. Also, the dislocation density was $5.2 \times 10^6$ cm⁻².

The m-plane freestanding GaN substrate was placed on a tray (susceptor) in a horizontal quartz reactor which normally operates under conditions of normal pressure. The pressure in the reactor was 100±2 kPa in all steps.

The heating step (step A) was carried out in the same manner as in Comparative Example 8.

After the substrate temperature reached 1,000° C., NH₃ and H₂ were continued to be supplied at 10 L/min and 30 L/min, respectively. After a wait of 15 minutes in this state, the substrate surface was cleaned. Meanwhile, a subflow of N₂ gas was supplied at 20 L/min. and a non-growth-related flow of N₂ gas was supplied for purge and other purposes at 19 L/min. in total.

The first growth step (step B) was omitted, as in the case of Comparative Example 8.

The second growth step (step C) was carried out in the same manner as in Comparative Example 8 except that the film thickness was 50 nm.

Step D of the third step was carried out in the same manner as in Comparative Example 8.

Step E of the third step was carried out in the same manner as in Comparative Example 8.

When the growth steps were finished, the substrate temperature was lowered and the gases in the reactor were completely replaced with N₂. Then, the substrate was taken out and evaluated.

The surface of the substrate thus fabricated had severe irregularities and poor flatness. Ra was 85 nm. Also, when PL characteristics were measured under excitation by a laser beam with a wavelength of 325 nm, the peak wavelength was 400 nm and PL intensity was 1, which was extremely low.

Table 5 summarizes the average thicknesses (nm) of the quantum well layers (w1 to w8) of the comparative specimen, the average thicknesses having been obtained by observing HAADF-STEM images using the same procedures as in Example 8 and comparative examples 7 and 8, where w1 is the average thickness of the lowest quantum well layer (on the substrate side) and w8 is the average thickness of the highest quantum well layer (on the front side). At the same time, the table also shows the standard deviation and coefficient of variation of the thickness of each layer.

TABLE 5

| Quantum well layer | Average thickness (nm) | Standard deviation (nm) | Coefficient of variation |
|---|---|---|---|
| w8 | 3.62 | 0.51 | 0.142 |
| w7 | 3.87 | 0.49 | 0.127 |
| w6 | 3.90 | 0.48 | 0.123 |
| w5 | 3.97 | 0.46 | 0.116 |
| w4 | 4.02 | 0.54 | 0.134 |
| w3 | 4.04 | 0.47 | 0.115 |
| w2 | 4.05 | 0.49 | 0.122 |
| w1 | 4.12 | 0.50 | 0.122 |

As can be seen from the standard deviations and CV values of the thicknesses of the quantum well layers in Example 8 and Comparative Examples 7, 8, and 9, it is obvious that the standard deviations and coefficients of variation of the thicknesses in the Y-axis direction have large values when the Fp is small in steps B and C. These standard deviations as well as coefficients of variation were averaged within each example and summarized in Table 6.

TABLE 6

| Specimen | Standard deviation (nm) | | | Coefficient of variation (average value) | | |
| --- | --- | --- | --- | --- | --- | --- |
| | Minimum value | Average value | Maximum value | Minimum value | Average value | Maximum value |
| Example 8 | 0.21 | 0.28 | 0.31 | 0.059 | 0.076 | 0.085 |
| Comparative Example 7 | 0.51 | 0.57 | 0.73 | 0.107 | 0.118 | 0.143 |
| Comparative Example 8 | 0.64 | 0.71 | 0.82 | 0.132 | 0.146 | 0.171 |
| Comparative Example 9 | 0.46 | 0.49 | 0.54 | 0.115 | 0.125 | 0.142 |

As can be seen from Table 6, with the specimen in Example 8, the standard deviations and coefficients of variation of the thicknesses are 0.28 and 0.076, respectively, in terms of average value, meaning that fluctuations in the film thickness is much smaller than those of Comparative Examples 7 to 9. When the thicknesses of the quantum well layers are not uniform, the emission spectrum becomes wider, resulting in reduced luminous efficiency. Thus, the smaller the standard deviation and coefficient of variation of thickness, the more desirable it is, and to realize a GaN-based LED with high efficiency and high power, preferably the standard deviation is 0.45 nm or less and the coefficient of variation is 0.1 or less.

COMPARATIVE EXAMPLE 10

In the present comparative example, the light emission characteristics of multi-quantum well (MQW) layers fabricated by various crystal growth methods were evaluated by the photoluminescence (PL) technique.

Figure 2J:
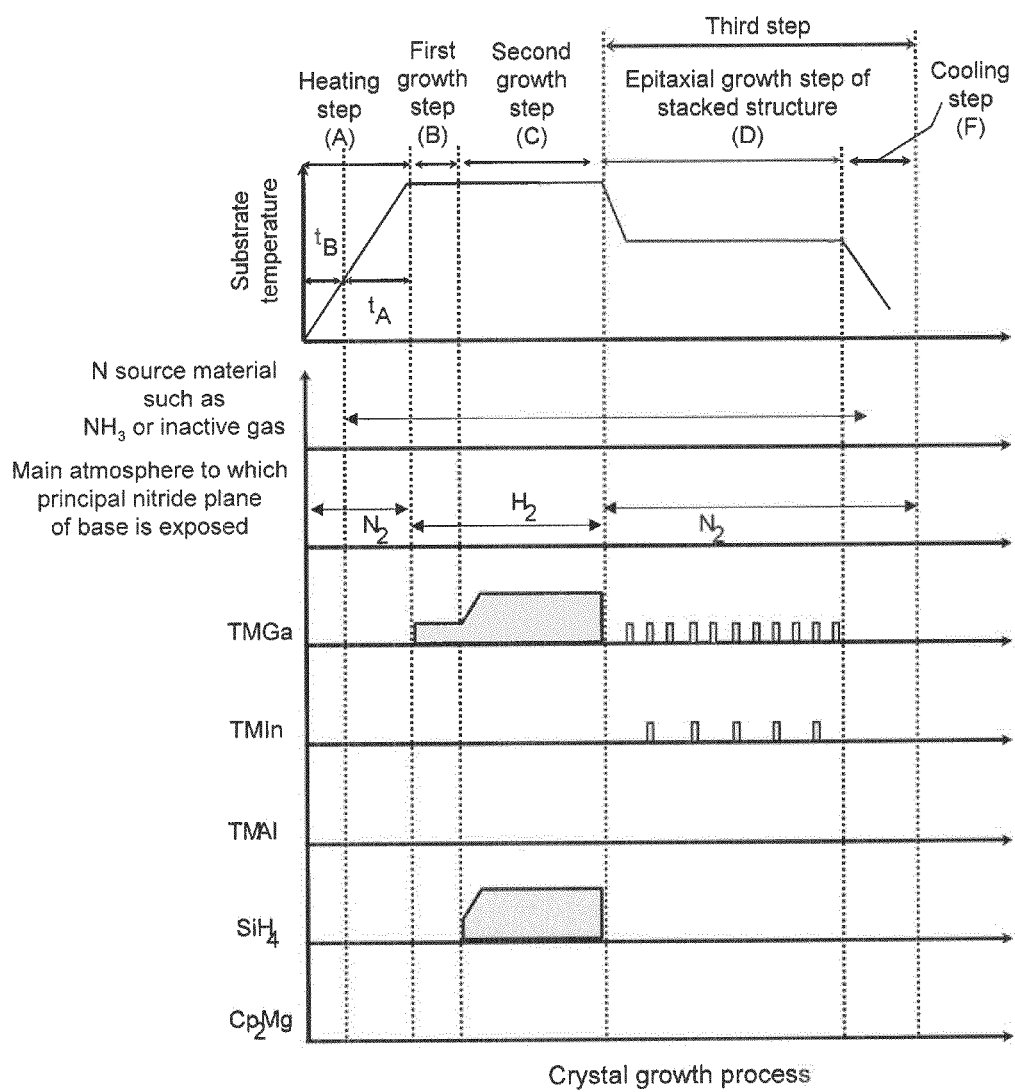
FIG. 2(J) is a diagram for illustrating an exemplary sequence of a nitride semiconductor crystal growth method according to Comparative Example 10.

FIG. 3(E) is a diagram showing a stacked structure of a specimen used in the present comparative example and FIG. 2(J) is a diagram for illustrating a sequence of the crystal growth method for the specimen. In this specimen, no Mg-doped layer is provided on the MQW structure, and a 5-period InGaN/GaN multi-quantum well active layer structure 13 is provided in the uppermost layer.

The base used was a (1-100) m-plane oriented freestanding GaN substrate. The substrate measured 4.1 mm in the c-axis direction and 18 mm in the a-axis direction. The substrate had been doped with Si whose concentration was $6.2 \times 10^{17}$ $cm^{-3}$. Regarding electrical characteristics, the substrate was n-type and carrier density was $6.5 \times 10^{17}$ $cm^{-3}$. As a result of X-ray diffraction, the full-width at half maximum of a (10-12) reflection rocking curve was 32.2 arcsec., OFF angle in the c(+) direction was −0.125 degrees, and OFF angle in the a direction was 0.02 degrees. Also, the dislocation density was $5.0 \times 10^6$ $cm^{-2}$.

The m-plane freestanding GaN substrate was placed on a tray (susceptor) in a horizontal quartz reactor which normally operates under conditions of normal pressure, and a quantum well structure was fabricated.

The heating step (step A) was carried out in the same manner as in Example 10.

The first growth step (step B) was carried out in the same manner as in Example 10.

The second growth step (step C) was carried out in the same manner as in Example 10 except that the thickness of the second semiconductor layer (Si-doped, n-type GaN layer) was 2.5 μm.

Step D of the third step was carried out in the same manner as in Example 10.

Step E of the third step was omitted.

When the growth steps were finished, the substrate temperature was lowered and the gases in the reactor were completely replaced with $N_2$. Then, the substrate was taken out and evaluated.

When the surface of the substrate thus fabricated was measured with a contact-type surface roughness gage, Ra=185 nm, indicating severe irregularities. Also, when PL characteristics were measured at room temperature under excitation by a laser beam with a wavelength of 325 nm, the peak wavelength was 397 nm and integrated intensity of the PL characteristics was as low as 37 in relative value. The internal quantum efficiency and PL emission lifetime of the specimen were evaluated in the following manner.

The PL characteristics of the specimen with the above-described structure were evaluated. The same optical system setup as in Example 10 was used for the evaluation. First, the internal quantum efficiency was evaluated using CW-PL measurements as well as time-resolved PL measurements under irradiation with pulsed light.

The optical system was as shown in FIG. 12. As in the case of Example 10, specimen temperature was in the range of 13 K to 300 K and laser power per unit area on the specimen surface was 150 $W/cm^2$. Under these conditions, photoexcited steady state excess carrier density was estimated to be in the range of $1 \times 10^{16}$ $cm^{-3}$ to $1 \times 10^{17}$ $cm^{-3}$.

Based on results of the CW-PL measurements, integrated intensity I(13K) was found by integrating the PL intensity from multi-quantum wells at 13 K with respect to luminous energy, and when the integrated intensity I(13K) was taken to be 1, similar integrated intensity I(300K) at 300 K was 39% of I(13K).

Next, time-resolved PL measurements (without a polarizing filter) were carried out using the setup shown in FIG. 14.

The pulse repetition frequency was 1 kHz and pulse width was 120 fs. The wavelength of the tunable pulsed laser was 370 nm and the pulse energy density per unit area was 510 $nJ/cm^2$.

Based on results of the time-resolved PL measurements, PL intensity was found by time-integrating transient response of PL emission from the multi-quantum wells at 4 K and integrated intensity I(4K) was found by further integrating the PL intensity with respect to emission energy, and when the integrated intensity I(4K) was taken to be 1, similar integrated intensity I(300K) at 300 K was 27% of I(4K).

Also, at 300 K, based on data obtained by the time-resolved PL measurements (without a polarizing filter) and assuming that the pulse energy density per unit area was 510 $nJ/cm^2$, PL lifetime was determined from the transient response (decay curve) of the PL intensity after pulse excitation with respect to time, and the PL lifetime τ(PL) was 1.8 nsec. Also, radiative recombination lifetime τ(R) was 6.7 ns and non-radiative recombination lifetime τ(NR) was 2.4 ns. As a result, it turned out that τ(R)>τ(NR).

COMPARATIVE EXAMPLE 11

In the present comparative example, the light emission characteristics of multi-quantum well (MQW) layers fabricated by various crystal growth methods were evaluated by the photoluminescence (PL) technique.

Figure 2K:
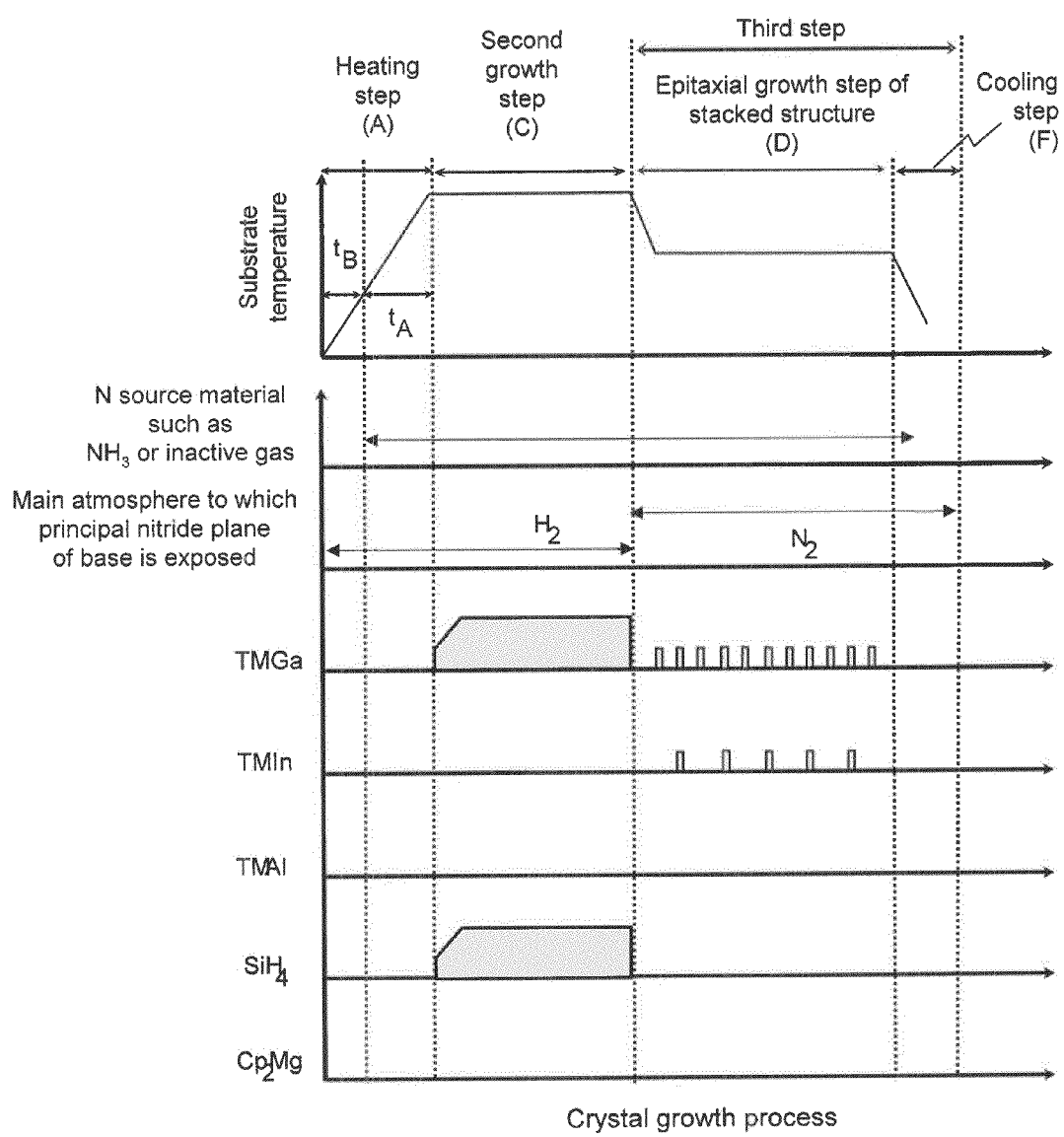
FIG. 2(K) is a diagram for illustrating an exemplary sequence of a nitride semiconductor crystal growth method according to Comparative Example 11.
Figure 3F:
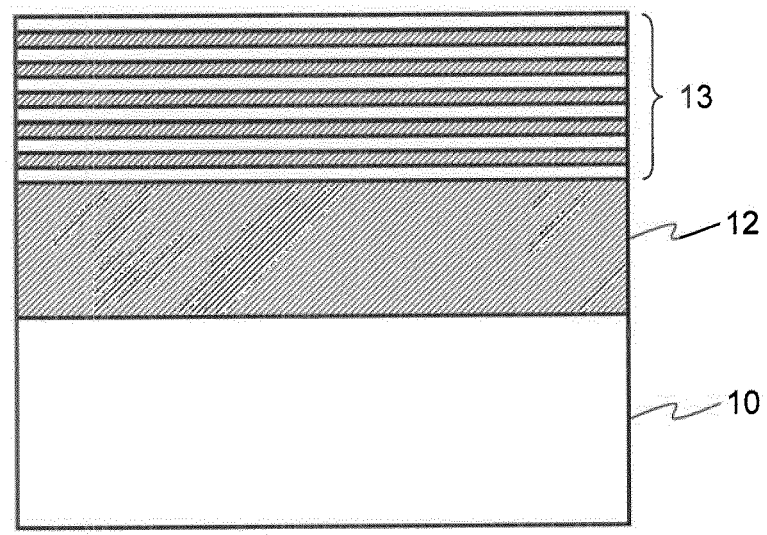
FIG. 3(F) is a simplified sectional view for illustrating an example of a nitride semiconductor according to Comparative Examples 11 and 12.

FIG. 3(F) is a diagram showing a stacked structure of a specimen used in the present comparative example and FIG. 2(K) is a diagram for illustrating a sequence of the crystal growth method for the specimen. In this specimen, no Mg-doped layer is provided on the MQW structure, and a 5-period InGaN/GaN multi-quantum well active layer structure 13 is provided in the uppermost layer.

The base used was a (1-100) m-plane oriented freestanding GaN substrate. The substrate measured 4.5 mm in the c-axis direction and 20 mm in the a-axis direction. The substrate had been doped with Si whose concentration was $6.2 \times 10^{17}$ cm$^{-3}$. Regarding electrical characteristics, the substrate was n-type and carrier density was $6.5 \times 10^{17}$ cm$^{-3}$. As a result of X-ray diffraction, the full-width at half maximum of a (10-12) reflection rocking curve was 35 arcsec., OFF angle in the c(+) direction was −0.095 degrees, and OFF angle in the a direction was 0.03 degrees. Also, the dislocation density was $5.0 \times 10^6$ cm$^{-2}$.

The m-plane freestanding GaN substrate was placed on a tray (susceptor) in a horizontal quartz reactor which normally operates under conditions of normal pressure, and a quantum well structure was fabricated.

The heating step (step A) was carried out in the same manner as in Example 10.

The first growth step (step B) was omitted.

The second growth step (step C) was carried out in the same manner as in Example 10 except that the thickness of the second semiconductor layer (Si-doped, n-type GaN layer) was 2.5 μm.

Step D of the third step was carried out in the same manner as in Example 10.

Step E of the third step was omitted.

When the growth steps were finished, the substrate temperature was lowered and the gases in the reactor were completely replaced with $N_2$ gas. Then, the substrate was taken out and evaluated.

When the surface of the substrate thus fabricated was measured with a contact-type surface roughness gage, Ra=230 nm, indicating severe irregularities. Also, when PL characteristics were measured at room temperature under excitation by a laser beam with a wavelength of 325 nm, the peak wavelength was 455 nm and integrated intensity of the PL characteristics was 6 in relative value, indicating a low PL intensity.

The PL characteristics of the specimen with the above-described structure were evaluated. The same optical system setup as in Example 10 was used for the evaluation. First, the internal quantum efficiency was evaluated using CW-PL measurements as well as time-resolved PL measurements under irradiation with pulsed light.

The optical system shown in FIG. 12 was used. As in the case of Example 10, specimen temperature was in the range of 13 K to 300 K and laser power per unit area on the specimen surface was 150 W/cm$^2$. Under these conditions, photoexcited steady state excess carrier density was estimated to be in the range of $1 \times 10^{16}$ cm$^{-3}$ to $1 \times 10^{17}$ cm$^{-3}$.

Based on results of the CW-PL measurements, integrated intensity I(13K) was found by integrating the PL intensity from multi-quantum wells at 13 K with respect to luminous energy, and when the integrated intensity I(13K) was taken to be 1, similar integrated intensity I(300K) at 300 K was 46% of I(13K).

Next, time-resolved PL measurements (without a polarizing filter) were carried out using the setup shown in FIG. 14.

The pulse repetition frequency was 1 kHz and pulse width was 120 fs. The wavelength of the tunable pulsed laser was 370 nm and the pulse energy density per unit area was 510 nJ/cm$^2$.

Based on results of the time-resolved PL measurements, PL intensity was found by time-integrating transient response of PL emission from the multi-quantum wells at 4 K and integrated intensity I(4K) was found by further integrating the PL intensity with respect to emission energy, and when the integrated intensity I(4K) was taken to be 1, similar integrated intensity I(300K) at 300 K was 36% of I(4K).

Also, at 300 K, based on data obtained by the time-resolved PL measurements (without a polarizing filter) and assuming that the pulse energy density per unit area was 510 nJ/cm$^2$, PL lifetime was determined from the transient response (decay curve) of the PL intensity after pulse excitation with respect to time, and the PL lifetime t(PL) was 1.7 nsec. Also, radiative recombination lifetime τ(R) was 4.8 ns and non-radiative recombination lifetime τ(NR) was 2.7 ns. As a result, it turned out that τ(R)>τ(NR).

COMPARATIVE EXAMPLE 12

In the present comparative example, the light emission characteristics of multi-quantum well (MQW) layers fabricated by various crystal growth methods were evaluated by the photoluminescence (PL) technique.

Figure 2L:
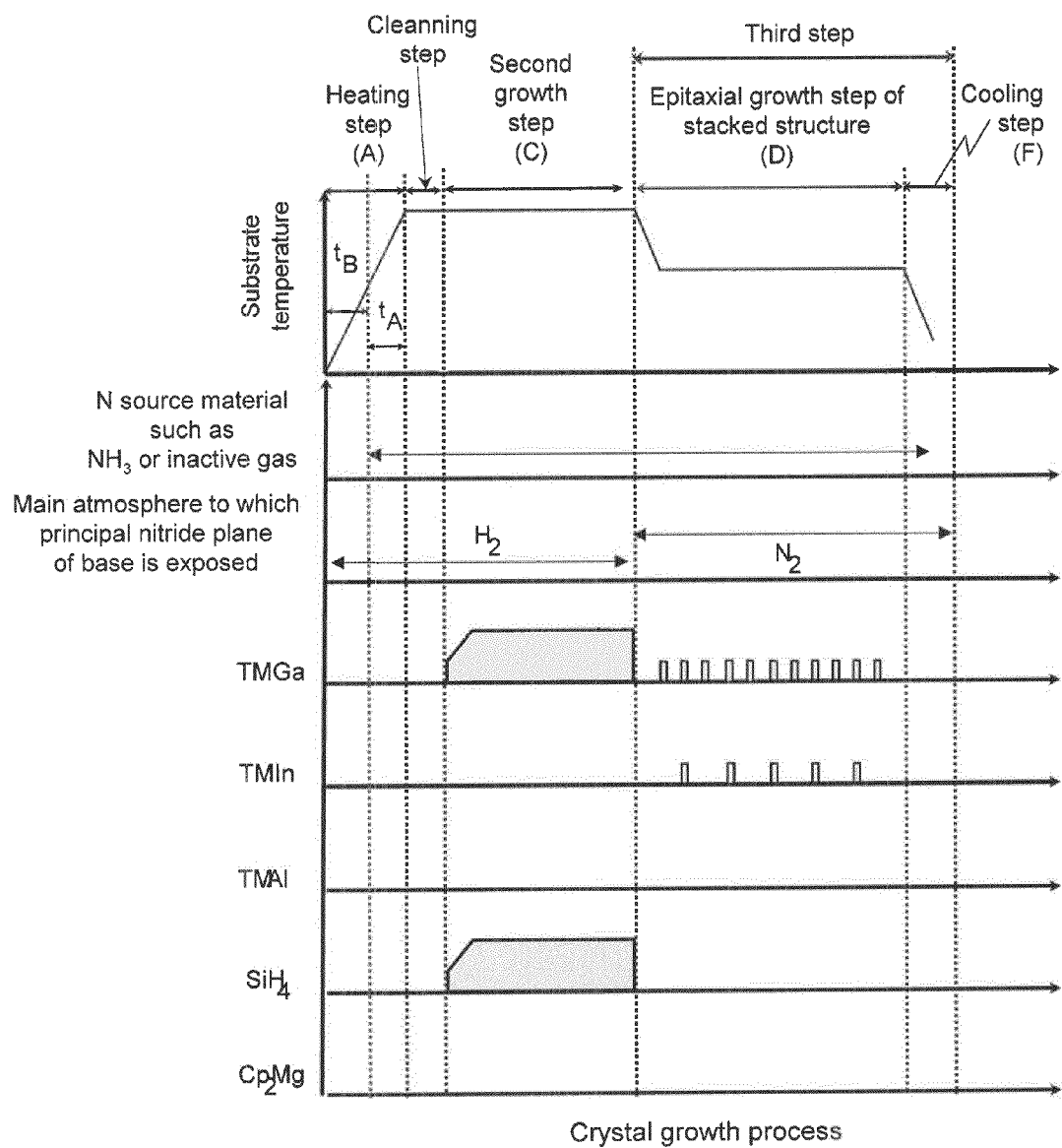
FIG. 2(L) is a diagram for illustrating an exemplary sequence of a nitride semiconductor crystal growth method according to Comparative Example 12.

FIG. 3(F) is a diagram showing a stacked structure of a specimen used in the present comparative example and FIG. 2(L) is a diagram for illustrating a sequence of the crystal growth method for the specimen. In this specimen, no Mg-doped layer is provided on the MQW structure, and a 5-period InGaN/GaN multi-quantum well active layer structure 13 is provided in the uppermost layer.

The base used was a (1-100) m-plane oriented freestanding GaN substrate. The substrate measured 4.0 mm in the c-axis direction and 19 mm in the a-axis direction. The substrate had been doped with Si whose concentration was $6.2 \times 10^{17}$ cm$^{-3}$. Regarding electrical characteristics, the substrate was n-type and carrier density was $6.5 \times 10^{17}$ cm$^{-3}$. As a result of X-ray diffraction, the full-width at half maximum of a (10-12) reflection rocking curve was 31 arcsec., OFF angle in the c(+) direction was −0.085 degrees, and OFF angle in the a direction was 0.05 degrees. Also, the dislocation density was $4.9 \times 10^6$ cm$^{-2}$.

The m-plane freestanding GaN substrate was placed on a tray (susceptor) in a horizontal quartz reactor which normally operates under conditions of normal pressure, and a quantum well structure was fabricated.

The heating step (step A) was carried out in the same manner as in Comparative Example 11.

After the substrate temperature reached 1,000° C., there was a 15-minute wait period with gas flow and other conditions kept constant, the substrate temperature kept at 1,000° C., and Fp kept at 0. Then, the substrate surface was cleaned of organic matter and the like.

The first growth step (step B) was omitted, as in the case of Comparative Example 11.

The second growth step (step C) was carried out in the same manner as in Comparative Example 11 except that the thickness of the second semiconductor layer (Si-doped, n-type GaN layer) was 0.05 nm.

Step D of the third step was carried out in the same manner as in Comparative Example 11.

Step E of the third step was omitted.

When the growth steps were finished, the substrate temperature was lowered and the gases in the reactor were completely replaced with $N_2$. Then, the substrate was taken out and evaluated.

When the surface of the substrate thus fabricated was measured with a contact-type surface roughness gage, Ra=78 nm, indicating severe irregularities. Also, when PL characteristics were measured at room temperature under excitation by a laser beam with a wavelength of 325 nm, the peak wavelength was 433 nm and integrated intensity of the PL characteristics was 3 in relative value, indicating an extremely low PL intensity.

The PL characteristics of the specimen with the above-described structure were evaluated. The same optical system setup as in Example 10 was used for the evaluation. First, the internal quantum efficiency was evaluated using CW-PL measurements as well as time-resolved PL measurements under irradiation with pulsed light.

The optical system shown in FIG. 12 was used. As in the case of Example 10, specimen temperature was in the range of 13 K to 300 K and laser power per unit area on the specimen surface was 150 W/cm². Under these conditions, photoexcited steady state excess carrier density was estimated to be in the range of $1\times10^{16}$ cm$^{-3}$ to $1\times10^{17}$ cm$^{-3}$.

Based on results of the CW-PL measurements, integrated intensity I(13K) was found by integrating the PL intensity from multi-quantum wells at 13 K with respect to luminous energy, and when the integrated intensity I(13K) was taken to be 1, similar integrated intensity I(300K) at 300 K was 10% of I(13K).

Next, time-resolved PL measurements (without a polarizing filter) were carried out using the setup shown in FIG. 14.

The pulse repetition frequency was 1 kHz and pulse width was 120 fs. The wavelength of the tunable pulsed laser was 370 nm and the pulse energy density per unit area was 510 nJ/cm².

Based on results of the time-resolved PL measurements, PL intensity was found by time-integrating transient response of PL emission from the multi-quantum wells at 4 K and integrated intensity I(4K) was found by further integrating the PL intensity with respect to emission energy, and when the integrated intensity I(4K) was taken to be 1, similar integrated intensity I(300K) at 300 K was 16% of I(4K).

Also, at 300 K, based on data obtained by the time-resolved PL measurements (without a polarizing filter) and assuming that the pulse energy density per unit area was 510 nJ/cm², PL lifetime was determined from the transient response (decay curve) of the PL intensity after pulse excitation with respect to time, and the PL lifetime τ(PL) was 0.66 nsec. Also, radiative recombination lifetime τ(R) was 4.1 ns and non-radiative recombination lifetime τ(NR) was 0.78 ns. As a result, it turned out that τ(R)>τ(NR).

REFERENCE EXAMPLE 1

In the present reference example, the light emission characteristics of multi-quantum well (MQW) layers fabricated on a conventionally used C-plane were evaluated by the photoluminescence (PL) technique.

Figure 2M:
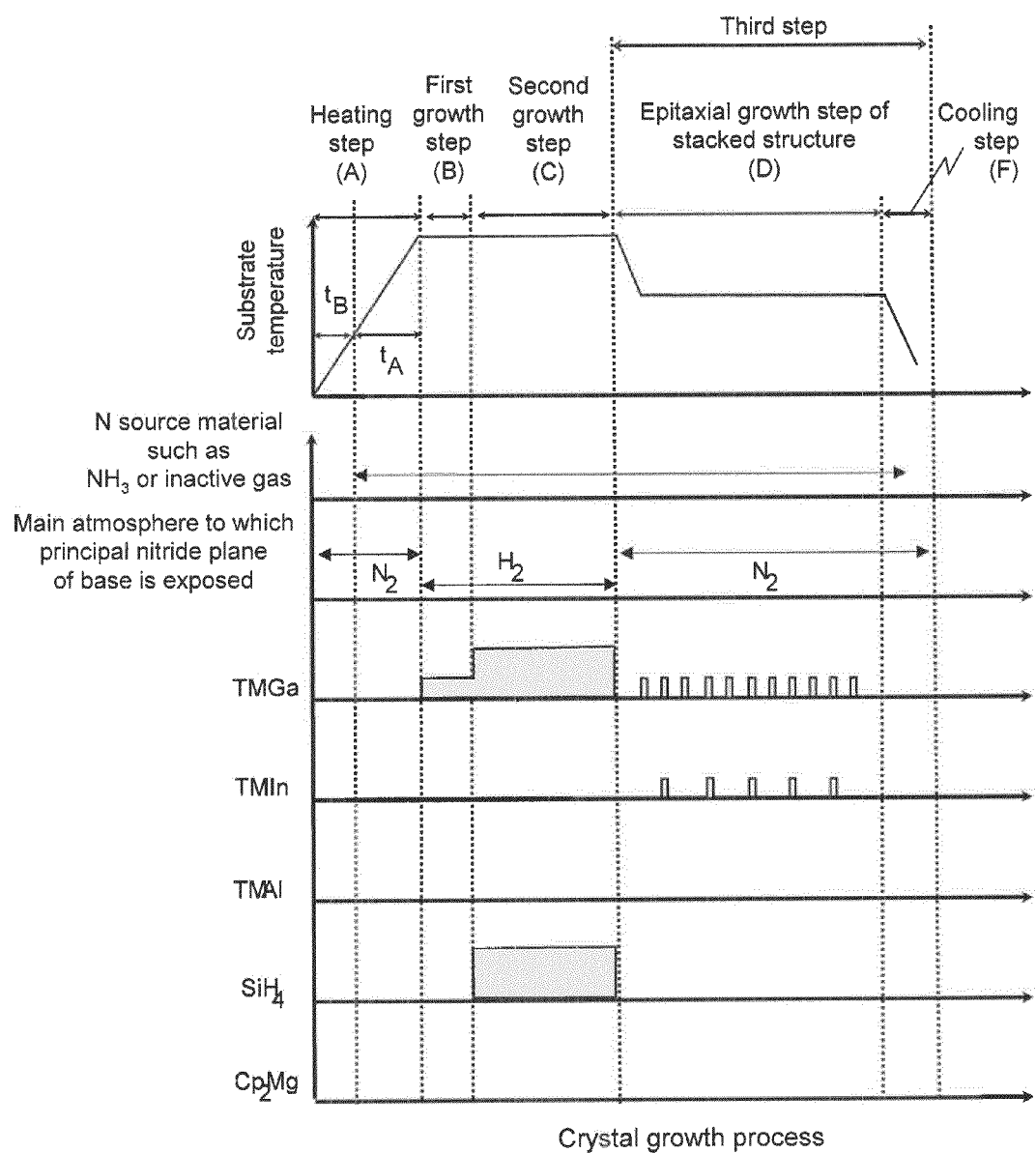
FIG. 2(M) is a diagram for illustrating an exemplary sequence of a nitride semiconductor crystal growth method according to Reference Example 1.

FIG. 3(E) is a diagram showing a stacked structure of a specimen used in the present reference example and FIG. 2(M) is a diagram for illustrating a sequence of the crystal growth method for the specimen. In this specimen, no Mg-doped layer is provided on the MQW structure, and a 5-period InGaN/GaN multi-quantum well active layer structure 13 is provided in the uppermost layer. Incidentally, the substrate used for the stacked structure shown in FIG. 3(E) is also denoted by reference numeral 10 as in the case of the m-plane GaN substrate.

The base used was a (0001) c-plane oriented freestanding GaN substrate 10. The substrate was 48 mm in diameter. The substrate had been doped with Si whose concentration was $1.5\times10^{17}$ cm$^{-3}$. Regarding electrical characteristics, the substrate was n-type and carrier density was $1.5\times10^{17}$ cm$^{-3}$. As a result of X-ray diffraction, the full-width at half maximum of a (10-12) reflection rocking curve was 45 arcsec., OFF angle in the m direction was 0.205 degrees, and OFF angle in the a direction was 0.310 degrees. Also, the dislocation density was $7.0\times10^6$ cm$^{-2}$.

The c-plane freestanding GaN substrate was placed on a tray (susceptor) in a horizontal quartz reactor which normally operates under conditions of normal pressure, and a quantum well structure was fabricated.

The heating step (step A) was carried out in the same manner as in Comparative Example 10.

The first growth step (step B) was carried out in the same manner as in Comparative Example 10.

The second growth step (step C) was carried out in the same manner as in Comparative Example 10 except that the thickness of the second semiconductor layer (Si-doped, n-type GaN layer) was 4 μm.

Step D of the third step was carried out in the same manner as in Comparative Example 10 except that the substrate temperature was 780° C.

Step E of the third step was omitted.

When the growth steps were finished, the substrate temperature was lowered and the gases in the reactor were completely replaced with $N_2$. Then, the substrate was taken out and evaluated. Incidentally, according to studies conducted by the present inventors, the sequence described above provides a crystal growth method which brings out best characteristics in growth on c-plane GaN substrates.

When the surface of the substrate thus fabricated was measured with a contact-type surface roughness gage, Ra=12 nm, indicating an extremely flat surface. Also, when PL characteristics were measured at room temperature under excitation by a laser beam with a wavelength of 325 nm, the peak wavelength was 405 nm and integrated intensity of the PL characteristics was 16 in relative value, indicating a low PL intensity.

The PL characteristics of the specimen with the above-described structure were evaluated. The same optical system setup as in Example 10 was used for the evaluation. First, the internal quantum efficiency was evaluated using CW-PL measurements as well as time-resolved PL measurements under irradiation with pulsed light.

The optical system shown in FIG. 12 was used. As in the case of Example 10, specimen temperature was in the range of 13 K to 300 K and laser power per unit area on the specimen surface was 150 W/cm². Under these conditions, photoexcited steady state excess carrier density was estimated to be in the range of $1\times10^{16}$ cm$^{-3}$ to $1\times10^{17}$ cm$^{-3}$.

Based on results of the CW-PL measurements, integrated intensity I(13K) was found by integrating the PL intensity from multi-quantum wells at 13 K with respect to luminous energy, and when the integrated intensity I(13K) was taken to be 1, similar integrated intensity I(300K) at 300 K was 9% of I(13K).

Next, time-resolved PL measurements (without a polarizing filter) were carried out using the setup shown in FIG. 14.

The pulse repetition frequency was 1 kHz and pulse width was 120 fs. The wavelength of the tunable pulsed laser was 370 nm and the pulse energy density per unit area was 510 nJ/cm$^2$.

Based on results of the time-resolved PL measurements, PL intensity was found by time-integrating transient response of PL emission from the multi-quantum wells at 4 K and integrated intensity I(4K) was found by further integrating the PL intensity with respect to emission energy, and when the integrated intensity I(4K) was taken to be 1, similar integrated intensity I(300K) at 300 K was 5% of I(4K).

Also, at 300 K, based on data obtained by the time-resolved PL measurements (without a polarizing filter) and assuming that the pulse energy density per unit area was 510 nJ/cm$^2$, PL lifetime was determined from the transient response (decay curve) of the PL intensity after pulse excitation with respect to time, and the PL lifetime $\tau$(PL) was 1.2 nsec. Also, radiative recombination lifetime $\tau$(R) was 21.9 ns and non-radiative recombination lifetime $\tau$(NR) was 1.3 ns. As a result, it turned out that $\tau$(R)>$\tau$(NR).

Measurement results of PL specimens (MQW) in Example 10, Comparative Examples 10 to 12, and reference Example 1 above are summarized in Table 7 below.

TABLE 7

| PL specimen (MQW) | Internal quantum efficiency CW: % | Internal quantum efficiency pulse: % | PL lifetime $\tau$(PL): ns | Radiative recombination lifetime $\tau$(R): ns | Non-radiative recombination lifetime $\tau$(NR): ns |
| --- | --- | --- | --- | --- | --- |
| Example 10 | 58 | 60 | 2.5 | 4.1 | 6.3 |
| Comparative Example 10 | 39 | 27 | 1.8 | 6.7 | 2.4 |
| Comparative Example 11 | 46 | 36 | 1.7 | 4.8 | 2.7 |
| Comparative Example 12 | 10 | 16 | 0.66 | 4.1 | 0.78 |
| Reference Example 1 | 9 | 5 | 1.2 | 21.9 | 1.3 |

As can be seen from Table 7, the internal quantum efficiency in Example 10 was sufficiently high—58% as a result of CW measurements and 60% as a result of pulse measurements—whereas in all the comparative examples, the internal quantum efficiency was less than 50% as a result of both measurements. This indicates that in the crystal growth sequence according to the present invention, the part related to the initial stage of growth greatly affects even the quality of the active layers formed subsequently. To improve LED characteristics, the higher the internal quantum efficiency, the better. However, a LED with good characteristics can be realized if the internal quantum efficiency is 50% or above. Also, in terms of the PL lifetime ($\tau$(PL)), the specimen in Example 10 is far superior to the other specimens. This also is a result of good optical quality. Desirably, the PL lifetime is 2 nanoseconds (ns) or above.

In the case of m-plane substrates, $\tau$(R) is generally somewhere around 4 ns, and there is not much difference among the example and comparative examples except Comparative Example 10, but in the case of a c-plane substrate, $\tau$(R) is extremely long. This is because of electrons and holes which contribute to light emission are spatially separated due to the QCSE effect and is disadvantageous for luminous efficiency.

This demonstrates that the use of the m-plane for a substrate allows radiation to be generated efficiently.

Regarding $\tau$(NR), among the example and comparative examples (Example 10 and Comparative Examples 10, 11, and 12) related to the m-plane, $\tau$(NR) is extremely long in Example 10. This indicates that the carriers annihilated without contributing to light emission are small in number. Looking at which of $\tau$(R) and $\tau$(NR) is longer in the example and comparative examples, $\tau$(R)<$\tau$(NR) only in Example 10. This indicates that generated carriers contribute effectively to light emission. Thus, in order to realize a LED with good characteristics, it is extremely desirable that $\tau$(R)<$\tau$(NR).

EXAMPLE 11

Figure 2N:
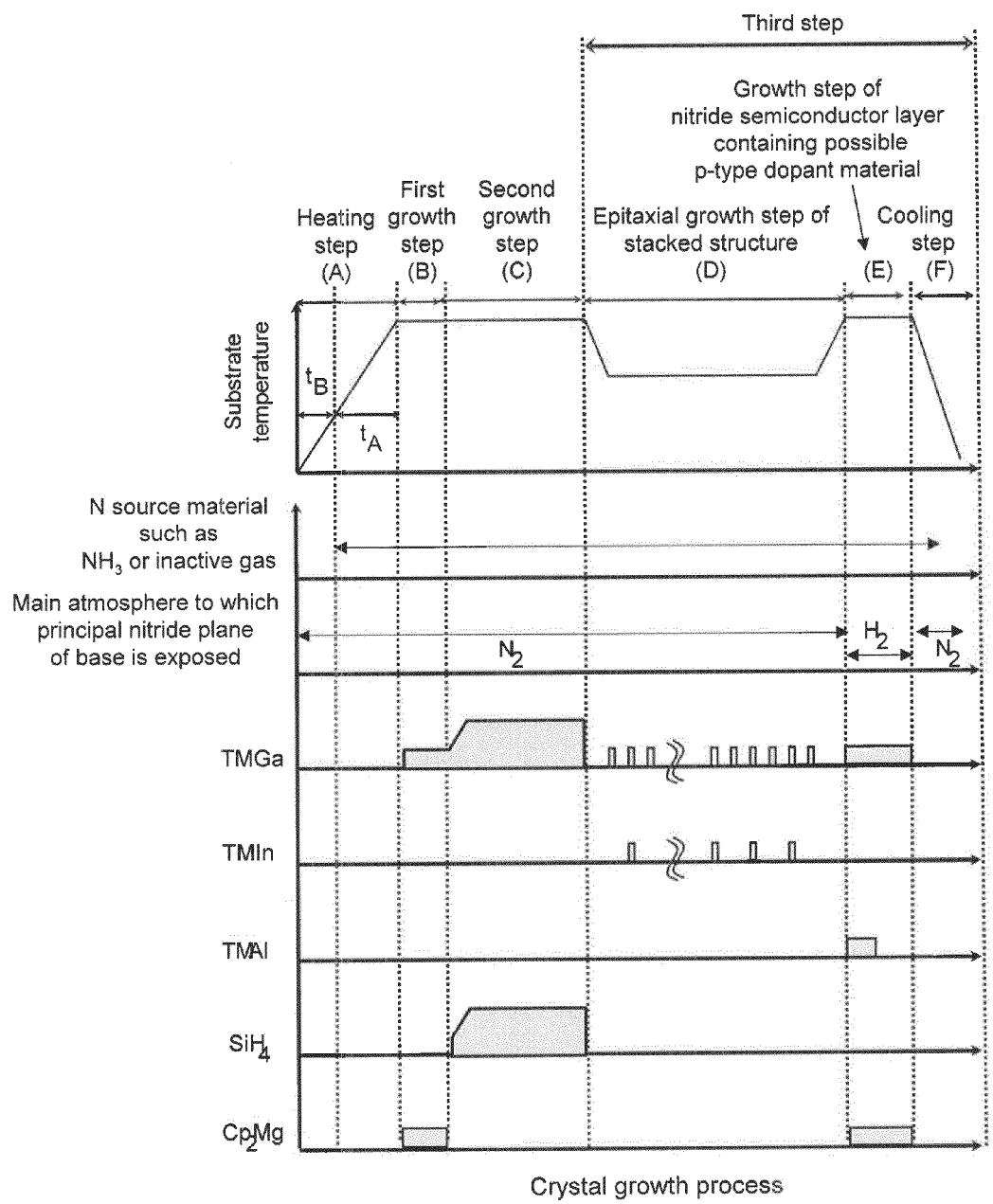
FIG. 2(N) is a diagram for illustrating an exemplary sequence of a nitride semiconductor crystal growth method according to Example 11.
Figure 3G:
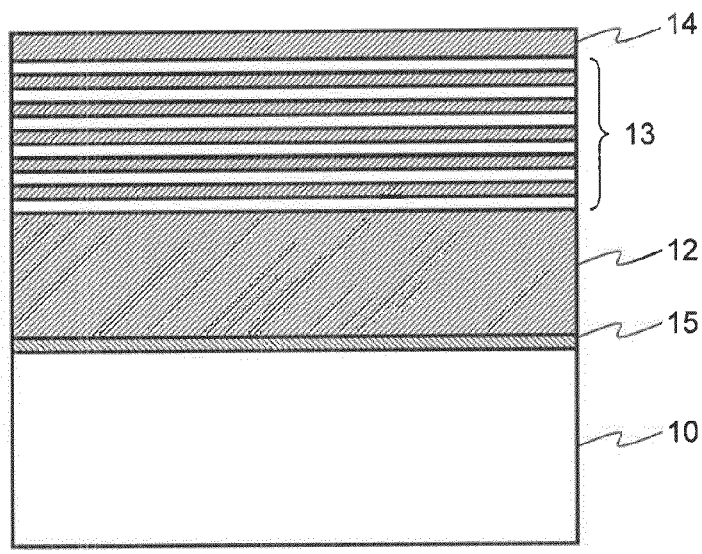
FIG. 3(G) is a simplified sectional view for illustrating an example of a nitride semiconductor according to Example 11.

In the present example, a stack of gallium nitride-based semiconductor thin films was grown by the MOCVD process and a near ultraviolet LED was fabricated. A series of crystal growth processes is outlined with reference to FIG. 2(N). Also, a layer structure after growth is schematically shown in FIG. 3(G).

The base used was a (1-100) m-plane oriented freestanding GaN substrate. The substrate measured 3.8 mm in the c-axis direction and 22 mm in the a-axis direction. Regarding electrical characteristics, the substrate was n-type and carrier density was 6.5×10$^{17}$ cm$^{-3}$. As a result of X-ray diffraction, the full-width at half maximum of a (10-12) reflection rocking curve was 34.2 arcsec., OFF angle in the c(+) direction was 0.25 degrees, and OFF angle in the a direction was 0.03 degrees. Also, the dislocation density was 5.0×10$^6$ cm$^{-2}$.

The m-plane freestanding GaN substrate was placed on a tray (susceptor) in a horizontal quartz reactor which normally operates under conditions of normal pressure. The pressure in the reactor was 100±2 kPa in all steps.

The heating step (step A) was carried out in the same manner as in Example 1.

In the first growth step (step B), NH$_3$ was supplied as a constituent gas of the first main flow at 10 L/min. As constituent gases of the second main flow, N$_2$ was supplied at 29.0 L/min. and H$_2$ was supplied at 1.0 L/min. Also, TMGa (at 0.0018 L/min. at a concentration of 100%) was supplied into the reactor using H$_2$ (0.5 L/min.) contained in the main flow, as a carrier gas. Furthermore, Cp$_2$Mg (7×10$^{-6}$ L/min.) was supplied into the reactor using H$_2$ (0.5 L/min.) contained in the main flow, as a carrier gas. By supplying these main flow gases, an Mg-doped GaN layer (first nitride semiconductor layer) with a doping concentration of 2×10$^{19}$ cm$^{-3}$ was grown to a thickness of 40 nm.

Meanwhile, a gas mixture (20.5 L/min.) of NH$_3$ (0.5 L/min.) and N$_2$ (20 L/min.) was supplied as a subflow. Also, a non-growth-related flow of N$_2$ was supplied for purge and other purposes at 19 L/min. During the growth of the first nitride semiconductor layer, the flow ratio Fp of the inactive gas component to all the constituent gases of the main flow was 0.72500.

The second growth step (step C), step D of the third step, and step E of the third step were carried out under the same conditions as in Example 1.

The surface of the substrate thus fabricated was extremely flat. The surface was measured with a contact-type surface roughness gage to determine average surface roughness or center line average roughness (Ra) which is an index of irregularity. As a result, Ra according to the present example was 4.9 nm. Also, when PL characteristics were measured under excitation by a laser beam with a wavelength of 325 nm, the peak wavelength was 391 nm and integrated intensity of the PL characteristics was 86 in relative value, indicating an extremely high intensity, and standard deviation of wavelength distribution in the surface was as small as 0.8%.

EXAMPLE 12

Figure 2O:
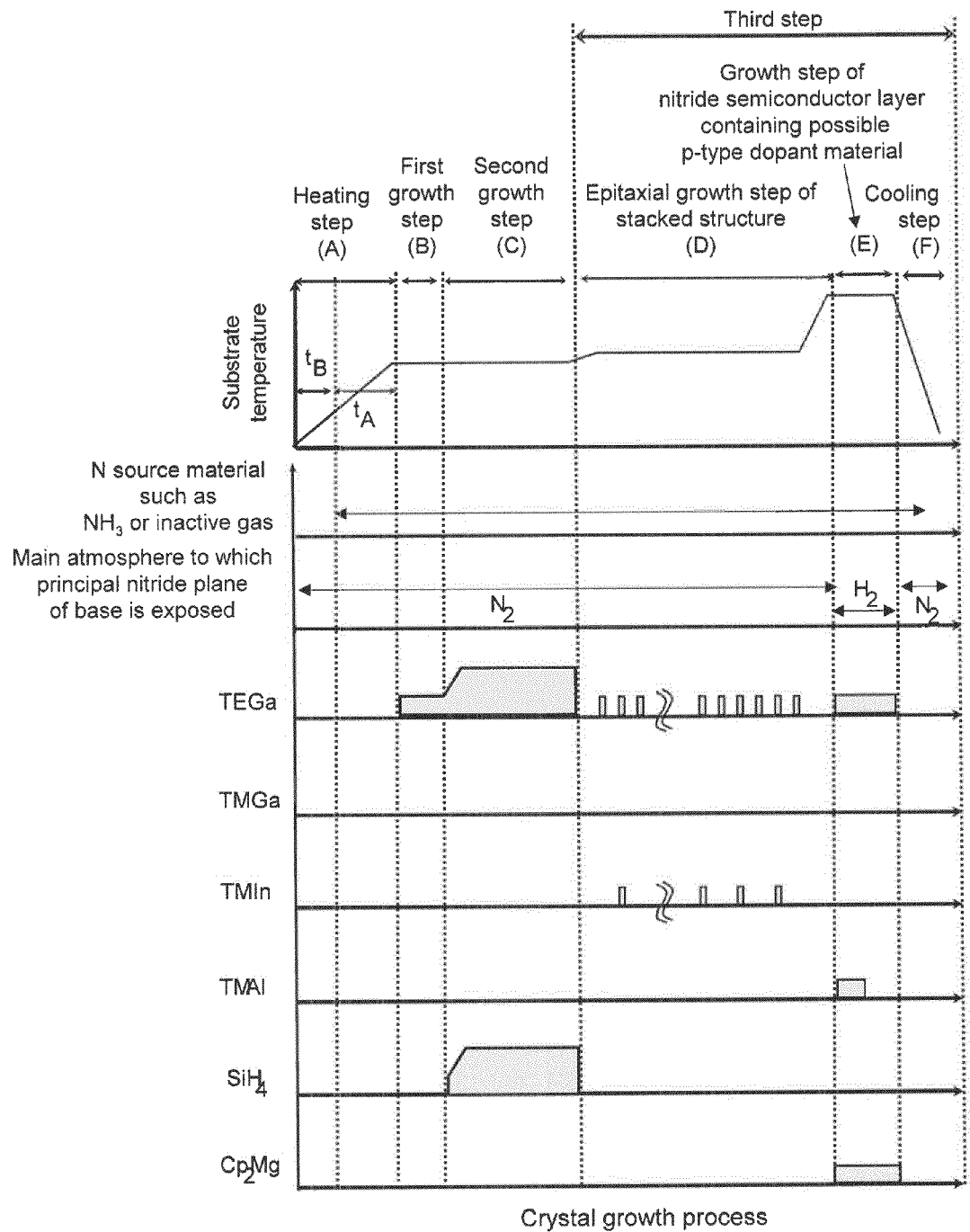
FIG. 2(O) is a diagram for illustrating an exemplary sequence of a nitride semiconductor crystal growth method according to Example 12.

In the present example, a stack of gallium nitride-based semiconductor thin films was grown by the MOCVD process and a near ultraviolet LED was fabricated. A series of crystal growth processes is outlined with reference to FIG. 2(O). Also, a layer structure after growth is schematically shown in FIG. 3(A).

The base used was a (1-100) m-plane oriented freestanding GaN substrate. The substrate measured 4.0 mm in the c-axis direction and 21 mm in the a-axis direction. Regarding electrical characteristics, the substrate was n-type and carrier density was $6.4 \times 10^{17}$ cm$^{-3}$. As a result of X-ray diffraction, the full-width at half maximum of a (10-12) reflection rocking curve was 41.0 arcsec., OFF angle in the c(+) direction was 0.09 degrees, and OFF angle in the a direction was 0.02 degrees. Also, the dislocation density was $5.0 \times 10^6$ cm$^{-2}$.

The m-plane freestanding GaN substrate was placed on a tray (susceptor) in a horizontal quartz reactor which normally operates under conditions of normal pressure. The pressure in the reactor was 100±2 kPa in all steps.

The heating step (step A) was carried out in the same manner as in Example 4.

The first growth step (step B), the second growth step (step C), step D of the third step, and step E of the third step subsequently were all carried out in the same manner as in Example 4 except that TMGa was replaced with TEG of the same flow rate.

When the growth steps were finished, the substrate temperature was lowered and the gases in the reactor were completely replaced with $N_2$. Then, the substrate was taken out and evaluated.

The surface of the substrate thus fabricated was extremely flat. The surface was measured with a contact-type surface roughness gage to determine average surface roughness or center line average roughness (Ra) which is an index of irregularity. As a result, Ra according to the present example was 3.0 nm. Also, when PL characteristics were measured under excitation by a laser beam with a wavelength of 325 nm, the peak wavelength was 391 nm and integrated intensity of the PL characteristics was 95 in relative value, indicating an extremely high intensity, and standard deviation of wavelength distribution in the surface was as small as 0.4%.

EXAMPLE 13

Figure 2P:
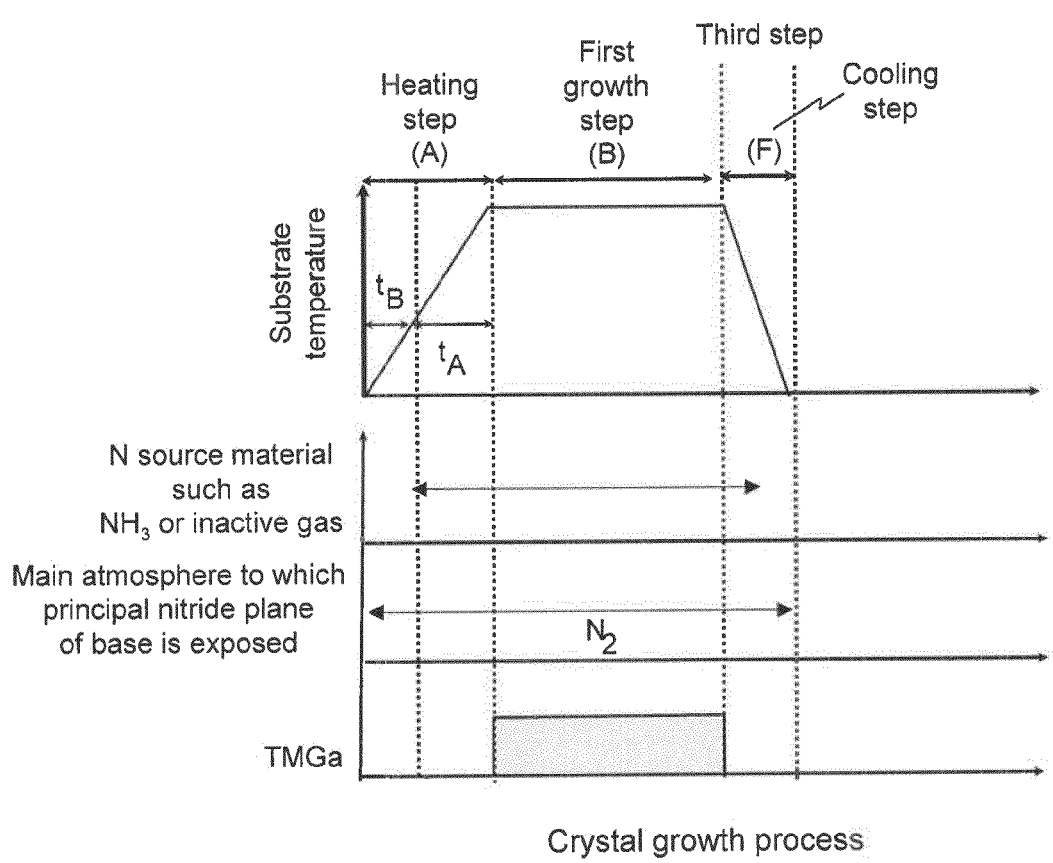
FIG. 2(P) is a diagram for illustrating an exemplary sequence of a nitride semiconductor crystal growth method according to Example 13.
Figure 3H:
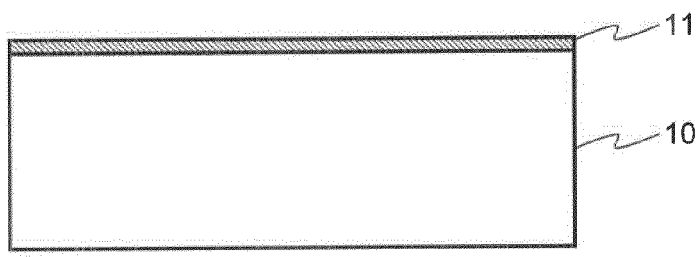
FIG. 3(H) is a simplified sectional view for illustrating an example of a nitride semiconductor according to Example 13.

In the present example, a layer of gallium nitride-based semiconductor thin film was grown by the MOCVD process to accurately evaluate growth temperature dependence of the flatness of the epitaxial layer. A series of crystal growth processes is outlined with reference to FIG. 2(P). Also, a layer structure after growth is schematically shown in FIG. 3(H).

Two (1-100) m-plane oriented freestanding GaN substrates were used as bases. The substrates are designated as specimen X and specimen Y.

The substrate used to fabricate specimen X measured 4.1 mm in the c-axis direction and 12 mm in the a-axis direction. Regarding electrical characteristics, the substrate was n-type and carrier density was $6.6 \times 10^{17}$ cm$^{-3}$. As a result of X-ray diffraction, the full-width at half maximum of a (10-12) reflection rocking curve was 34.2 arcsec., OFF angle in the c(+) direction was 0.25 degrees, and OFF angle in the a direction was 0.03 degrees. Also, the dislocation density was $5.0 \times 10^6$ cm$^{-2}$.

The substrate used to fabricate specimen Y measured 4.1 mm in the c-axis direction and 12 mm in the a-axis direction. Regarding electrical characteristics, the substrate was n-type and carrier density was $6.6 \times 10^{17}$ cm$^{-3}$. As a result of X-ray diffraction, the full-width at half maximum of a (10-12) reflection rocking curve was 34.2 arcsec., OFF angle in the c(+) direction was 0.25 degrees, and OFF angle in the a direction was 0.03 degrees. Also, the dislocation density was $5.0 \times 10^6$ cm$^{-2}$.

The m-plane freestanding GaN substrates were placed on a tray (susceptor) in a horizontal quartz reactor which normally operates under conditions of normal pressure. The pressure in the reactor was 100±2 kPa in all steps.

Regarding specimen X, the same procedures as in Example 1 were used except that the attainable temperature in the heating step was 1,000° C., that the thickness of the first nitride semiconductor layer in the first growth step was 0.25 μm, and epitaxial growth was ended only with the first growth step. Regarding specimen Y, the same procedures as in Example 1 were used except that the attainable temperature in the heating step was 920° C., that the thickness of the first nitride semiconductor layer in the first growth step was 0.25 μm, and epitaxial growth was ended only with the first growth step.

Figure 17A:
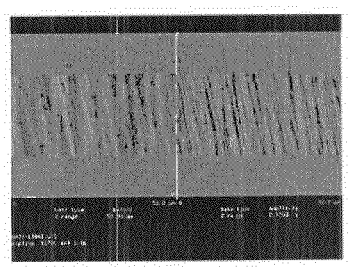
FIG. 17(A) is a diagram showing a surface AFM (atomic force microscopy) image of nitride semiconductor specimen X in Example 13.
Figure 17B:
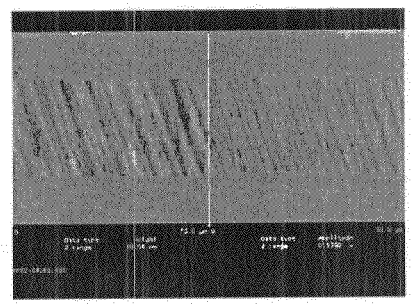
FIG. 17(B) is a diagram showing a surface AFM (atomic force microscopy) image of nitride semiconductor specimen Y in Example 13.

The surfaces of specimens X and Y thus fabricated were both extremely flat when observed under an optical microscope. To examine the surface flatness of the specimens closely, the surface morphology of the specimens was evaluated using an AFM (atomic force microscope). Results are shown in FIGS. 17(A) and 17(B), where FIG. 17(A) shows an AFM image of specimen X and FIG. 17(B) shows an AFM image of specimen Y. As can be seen from the AFM images, specimen Y is superior in surface flatness. In terms of Ra (center line average roughness) required by AFM as an index of irregularity, whereas specimen X had a moderate value of 1.303, specimen Y had an extremely large value of 0.093 nm. In terms of Rmax (maximum roughness depth), whereas specimen X had a moderate value of 7.469 nm, specimen Y had an extremely small value of 0.851 nm.

EXAMPLE 14

In the present example, using a multi-quantum well active layer structure in an epitaxial layer of a LED structure which, having been fabricated by the crystal growth method according to the present invention, emits near ultraviolet light, a before-and-after comparison of light emission was made by taking PL measurements of light emission from the multi-quantum well active layer structure before and after a post-processing activation step after cooling was carried out by means of heat annealing. Specifically, PL measurements were taken immediately after the third step was finished, then an epitaxial wafer formed on a nonpolar plane was subjected to heat annealing as a post-processing activation step after cooling in order to make part of doping Mg atoms act as acceptors, and subsequently PL measurements were taken. Regarding annealing conditions, the annealing was performed in an atmosphere of $N_2$ at 700° C. for 5 minutes.

Three specimens were used. The same growth conditions as in Example 1 were used except the attainable heating temperature in step A, temperature in steps B and C, and thickness of the InGaN quantum well layers. The specimens had extremely flat surface morphology. The attainable heating temperature in step A, temperature in steps B and C, and thickness of the InGaN quantum well layers for the specimens are shown in Table 8 below.

TABLE 8

| Specimen | Attainable heating temperature in step A (° C.) | Substrate temperature in steps B and C (° C.) | Thickness of InGaN quantum well layer (nm) |
|---|---|---|---|
| Specimen X | 1000 | 1000 | 4 |
| Specimen Y | 920 | 920 | 4 |
| Specimen Z | 920 | 920 | 12 |

Figure 18:
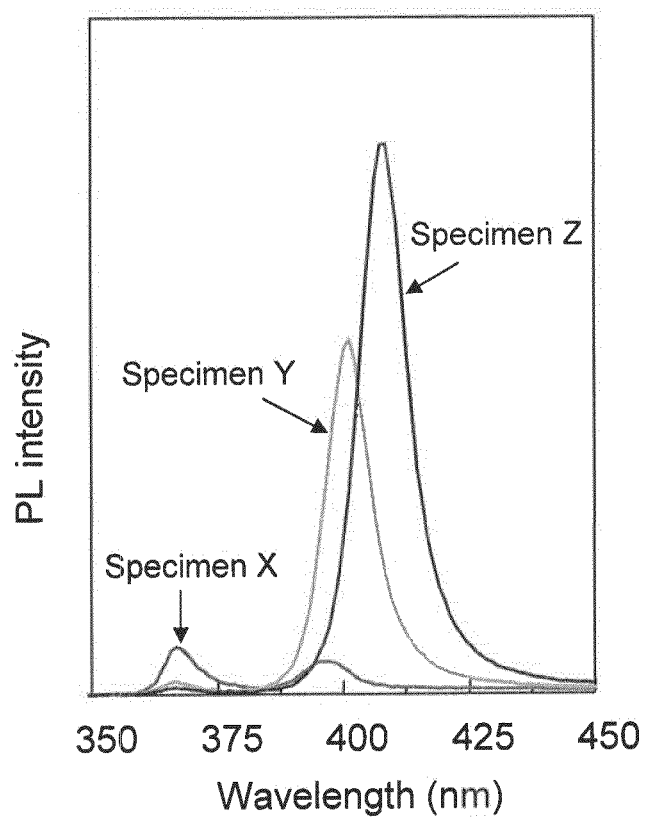
FIG. 18 is a diagram showing results of PL measurements in Example 14.

PL spectra of specimens X, Y, and Z subjected to heat annealing as a post-processing activation step after cooling are shown in FIG. 18. The PL intensities of specimens X, Y, and Z are reduced as a result of the annealing.

It is believed that the reductions in the PL intensities triggered by a thermal annealing process are attributable to the effects of changes in band structure and deterioration of crystallinity near the active layer structure caused by activation of Mg. In this case, since the former effect acts equally on all the specimens, it is believed that the extent of reductions in the PL intensities reflects the latter effect more greatly. The extent of reductions increases in the order: Z, Y, X. With specimen X, in particular, PL emission from the quantum well layer reduces greatly after annealing, and band-edge emission at near 365 nm from a GaN bulk layer stands out instead. On the other hand, fine spectrum shapes are maintained in the case of specimens Y and Z.

Normally, optimal growth temperatures for i-GaN or n-GaN film growth on a c-plane GaN crystal exist near 1,000° C. Crystal growth at lower temperatures causes decreased crystallinity, resulting in reduced luminous intensity of the active layer structure formed on the crystal. However, as described above, when a crystal was grown on a base which had a nonpolar principal plane, by growing a thick-film crystal at a temperature (920° C.) 100° C. or more lower than typical conditions, it was possible not only to greatly improve luminous intensity, but also to curb reductions in PL intensity caused by annealing.

In addition, the method according to the present invention has made it possible to increase the film thickness of quantum well layers by forming a very flat first nitride semiconductor layer, second nitride semiconductor layer, quantum well active layer structure, and nitride semiconductor layer on a nonpolar plane, the nitride semiconductor layer containing a dopant capable of making a semiconductor p-type, and form epitaxial layers with excellent optical characteristics by synergy with annealing.

Such epitaxial growth structures formed on a nonpolar plane and subjected to annealing were fabricated into LEDs with an emission wavelength of about 410 nm by a device fabrication process. Results are summarized in Table 9.

TABLE 9

| Specimen | Total radiant flux ratio of LED |
|---|---|
| Specimen X | 1 |
| Specimen Y | 1.4 |
| Specimen Z | 2 |

As shown in Table 9, when the total radiant flux of specimen X in terms of relative ratio was taken as 1, that of specimen Y was 1.4, and that of specimen Z was 2, where the total radiant flux was compared among the specimens using the same value of current. Optimal growth temperatures for i-GaN or n-GaN film growth on a c-plane GaN crystal exist near 1,000° C. Crystal growth at lower temperatures causes decreased crystallinity, resulting in reduced luminous intensity of the active layer structure formed on the crystal. However, as described above, when a crystal was grown on a base which had a nonpolar principal plane, by growing a thick-film crystal at a temperature (920° C.) 100° C. or more lower than typical conditions, it was possible not only to greatly improve luminous intensity, but also to curb reductions in PL intensity caused by annealing. Besides, device characteristics of the LEDs were improved greatly.

Furthermore, when a crystal is grown on a base which has a nonpolar principal plane, since the dislocation density of the epitaxial layer is overwhelmingly lower than in the case of other methods, the present invention can realize good optical characteristics even with an InGaN/GaN multi-quantum well active layer structure which has a relatively low In concentration. Also, the use of a region with a relatively low In concentration on a nonpolar plane is considered to be the reason why it was possible to increase the film thickness of the InGaN quantum well layers and give strikingly good characteristics to an LED with a film thickness larger than 10 nm. Moreover, it is considered that since the epitaxial layer was fabricated by the method described above, proper activation of Mg was possible even under annealing conditions which would cause noticeable deterioration to structures produced by other methods.

EXAMPLE 15

In the present example, a stack of gallium nitride-based semiconductor thin films was grown by the MOCVD process and a near ultraviolet LED was fabricated. A series of crystal growth processes is outlined with reference to FIG. 2(A). Also, a layer structure after growth is schematically shown in FIG. 3(A).

The base used was a (1-100) m-plane oriented freestanding GaN substrate. The substrate measured 4.4 mm in the c-axis direction and 23 mm in the a-axis direction. Regarding electrical characteristics, the substrate was n-type and carrier density was $4.5 \times 10^{17}$ cm$^{-3}$. As a result of X-ray diffraction, the full-width at half maximum of a (10-12) reflection rocking curve was 43.3 arcsec., OFF angle in the c(+) direction was 0.04 degrees, and OFF angle in the a direction was 0.02 degrees. Also, the dislocation density was $5.0 \times 10^6$ cm$^{-2}$.

The m-plane freestanding GaN substrate was placed on a tray (susceptor) in a horizontal quartz reactor which normally operates under conditions of normal pressure. The pressure in the reactor was 100±2 kPa in all steps.

The heating step (step A), the first growth step (step B), the second growth step (step C), and step D of the third step were carried out in the same manner as for specimen Z in Example 14.

Subsequently, in step E of the third step, first the substrate temperature was set to 980° C. and an Mg-doped $Al_{0.1}Ga_{0.9}N$ layer 100 nm thick was formed. $NH_3$ (10 L/min.) was used as a constituent gas of the first main flow. $H_2$ (80 L/min.), TMAl (0.0001 L/min.), TMGa (0.0018 L/min.), and $Cp_2Mg$ ($4\times10^{-6}$ L/min.) were used as constituent gases of the second main flow, where $H_2$ contained in the main flow was used as a carrier gas at 0.5 L/min. each to supply the TMAl, TMGa, and $Cp_2Mg$.

An Mg-doped $Al_{0.03}Ga_{0.97}N$ layer 15 nm thick was epitaxially grown further on the Mg-doped $Al_{0.1}Ga_{0.9}N$ layer. The AlGaN layer was grown by reducing TMAl among the main flow gases to 0.00003 L/min.

In step E, a gas mixture of $NH_3$ (0.5 L/min.) and $N_2$ (50 L/min.) was supplied as a subflow at 50.5 L/min. Also, a non-growth-related flow of $N_2$ (19 L/min) was supplied for purge and other purposes. The flow ratio Fp of the inactive gas component to all the constituent gases of the main flow was 0.

When the growth steps were finished, TMGa, TMAl, and $Cp_2Mg$ as well as $H_2$ in the main flow were cut off and $N_2$ was introduced at 20 slm. At the same time, the flow rate of $NH_3$ was reduced from 10 slm to 50 sccm. Also, $NH_3$ in the subflow was cut off and the $N_2$ flow rate was set to 10 slm. The non-growth-related flow was not changed.

Simultaneously with the gas supply changes, the substrate heater power was shut off and the substrate was cooled forcibly by introducing gas. When the substrate temperature was lowered to 930° C., the $NH_3$ in the main flow was cut off and the substrate was cooled in the $N_2$ atmosphere until the substrate temperature reaches or falls below 100° C. When the substrate was cooled sufficiently, the substrate was taken out and evaluated.

The surface of the substrate thus fabricated had good flatness although there were very slight irregularities. The surface was measured with a contact-type surface roughness gage to determine center line average roughness (Ra). As a result, Ra according to the present example was 8.8 nm. Also, when PL characteristics were measured under excitation by a laser beam with a wavelength of 325 nm, the peak wavelength was 410 nm, integrated intensity of the PL characteristics was 93 in relative value, indicating an extremely high intensity, and standard deviation of wavelength distribution in the surface was as small as 0.7%.

Subsequently, the epitaxially grown layer on a nonpolar plane prepared by the above method was processed into an LED. Both light emission characteristics and current-voltage characteristics of the LED were good, which confirmed that the in-process activation step during cooling enabled good optical characteristics and sufficient Mg activation.

EXAMPLE 16

In the present example, the LED structure which, having been fabricated by the crystal growth method according to the present invention, emits near ultraviolet light—the LED structure observed in example 9—was observed multiple times under an ultra high-voltage transmission electron microscope to find the dislocation densities of the epitaxial layer and active layer structure formed on a nonpolar GaN substrate. The samples prepared were large enough to observe an area eight times as large as the field of view. The samples observed and observation conditions were the same as in Example 9 except that an area measuring 12.6 μm along the substrate surface was observed and that a thin section placed in the observation field of view was 1.0 μm thick. The samples were observed via transmission of a 1,000-kV electron beam. As a result, a total of five dislocations propagating in the M-axis direction were observed in the epitaxially grown part including the active layer portion. Consequently, average dislocation density according to the present invention was estimated to be 5÷(12.6 μm×1.0 μm×8)=4.96×10$^6$ (cm$^2$).

There were samples in which no dislocation was observed in one field of view and samples in which up to three dislocations were observed in one field of view. Therefore, according to the present invention, the dislocation density in an epitaxial layer is estimated to be 3÷(12.6 μm×1.0 μm)=2.42×10$^7$ (cm$^{-2}$) at the maximum. Thus, according to the present invention, preferably the dislocation density in an epitaxial layer is 3×10$^7$ (cm$^{-2}$) or below, and more preferably 5.0×10$^6$ (cm$^{-2}$) or below.

The present invention has been described above by way of examples, but the examples described above are intended to be merely exemplary of the present invention and not restrictive thereof. The GaN used in the examples may be substituted with AlN, InN, or BN or a mixed crystal thereof. Also, the growth temperatures, supplies of raw materials, film thicknesses of layers, and the like may be changed according to purpose.

In a step of epitaxially growing a stack structure including an active layer, when a dopant capable of making a semiconductor p-type is introduced into part of the stack structure, the part into which the dopant is introduced can be set as required, and may be the entire stack structure or only an upper, lower, or central part. Examples of such dopants capable of making a semiconductor p-type include magnesium, zinc, carbon, and beryllium. Also, silicon, oxygen, carbon, or the like may be used as a co-dopant in addition to the dopant capable of making a semiconductor p-type to increase hole concentration.

Furthermore, the epitaxial growth step of the stack structure including an active layer may be carried out under conditions in which the dopant capable of making a semiconductor p-type is activated. Alternatively, after the epitaxial growth step of the stack structure including the active layer, at least one processing step out of heat annealing and electron beam irradiation may be further carried out to activate the dopant capable of making a semiconductor p-type.

The base used in the present invention may be a sapphire substrate, ZnO substrate, Si substrate, SiC substrate, GaAs substrate, GaP substrate, $Ga_2O_3$ substrate, Ge substrate, or MgO substrate with a film of nitride crystal formed thereon, the nitride crystal using a nonpolar plane as its principal plane.

It is self-evident from the above description that various changes to the above examples are within the scope of the present invention and that various examples are possible within the scope of the present invention.

Industrial Applicability

The present invention provides a crystal growth method for a high-quality nitride semiconductor characterized by good surface morphology and optical characteristics as well as high luminous efficiency when used as a light-emitting element.

The invention claimed is:
1. A method for growing a crystal of a nitride semiconductor on a principal nitride plane of a base at least one principal plane of which is a nonpolar nitride, the method comprising:
heating the base to a predetermined temperature with the principal nitride plane of the base exposed to an atmosphere comprising a first inactive gas for a period $t_A$;
initially epitaxially growing a first nitride semiconductor layer on the principal nitride plane of the base with the principal nitride plane of the base exposed to an atmo- sphere comprising a second inactive gas and without intentional supply of a silicon (Si) source material; and subsequently epitaxially growing a second nitride semiconductor layer on the first nitride semiconductor layer while supplying an n-type dopant source material with the surface of the first nitride semiconductor layer exposed to an atmosphere containing a third inactive gas;

wherein:

each of the first, second, and third inactive gases is independently selected from the group consisting of nitrogen ($N_2$), helium (He), argon (Ar), xenon (Xe), krypton (Kr), a hydrazine compound, an amine compound, an azide compound, and mixtures thereof;

the base is a freestanding substrate of GaN, AlN, InN, BN, or a mixed crystal thereof;

the principal nitride plane of the base is a crystal plane within ±5 degrees inclusive from a (1-100) m-plane; and when heating the base, a component ratio of the first inactive gas to all constituent gases of the atmosphere is from 0.5 to 1.0 in terms of flow ratio.

2. A method for growing a crystal of a nitride semiconductor on a principal nitride plane of a base at least one principal plane of which is a nonpolar nitride, the method comprising:

heating the base to a predetermined temperature in an atmosphere having a main flow comprising a first inactive gas for a period $t_A$;

initially epitaxially growing a first nitride semiconductor layer on the principal nitride plane of the base in an atmosphere having a main flow comprising a second inactive gas and without intentional supply of a silicon (Si) source material; and subsequently epitaxially growing a second nitride semiconductor layer on the first nitride semiconductor layer while supplying an n-type dopant source material in an atmosphere comprising a third inactive gas and constituting a main flow, wherein:

each of the first, second, and third inactive gases is independently selected from the group consisting of nitrogen ($N_2$), helium (He), argon (Ar), xenon (Xe), krypton (Kr), a hydrazine compound, an amine compound, an azide compound, and mixtures thereof;

the base is a freestanding substrate of GaN, AlN, InN, BN, or a mixed crystal thereof;

the principal nitride plane of the base is a crystal plane within ±5 degrees inclusive from a (1-100) m-plane; and when heating the base, a component ratio of the first inactive gas to all constituent gases of the atmosphere is from 0.5 to 1.0 in terms of flow ratio.

3. The method according to claim 1, wherein at least one of the heating, the initially epitaxially growing, and the subsequently epitaxially growing has a period during which the atmosphere comprises ammonia ($NH_3$) gas.

4. The method according to claim 2, wherein at least one of the heating, the initially epitaxially heating, and the subsequently epitaxially growing has a period during which the atmosphere comprises ammonia ($NH_3$) gas.

5. The method according to claim 2, wherein before the period $t_A$, the heating has a period $t_B$ during which the base is heated in an atmosphere comprising a main flow containing a gas composition different from the main flow of the period $t_A$.

6. The method according to claim 2, wherein the main flow in the initially and subsequently epitaxially growing comprises at least a first main flow and a second main flow, wherein the first main flow mainly supplies a nitrogen source material for the first and second nitride semiconductor layer, and the at least second main flow mainly supplies at least one source material for at least one non-nitrogen element for the first and second nitride semiconductor layer.

7. The method according to claim 1, wherein the initially epitaxially growing is carried out without thermally cleaning the principal nitride plane of the base after the heating is finished.

8. The method according to claim 2, wherein the initially epitaxially growing is carried out without thermally cleaning the principal nitride plane of the base after the heating is finished.

9. A method for growing a crystal of a nitride semiconductor on a principal nitride plane of a base at least one principal plane of which is a nonpolar nitride, the method comprising:

heating the base to a predetermined temperature with the principal nitride plane of the base exposed to an atmosphere comprising a first inactive gas for a period $t_A$; and epitaxially growing a nitride semiconductor layer on the principal nitride plane of the base with the principal nitride plane of the base exposed to an atmosphere comprising a second inactive gas and without intentional supply of a silicon (Si) source material, wherein:

each of the first and second inactive gases is independently selected from the group consisting of nitrogen ($N_2$), helium (He), argon (Ar), xenon (Xe), krypton (Kr), a hydrazine compound, an amine compound, an azide compound, and mixtures thereof;

the base is a freestanding substrate of GaN, AlN, InN, BN, or a mixed crystal thereof;

the principal nitride plane of the base is a crystal plane within ±5 degrees inclusive from a (1-100) m-plane; and when heating the base, a component ratio of the first inactive gas to all constituent gases of the atmosphere is from 0.5 to 1.0 in terms of flow ratio.

10. The method according to claim 9, wherein at least one of the heating and the epitaxially growing comprises a period during which the atmosphere comprises ammonia ($NH_3$) gas.

11. A nitride semiconductor light-emitting element fabricated by the method according to claim 1.

12. A nitride semiconductor light-emitting element fabricated by the method according to claim 2.

13. A nitride semiconductor light-emitting element fabricated by the method according to claim 9.

14. The method according to claim 1, wherein, when heating the base, the component ratio of the first inactive gas to all the constituent gases of the atmosphere is 0.75 in terms of flow ratio.

15. The method according to claim 1, wherein, when heating the base, the component ratio of the first inactive gas to all the constituent gases of the atmosphere is from 0.625 to 0.75 in terms of flow ratio.

16. The method according to claim 1, wherein, when heating the base, the component ratio of the first inactive gas to all the constituent gases of the atmosphere is from 0.57 to 0.64 in terms of flow ratio.

17. The method according to claim 2, wherein, when heating the base, the component ratio of the first inactive gas to all the constituent gases of the atmosphere is 0.75 in terms of flow ratio.

18. The method according to claim 2, wherein, when heating the base, the component ratio of the first inactive gas to all the constituent gases of the atmosphere is from 0.625 to 0.75 in terms of flow ratio.

19. The method according to claim 2, wherein, when heating the base, the component ratio of the first inactive gas to all the constituent gases of the atmosphere is from 0.57 to 0.64 in terms of flow ratio.

20. The method according to claim 9, wherein, when heating the base, the component ratio of the first inactive gas to all the constituent gases of the atmosphere is 0.75 in terms of flow ratio.

21. The method according to claim 9, wherein, when heating the base, the component ratio of the first inactive gas to all the constituent gases of the atmosphere is from 0.625 to 0.75 in terms of flow ratio.

22. The method according to claim 9, wherein, when heating the base, the component ratio of the first inactive gas to all the constituent gases of the atmosphere is from 0.57 to 0.64 in terms of flow ratio.

* * * * *